United States Patent
Tsuda et al.

(10) Patent No.: US 8,237,203 B2
(45) Date of Patent: Aug. 7, 2012

(54) SEMICONDUCTOR DEVICE

(75) Inventors: Nobuhiro Tsuda, Tokyo (JP);
Hidekatsu Nishimaki, Tokyo (JP);
Hiroshi Omura, Tokyo (JP); Yuko Yoshifuku, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 464 days.

(21) Appl. No.: 12/536,319

(22) Filed: Aug. 5, 2009

(65) Prior Publication Data

US 2010/0044755 A1 Feb. 25, 2010

(30) Foreign Application Priority Data

Aug. 19, 2008 (JP) .................. 2008-210332
Feb. 6, 2009 (JP) .................. 2009-026135

(51) Int. Cl.
*H01L 27/088* (2006.01)

(52) U.S. Cl. ........ 257/206; 257/208; 257/369; 257/401; 257/E27.06; 257/E29.166

(58) Field of Classification Search .................. 257/206, 257/208, 401, E27.06, 369, E29.166
See application file for complete search history.

(56) References Cited

U.S. PATENT DOCUMENTS 6,833,595 B1 12/2004 Iwasaki
2005/0045916 A1 3/2005 Kim

FOREIGN PATENT DOCUMENTS

| JP | 06-085062 | 3/1994 |
|---|---|---|
| JP | 2000-223663 | 8/2000 |
| JP | 2000-277620 | 10/2000 |
| JP | 2005-079594 | 3/2005 |

*Primary Examiner* — Benjamin Sandvik
*Assistant Examiner* — Whitney T Moore
(74) *Attorney, Agent, or Firm* — McDermott Will & Emery LLP

(57) ABSTRACT

A pMIS region is provided between a boundary extending in a first direction and passing through each of a plurality of standard cells and a first peripheral edge. An nMIS region is provided between the boundary and a second peripheral edge. A power supply wiring and a grounding wiring extend along the first and second peripheral edges, respectively. A plurality of pMIS wirings and a plurality of nMIS wirings are arranged on a plurality of first virtual lines and a plurality of second virtual lines, respectively, extending in the first direction and arranged with a single pitch in a second direction. The first virtual line that is the closest to the boundary and the second virtual line that is the closest to the boundary have therebetween a spacing larger than the single pitch.

10 Claims, 47 Drawing Sheets

SEMICONDUCTOR DEVICE

BACKGROUND OF THE INVENTION

1. Field of the Invention

The present invention relates generally to semiconductor devices and particularly to semiconductor devices having arranged multiple standard cells.

2. Description of the Background Art

For designing semiconductor devices, in the 45 nm generation in particular, there has been adopted or considered a technique for designing referred to as a restrictive design rule (RDR). More specifically, the RDR is a design rule with severe constraints. It does not employ a two dimensional layout having a metal wiring and a poly wiring each bent. Rather, it employs a one dimensional layout prohibiting such bending. This reduces or eliminates variation attributed to dependency on geometry of transistors, wirings and the like, and furthermore, reduces or eliminates design rule check (DRC), optical proximity correction (OPC), lithography verification and other similar electronics design automation (EDA) loads. The RDR can thus reduce or eliminate variation in lithography, and complicated designs.

Furthermore when a semiconductor device is designed, a standard cell may be used, for example as disclosed in Japanese Patent Laying-open No. 06-085062. In particular, a standard cell is used to design a layout, for example as disclosed in Japanese Patent Laying-open No. 2000-277620, to accommodate a system-on-chip (SOC) with a circuit increased in scale.

Furthermore, reducing the number of contacts for electrical connection has been proposed to provide a highly integrated SOC. For example, Japanese Patent Laying-open No. 2005-079594 describes that a first active region provided with a metal oxide semiconductor (MOS) transistor and a second active region provided for a first voltage are connected by a third active region to achieve a reduced number of contacts.

Furthermore, a finer pattern has been promoted for a further highly integrated SOC. This results in making it difficult to ensure resolution in lithography for the 45 nm or 32 nm or later generation in particular. This has been handled by adopting or considering an RDR, which restricts a pitch in arranging a pattern, the pattern's geometry, and the like. The RDR stabilizes lithography and thus alleviates variation attributed to dependency on geometry of transistors, wirings and the like (see Japanese Patent Laying-open No. 2000-223663 for example).

When an RDR with a severe design constraint is applied to a standard cell, the standard cell is increased in area. This problem is remarkable in particular for general SOC products, which have a chip having a large area occupied by standard cells. In other words, the chip has a major area occupied by standard cells having an increased area, and as a consequence, the chip is increased in size, resulting in a semiconductor device increased in size and cost.

Furthermore, simply making a cell that has conventionally been used fine in a design for the purpose of highly integrating a semiconductor device has resulted in insufficient resolution and increased variation in lithography. There has not been a sufficient proposal for a method applying the RDR to a cell to resolve such issues in lithography.

SUMMARY OF THE INVENTION

The present invention has been made in view of the above disadvantage, and one object thereof is to provide a semiconductor device that can reduce/eliminate variation in lithography and complicated designs while reducing the semiconductor device's size and cost.

Furthermore, another object of the present invention is to provide a semiconductor device that can ensure resolution and stability in lithography for a design with cells highly integrated.

The present invention in one embodiment provides a semiconductor device having a plurality of standard cells arranged in a first direction and each having first and second peripheral edges extending in the first direction and opposite to each other.

The semiconductor device includes a semiconductor substrate and first and second layers. The semiconductor substrate has a p-type metal insulator semiconductor (pMIS) region and an n-type metal insulator semiconductor (nMIS) region. The pMIS region is formed between the first peripheral edge and a boundary extending in the first direction through each of the plurality of standard cells and serving as a boundary between an n-type well and a p-type well. The nMIS region is formed between the second peripheral edge and the boundary. The first layer is provided on the semiconductor substrate and has a plurality of gate wirings extending in a second direction orthogonal to the first direction. The second layer is provided on the first layer. The second layer includes first and second power supply wirings, a plurality of pMIS wirings, and a plurality of nMIS wirings. The first power supply wiring extends along the first peripheral edge and is electrically connected to the pMIS region. The second power supply wiring extends along the second peripheral edge and is electrically connected to the nMIS region. The plurality of pMIS wirings are arranged on a plurality of first virtual lines, respectively, extending between the first and second power supply wirings on the pMIS region in the first direction and arranged with a single pitch in the second direction. The plurality of nMIS wirings are arranged on a plurality of second virtual lines, respectively, extending between the first and second power supply wirings on the nMIS region in the first direction and arranged with the single pitch in the second direction. The first virtual line that is the closest to the boundary and the second virtual line that is the closest to the boundary have therebetween a spacing larger than the single pitch.

The present invention in another embodiment provides a semiconductor device having a plurality of standard cells arranged in a first direction and each having first and second peripheral edges extending in the first direction and opposite to each other.

The semiconductor device includes a semiconductor substrate and first and second layers. The semiconductor substrate has a pMIS region and an nMIS region. The pMIS region is formed between the first peripheral edge and a boundary extending in the first direction through each of the plurality of standard cells and serving as a boundary between an n-type well and a p-type well. The nMIS region is formed between the second peripheral edge and the boundary. The first layer is provided on the semiconductor substrate and has a plurality of gate wirings extending in a second direction orthogonal to the first direction. The second layer is provided on the first layer. The second layer includes first and second power supply wirings, a plurality of pMIS wirings, and a plurality of nMIS wirings. The first power supply wiring extends along the first peripheral edge and is electrically connected to the pMIS region. The second power supply wiring extends along the second peripheral edge and is electrically connected to the nMIS region. The plurality of pMIS wirings are arranged on a plurality of first virtual lines, respectively, extending between the first and second power supply wirings on the pMIS region in the first direction and arranged with a single pitch in the second direction. The plurality of nMIS wirings are arranged on a plurality of second virtual lines, respectively, extending between the first and second power supply wirings on the nMIS region in the first direction and arranged with the single pitch in the second direction. A spacing between the first virtual line that is the closest to the first peripheral edge and the first peripheral edge and a spacing between the second virtual line that is the closest to the second peripheral edge and the second peripheral edge are each larger than the single pitch.

The present invention in still another embodiment provides a semiconductor device including a region functionally defined by a plurality of cells arranged in a first direction to fill a region between first and second cell boundaries mutually spaced and extending in the first direction. The semiconductor device includes a semiconductor substrate and a plurality of gate electrodes. The plurality of gate electrodes extend on the semiconductor substrate in a second direction orthogonal to the first direction, and are arranged in each of the plurality of cells with a first pitch in the first direction. The plurality of cells each have a width of an integral multiple of the first pitch in the first direction.

The present invention in one embodiment provides a semiconductor device in which a first virtual line of a plurality of first virtual lines that is the closest to a boundary and a second virtual line of a plurality of second virtual lines that is the closest to the boundary have therebetween a spacing larger than a single pitch. If it is necessary that the first virtual line that is the closest to the boundary and the second virtual line that is the closest to the boundary be sufficiently spaced from each other, the single pitch can be suppressed. The semiconductor device's size and cost can thus be reduced.

The present invention in another embodiment provides a semiconductor device in which a spacing between a first virtual line of a plurality of first virtual lines that is the closest to a first peripheral edge and the first peripheral edge and a spacing between a second virtual line of a plurality of second virtual lines that is the closest to a second peripheral edge and the second peripheral edge are each larger than a single pitch. If it is necessary that the first virtual line that is the closest to the first peripheral edge and the first peripheral edge be sufficiently spaced from each other and so be the second virtual line that is the closest to the second peripheral edge and the second peripheral edge, the single pitch can be suppressed. The semiconductor device's size and cost can thus be reduced.

The present invention in still another embodiment provides a semiconductor device having a plurality of cells each having a width of an integral multiple of a first pitch in a first direction. This allows a region filled with a plurality of cells to have gate electrodes arranged with uniform pitches. This allows a design with cells highly integrated to also ensure resolution and stability in lithography.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the present invention in embodiments will be described with reference to the drawings.

First Embodiment

Figure 1:
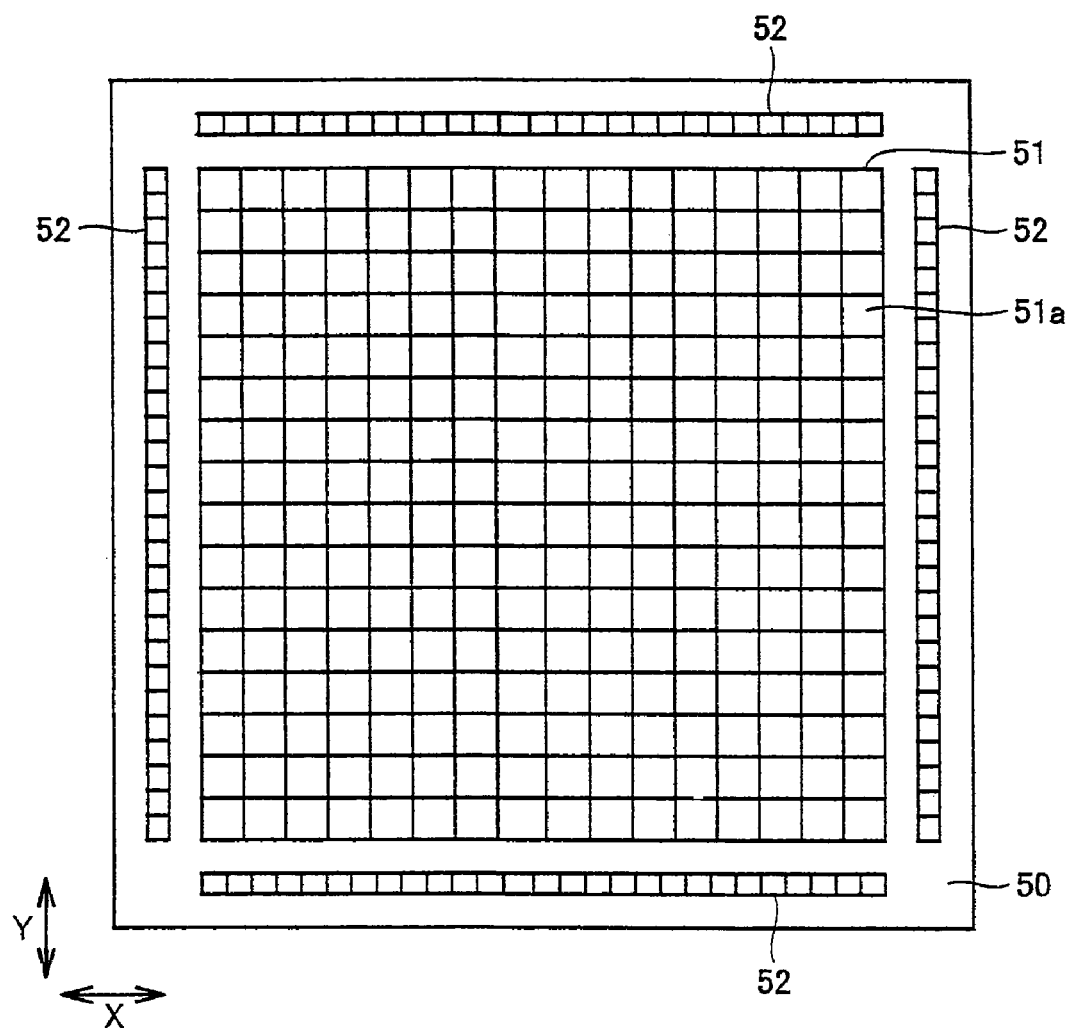
FIG. 1 is a plan view schematically showing a configuration of a semiconductor device in a first embodiment of the present invention.

With reference to FIG. 1, a semiconductor device (e.g., a semiconductor chip) 50 has a surface mainly having a standard cell region 51, an input/output (I/O) cell region 52 surrounding standard cell region 51, and a pad (not shown) used for inputting/outputting externally.

In the figure, standard cell region 51 has a plurality of standard cells 51as arranged in a matrix (or rows and columns) extending in a direction X and a direction Y orthogonal to direction X. The plurality of standard cells 51as are each surrounded by peripheral edges extending in direction X and opposite to each other, and peripheral edges extending in direction Y and opposite to each other. A standard cell is a cell for a logic element. It is arranged by automatic placement to configure a desired function in a semiconductor device. For an SOC using a standard cell library, standard cell region 51 has formed therein a central processing unit (CPU), a random access memory (RAM), a first-in first-out (FIFO), a small computer system interface (SCSI), a sea of gate (SOG), and the like.

Figure 2:
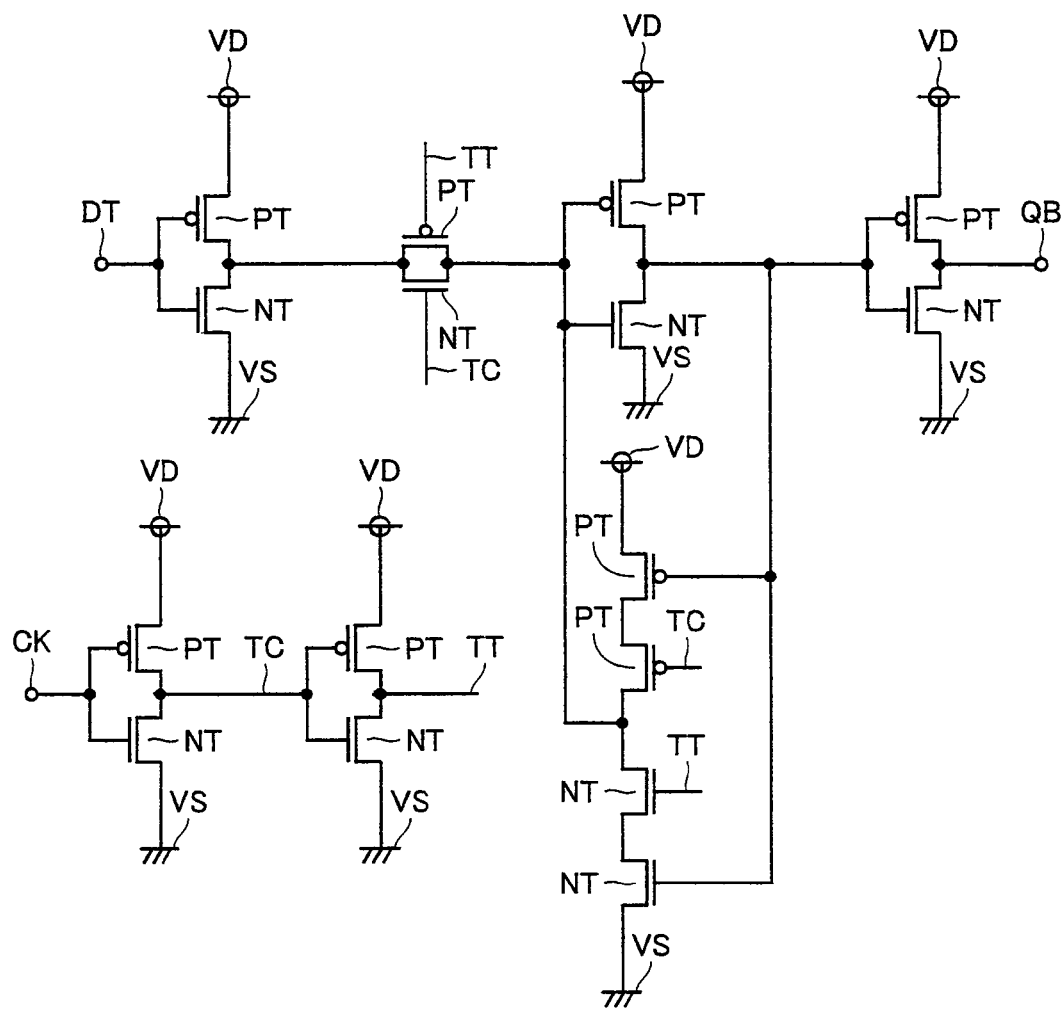
FIG. 2 is a circuit diagram showing one example of a circuit configuration of a functional element formed in one of a plurality of standard cells shown in FIG. 1.

With reference to FIG. 2, standard cell 51a has formed therein a functional element of a circuit, which is for example a flip flop. This flip flop has a data input terminal DT, an output terminal QB, a clock terminal CK, a power supply wiring VD (a first power supply wiring), a grounding wiring VS (a second power supply wiring), a pMIS transistor PT, and an nMIS transistor NT. Note that in the figure, a plurality of wirings TCs are mutually, electrically connected. Furthermore, a plurality of wirings TTs are mutually, electrically connected.

Mainly with reference to FIGS. 3-6, the present embodiment provides a semiconductor device having as one of standard cells 51as (FIG. 1) a standard cell Cff (a rectangle indicated in FIGS. 3-5 by alternate long and short dashed lines) forming a flip flop (FIG. 2).

Figure 7:
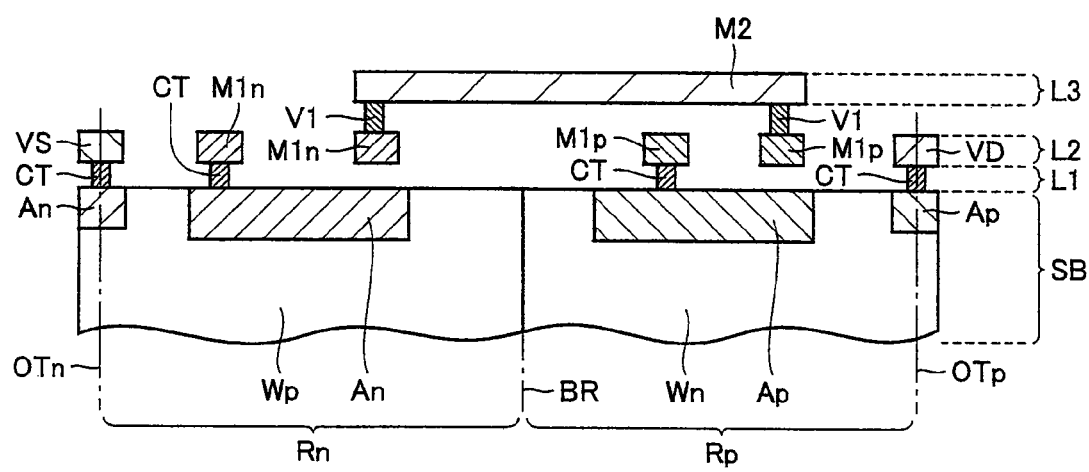
FIG. 7 is a schematic cross section taken along a line VII-VII of each of FIGS. 3-6.

With reference to FIG. 7, in standard cell Cff, the semiconductor device has a semiconductor substrate SB and first to third layers L1-L3. Semiconductor substrate SB has a pMIS region Rp and an nMIS region Rn.

Figure 6:
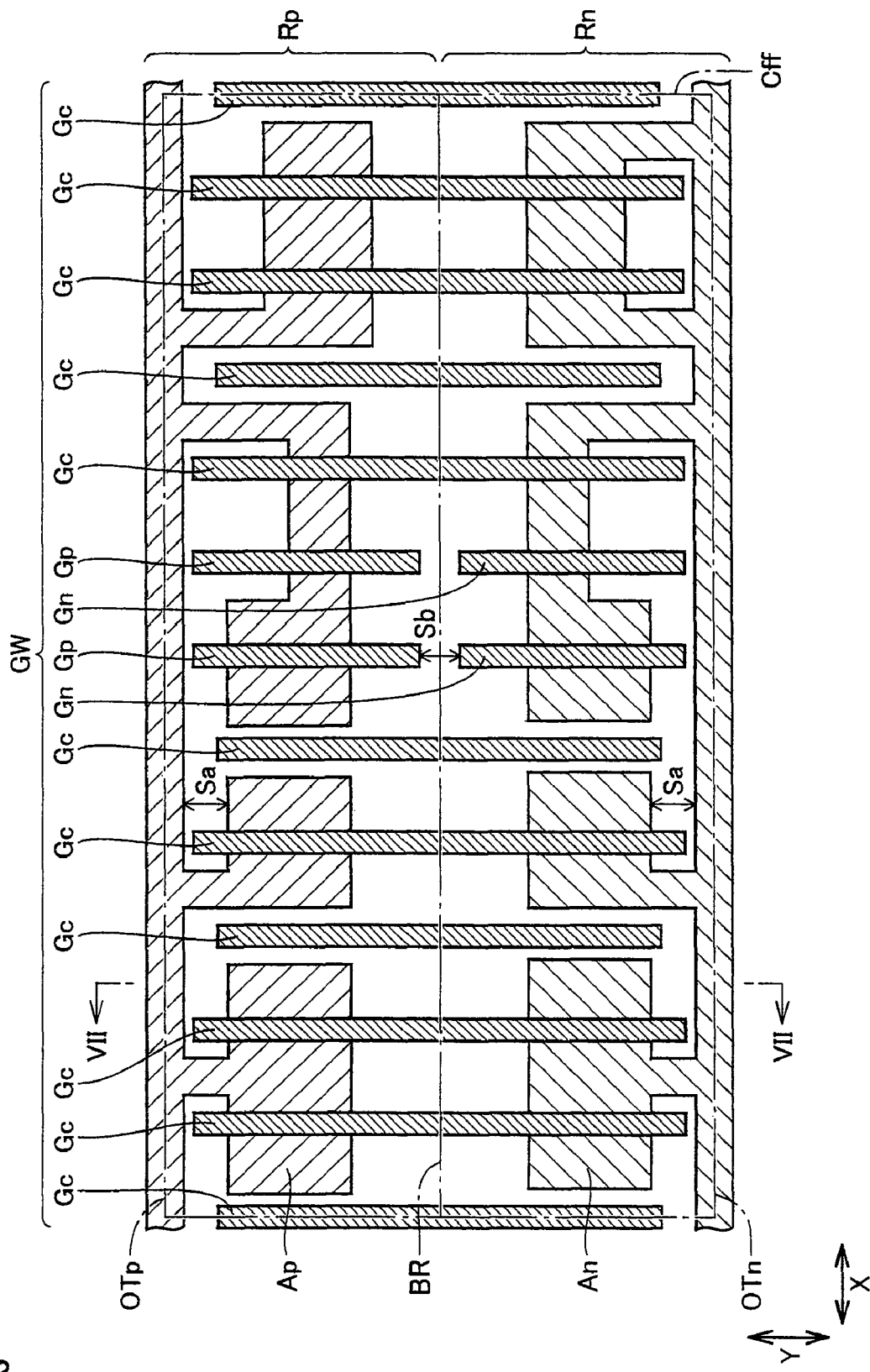
FIG. 6 is a view with a contact hole of FIG. 5 not shown.

Mainly with reference to FIG. 6, pMIS region Rp is formed between a boundary BR extending in direction X and passing through each of the plurality of standard cells 51as (FIG. 1) including standard cell Cff, and a first peripheral edge OTp (in the figure, a line extending along an upper side of standard cell Cff represented by a rectangle indicated by alternate long and short dashed lines). NMIS region Rn is formed between boundary BR and a second peripheral edge OTn (in the figure, a line extending along a lower side of standard cell Cff represented by a rectangle indicated by alternate long and short dashed lines).

With reference to FIGS. 6 and 7, pMIS region Rp has an n-type well Wn and a p-type diffusion region Ap. P-type diffusion region Ap is formed on n-type well Wn. P-type diffusion region Ap has source/drain regions in pMIS region Rp, and a region for supplying one region of the source/drain regions with a potential of power supply wiring VD (in FIG. 6, a region extending along first peripheral edge OTp). The region for supplying the potential and the other region of the source/drain regions are spaced Sa. PMIS region Rp is thus prevented from having the source/drain regions mutually short circuited.

Similarly, nMIS region Rn has a p-type well Wp and an n-type diffusion region An. N-type diffusion region An is formed on p-type well Wp. N-type diffusion region An has source/drain regions in nMIS region Rn, and a region for supplying one region of the source/drain regions with a potential of grounding wiring VS (in FIG. 6, a region extending along second peripheral edge OTn). The region for supplying the potential and the other region of the source/drain regions are spaced Sa. NMIS region Rn is thus prevented from having the source/drain regions mutually short circuited.

Figure 5:
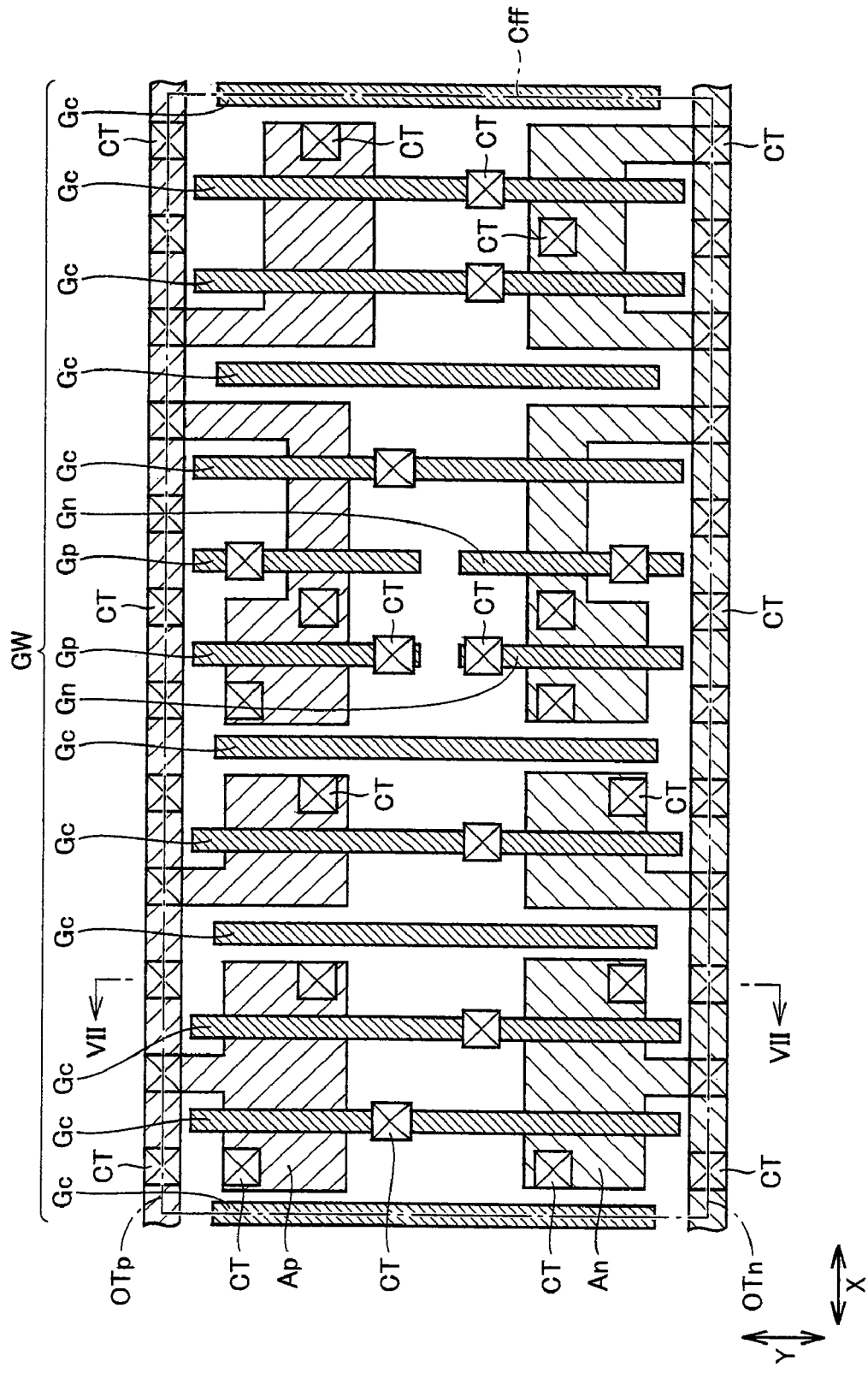
FIG. 5 is a plan view schematically showing a configuration of a first layer and a semiconductor substrate of the standard cell shown in FIG. 3.

Mainly with reference to FIGS. 5-7, first layer L1 is provided on semiconductor substrate SB. First layer L1 has a plurality of gate wirings GWs extending in direction Y. The plurality of gate wirings GWs are spaced equally in direction X. This spacing is preferably a minimum spacing in a design rule for a transistor. Each gate wiring GW is formed as based on a one-dimensional layout that does not have bending.

Gate wiring GW is formed of polysilicon, or titanium or a similar material of metal, and has a common gate wiring Gc, a pMIS gate wiring Gp, and an nMIS gate wiring Gn. Common gate wiring Gc straddles pMIS region Rp and nMIS region Rn, and serves to be a gate wiring for both some of a plurality of pMIS transistors PTs provided in pMIS region Rp and some of a plurality of nMIS transistors NTs provided in nMIS region Rn. PMIS gate wiring Gp is provided only on pMIS region Rp and serves to be a gate wiring for some of the plurality of pMIS transistors PTs (FIG. 2). NMIS gate wiring Gn is provided only on nMIS region Rn and serves to be a gate wiring for some of the plurality of nMIS transistors NTs (FIG. 2).

With reference to FIG. 6, pMIS gate wiring Gp and nMIS gate wiring Gn are spaced Sb. This prevents pMIS gate wiring Gp and nMIS gate wiring Gn from short circuiting.

Figure 4:
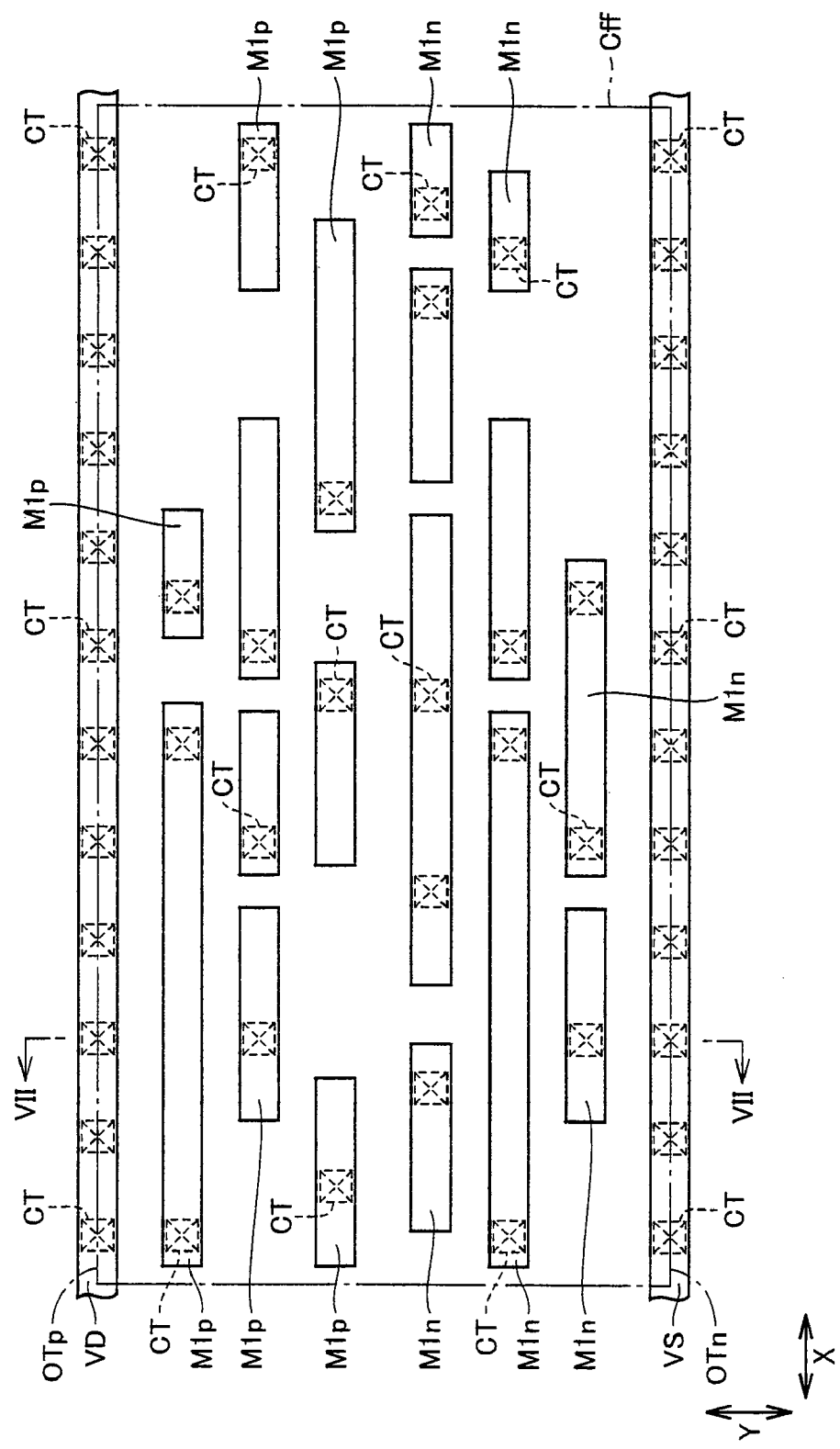
FIG. 4 is a plan view schematically showing a configuration of a second layer of the standard cell shown in FIG. 3.

With reference to FIGS. 4 and 7, second layer L2 is provided on first layer L1. Second layer L2 includes power supply wiring VD, grounding wiring VS, a plurality of pMIS wirings M1ps, and a plurality of nMIS wirings M1ns. Power supply wiring VD, grounding wiring VS, pMIS wiring M1p, and nMIS wiring M1n are each formed of metal in accordance with a one-dimensional layout that does not have bending.

Power supply wiring VD extends along first peripheral edge OTp. More specifically, first peripheral edge OTp is a centerline of power supply wiring VD as seen in a plane. Furthermore, power supply wiring VD is electrically connected to pMIS region Rp via a contact CT. Grounding wiring VS extends along second peripheral edge OTn. More specifically, second peripheral edge OTn is a centerline of grounding wiring VS as seen in a plane. Furthermore, grounding wiring VS is electrically connected to nMIS region Rn via contact CT.

The plurality of pMIS wirings M1ps and the plurality of nMIS wirings M1ns are formed by photolithography. In doing so, optical proximity correction is performed.

Figure 3:
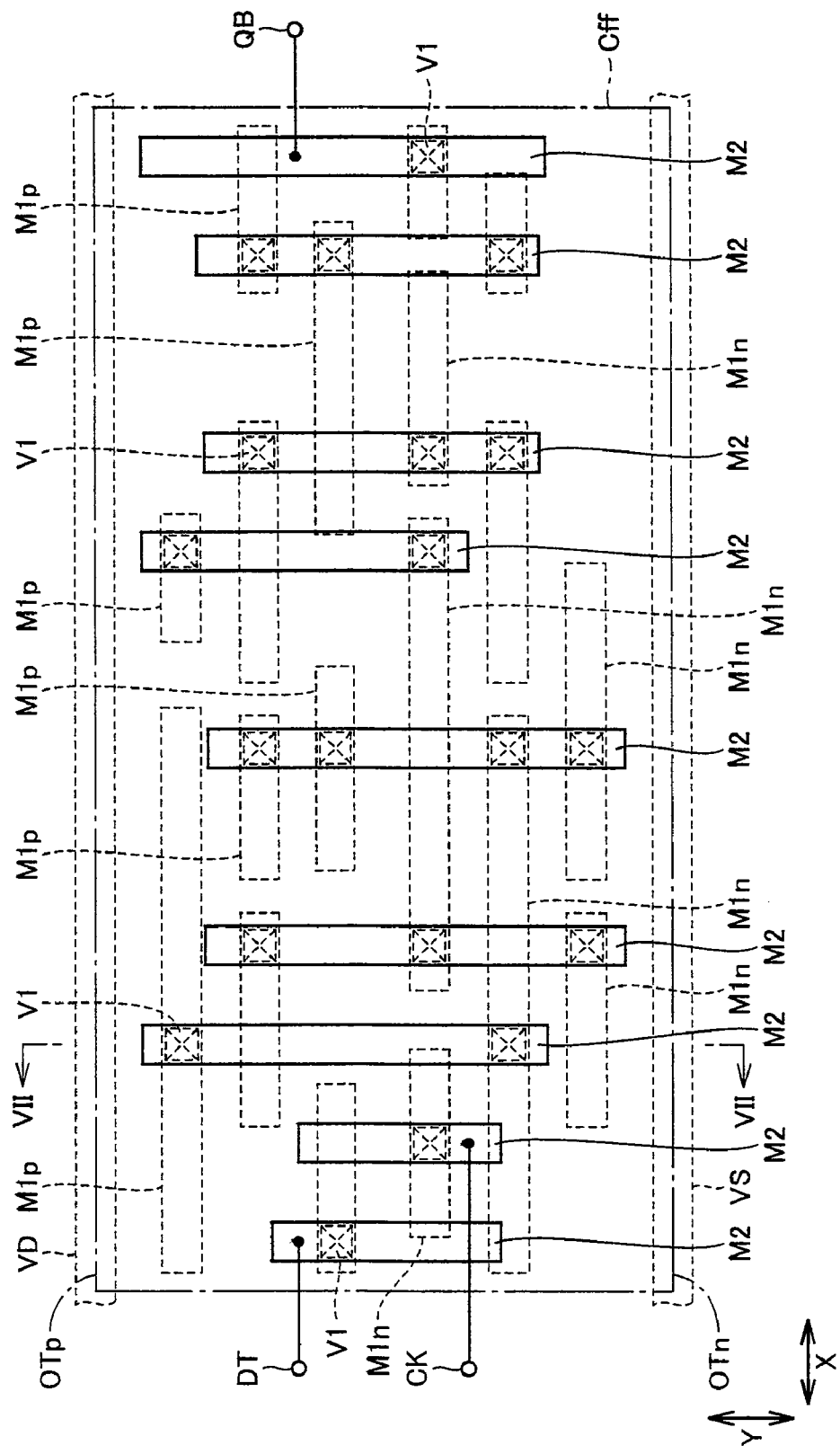
FIG. 3 is a plan view schematically showing a configuration of one standard cell of a semiconductor device in the first embodiment of the present invention.

Mainly with reference to FIGS. 3 and 7, third layer L3 is provided on second layer L2. Third layer L3 has a plurality of wirings M2s extending in direction Y. Wiring M2 is formed of metal, and connected to pMIS wiring M1p and nMIS wiring M1n through a via V1 to configure the FIG. 2 circuit. Wiring M2 is formed in accordance with a one-dimensional layout that does not have bending.

Figure 8:
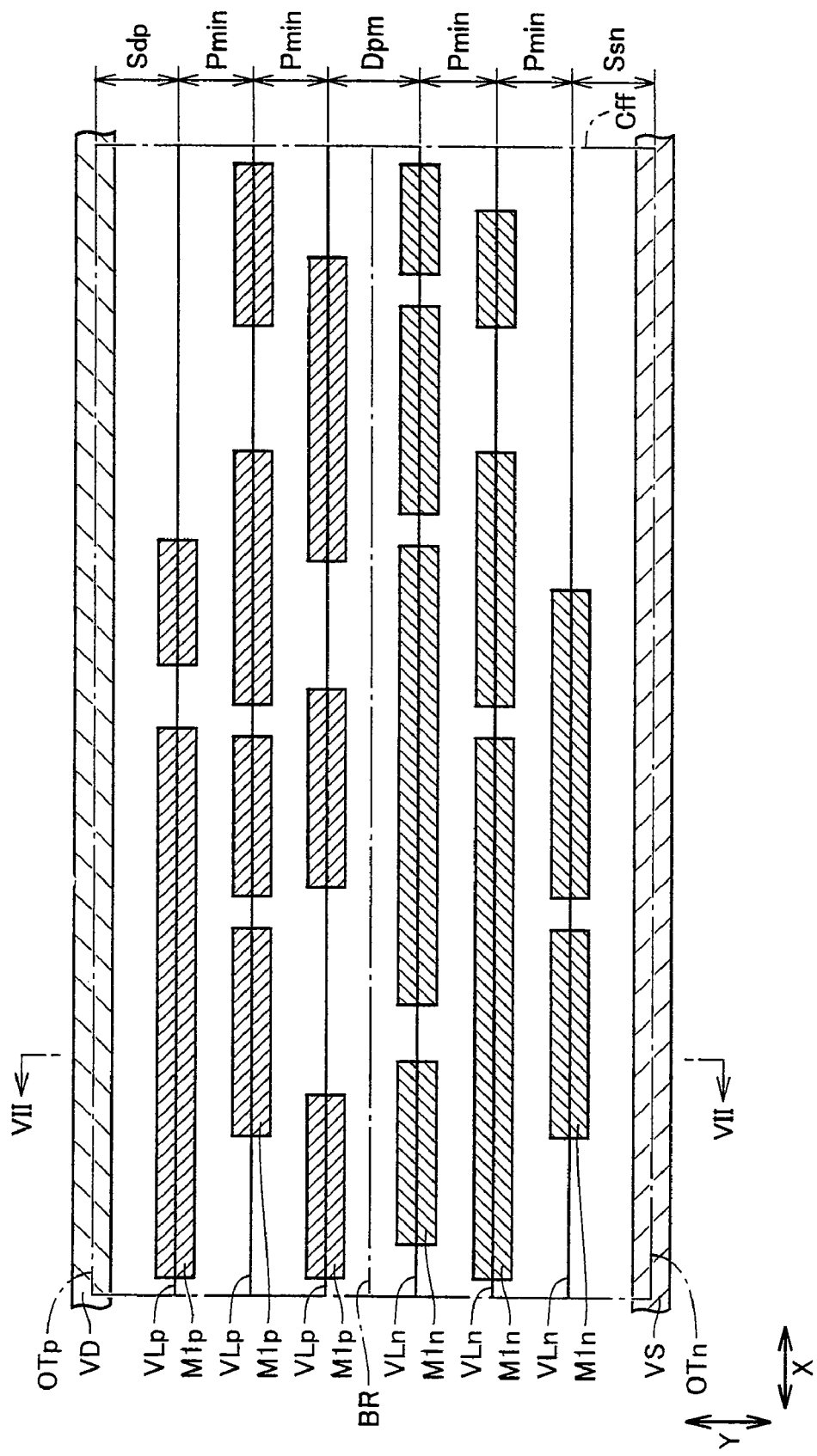
FIG. 8 is a view for illustrating the layout of the plan view of FIG. 4.

With reference to FIG. 8, the plurality of pMIS wirings M1ps are arranged between power supply wiring VD and grounding wiring VS on pMIS region Rp on a plurality of first virtual lines VLps, respectively, extending in direction X and spaced in direction Y with a pitch Pmin (FIG. 8). In other words, the plurality of first virtual lines VLps are the centerlines of the plurality of pMIS wirings M1ps, respectively, as seen in a plane. Furthermore, the plurality of nMIS wirings M1ns are arranged between power supply wiring VD and grounding wiring VS on nMIS region Rn on a plurality of second virtual lines VLns, respectively, extending in direction X and spaced in direction Y with pitch Pmin. In other words, the plurality of second virtual lines VLns are the centerlines of the plurality of nMIS wirings M1ns, respectively, as seen in a plane. Pitch Pmin is preferably a minimum pitch in a design rule for metal wiring.

A first virtual line VLp of the plurality of first virtual lines VLps that is the closest to boundary BR and a second virtual line VLn of the plurality of second virtual lines VLns that is the closest to boundary BR are spaced Dpm. This spacing Dpm is larger than pitch Pmin. Herein, boundary BR is a boundary between nMIS region Rn and pMIS region Rp and is a boundary between p-type well Wp and n-type well Wn.

Furthermore, a first virtual line VLp of the plurality of first virtual lines VLps that is the closest to first peripheral edge OTp and first peripheral edge OTp are spaced Sdp. This spacing Sdp is larger than pitch Pmin. Furthermore, a second virtual line VLn of the plurality of second virtual lines VLns that is the closest to second peripheral edge OTn and second peripheral edge OTn are spaced Ssn. This spacing Ssn is larger than pitch Pmin.

Note that standard cells 51as that are adjacent with first peripheral edge OTp or second peripheral edge OTn interposed may internally have their internal functional elements and wiring in a layout configured, as seen in a plane, to be axisymmetric with respect to first peripheral edge OTp or second peripheral edge OTn. This allows power supply wiring VD or grounding wiring VS to be shared by adjacent standard cells 51as and thus facilitates providing a reduced layout and a cell placement design in place and route (P&R).

In the present embodiment, as shown in FIG. 8, spacing Dpm is larger than pitch Pmin. Spacing Dpm can thus be sufficiently large, while pitch Pmin, which significantly affects the size of standard cell Cff, can be reduced. Thus, standard cell Cff can be reduced in size and a semiconductor device reduced in size and cost can be fabricated.

Furthermore, spacing Dpm that is sufficiently large allows spacing Sb (FIG. 6) to be ensured sufficiently. This further ensures that pMIS gate wiring Gp and nMIS gate wiring Gn do not mutually short-circuit.

Furthermore the present embodiment provides spacing Sdp and spacing Ssn each larger than pitch Pmin, as shown in FIG. 8. Spacing Sdp and spacing Ssn can thus each be sufficiently large, while pitch Pmin, which significantly affects the size of standard cell Cff, can be reduced. Thus, standard cell Cff can be reduced in size and a semiconductor device reduced in size and cost can be fabricated.

Furthermore, spacing Sdp and spacing Ssn that are each sufficiently large allow spacing Sa (FIG. 6) to be ensured sufficiently. This further ensures that the source/drain regions do not mutually short-circuit.

Furthermore, as shown in FIG. 6, the plurality of gate wirings GWs are spaced equally in direction X. This can facilitate optical proximity correction and patterning.

Furthermore the plurality of pMIS wirings M1ps are arranged with pitch Pmin, i.e., a fixed pitch. Furthermore, the plurality of nMIS wirings M1ns are arranged with pitch Pmin, i.e., a fixed pitch. A pitch thus fixed facilitates providing optical proximity correction and patterning.

Furthermore, each gate wiring GW, power supply wiring VD, grounding wiring VS, pMIS wiring M1p, nMIS wiring M1n, and wiring M2 are each formed in accordance with a one-dimensional layout that does not have bending. A design that follows the RDR can thus be done.

Second Embodiment

Figure 9:
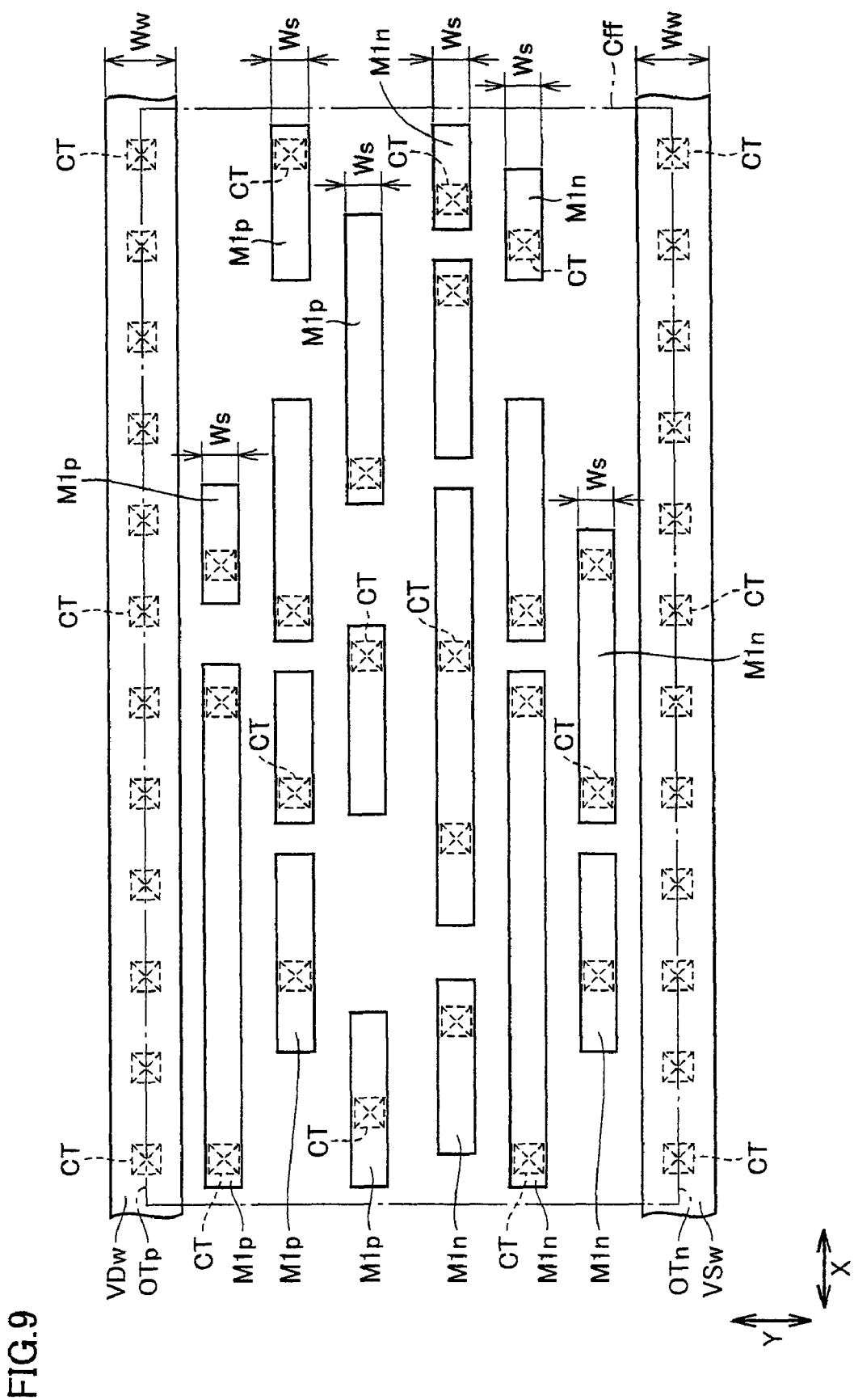
FIG. 9 is a plan view schematically showing a configuration of a second layer of one standard cell of a semiconductor device in a second embodiment of the present invention.

With reference to FIG. 9, while the first embodiment provides power supply wiring VD and grounding wiring VS, the present embodiment instead provides a power supply wiring VDw and a grounding wiring VSw. Power supply wiring VDw and grounding wiring VS each have a width Ww. Width Ww is larger than a width Ws of each of pMIS wiring M1p and nMIS wiring M1n.

The remainder in configuration is substantially identical to that described above in the first embodiment. Accordingly, identical or corresponding elements are identically denoted and will not be described repeatedly.

In accordance with the present embodiment, power supply wiring VDw and grounding wiring VSw each increased in width Ww can have a reduced voltage drop while pMIS wiring M1p and nMIS wiring M1n, which significantly affect the size of standard cell Cff, can be reduced in width Ws. This can reduce power supply voltage drop, which is disadvantageous for a fast operation in particular, and also reduce standard cell Cff in size. Standard cell Cff thus reduced in size allows a semiconductor device to be fabricated in a reduced size and at a reduced cost.

Third Embodiment

Figure 10:
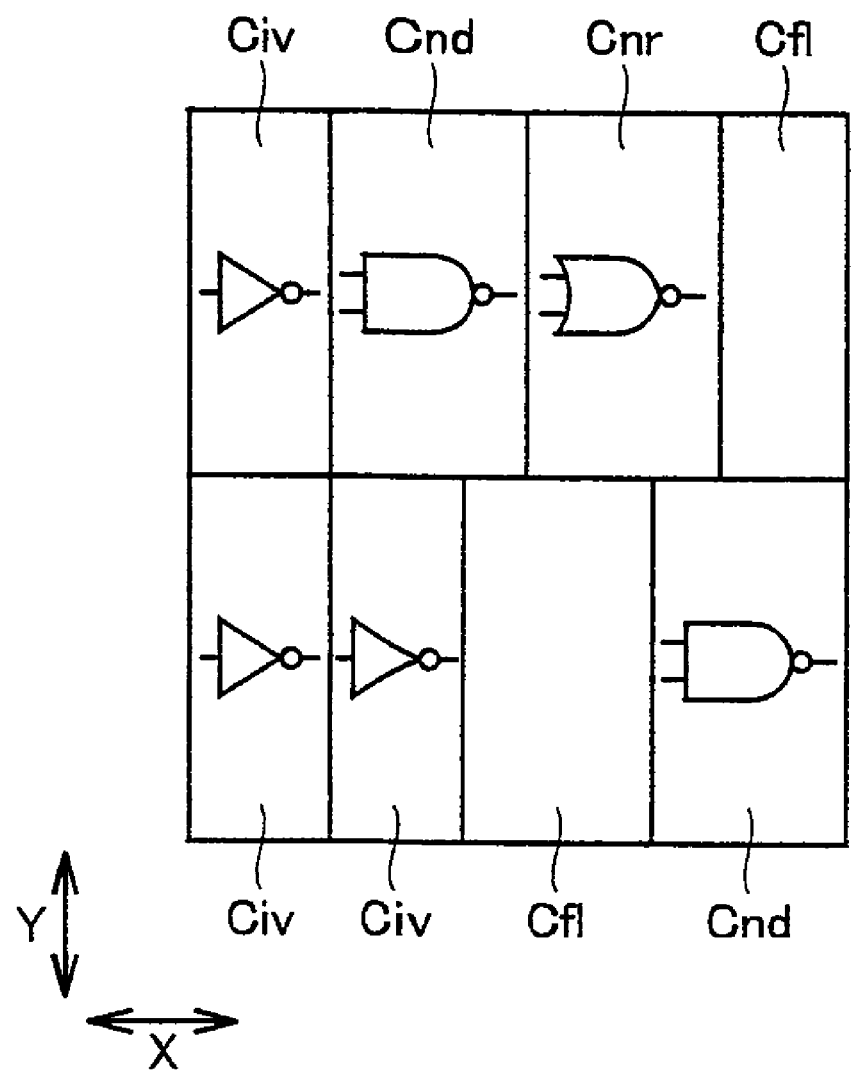
FIG. 10 is a view schematically showing an arrangement of a plurality of standard cells of a semiconductor device in a third embodiment of the present invention.

With reference to FIG. 10, the present embodiment provides a semiconductor device having standard cells Civ, Cnd, Cnr, and Cfl. Standard cells Civ, Cnd, Cnr, Cfl are divided into a plurality of rows and thus arranged, and are arranged in each row in direction X as shown in the figure.

Standard cells Civ, Cnd, and Cnr are provided to implement the functions of an inverter, a 2NAND, and a 2NOR, respectively. The 2NAND is an NAND having two input systems, and the 2NOR is an NOR having two input systems. Furthermore, standard cell Cfl is a filler cell.

Figure 11:
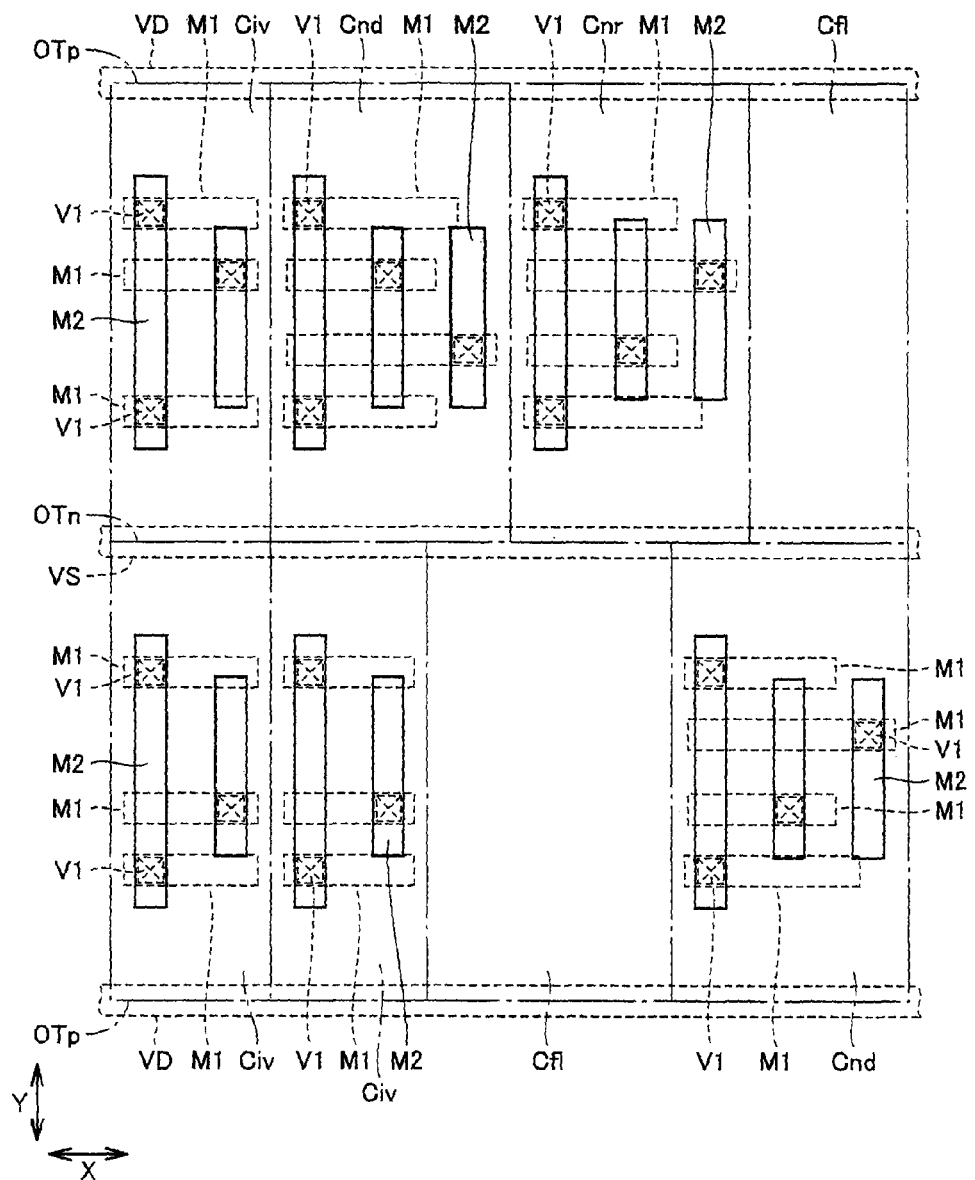
FIG. 11 is a plan view schematically showing a configuration of a plurality of standard cells of the semiconductor device in the third embodiment of the present invention.
Figure 12:
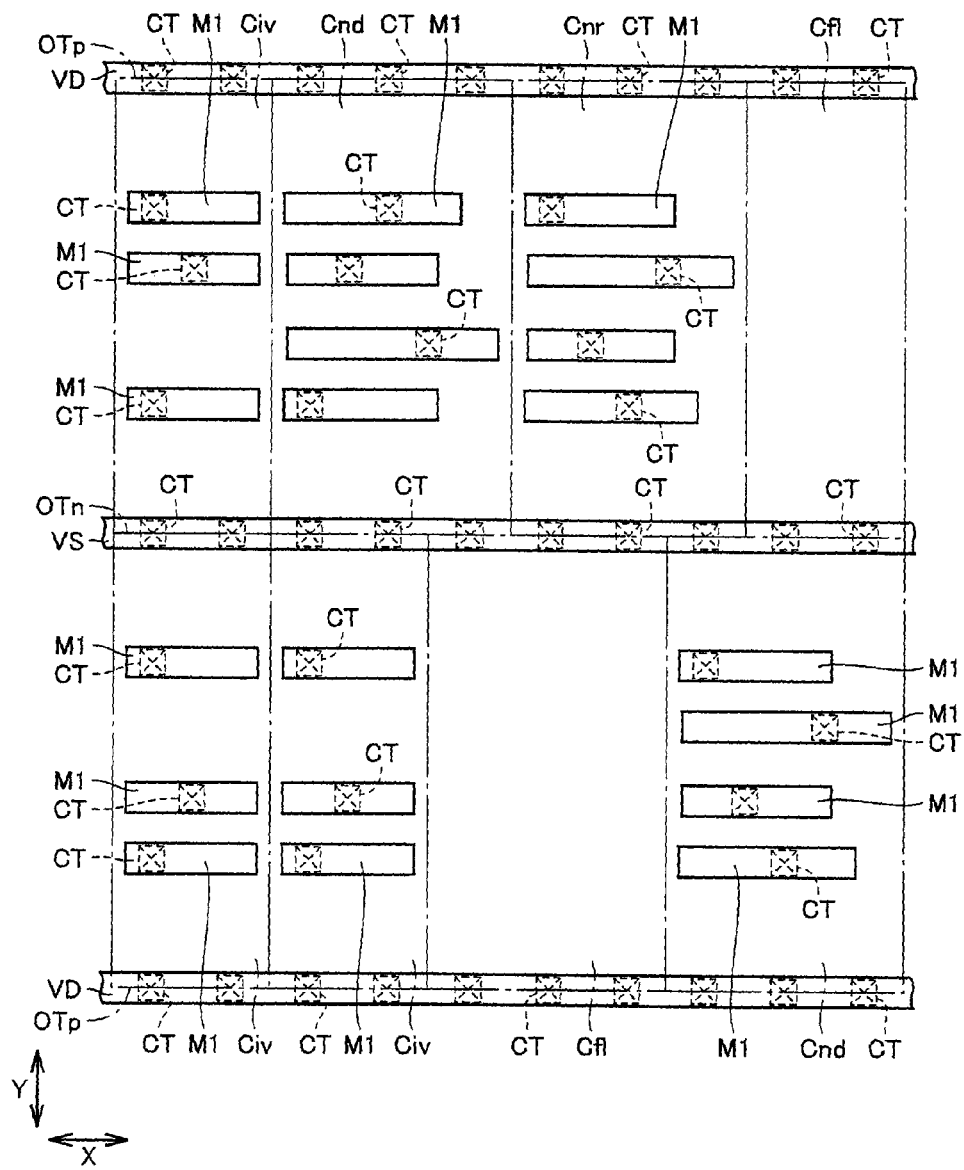
FIG. 12 is a plan view schematically showing a configuration of a second layer of the standard cell shown in FIG. 11.
Figure 13:
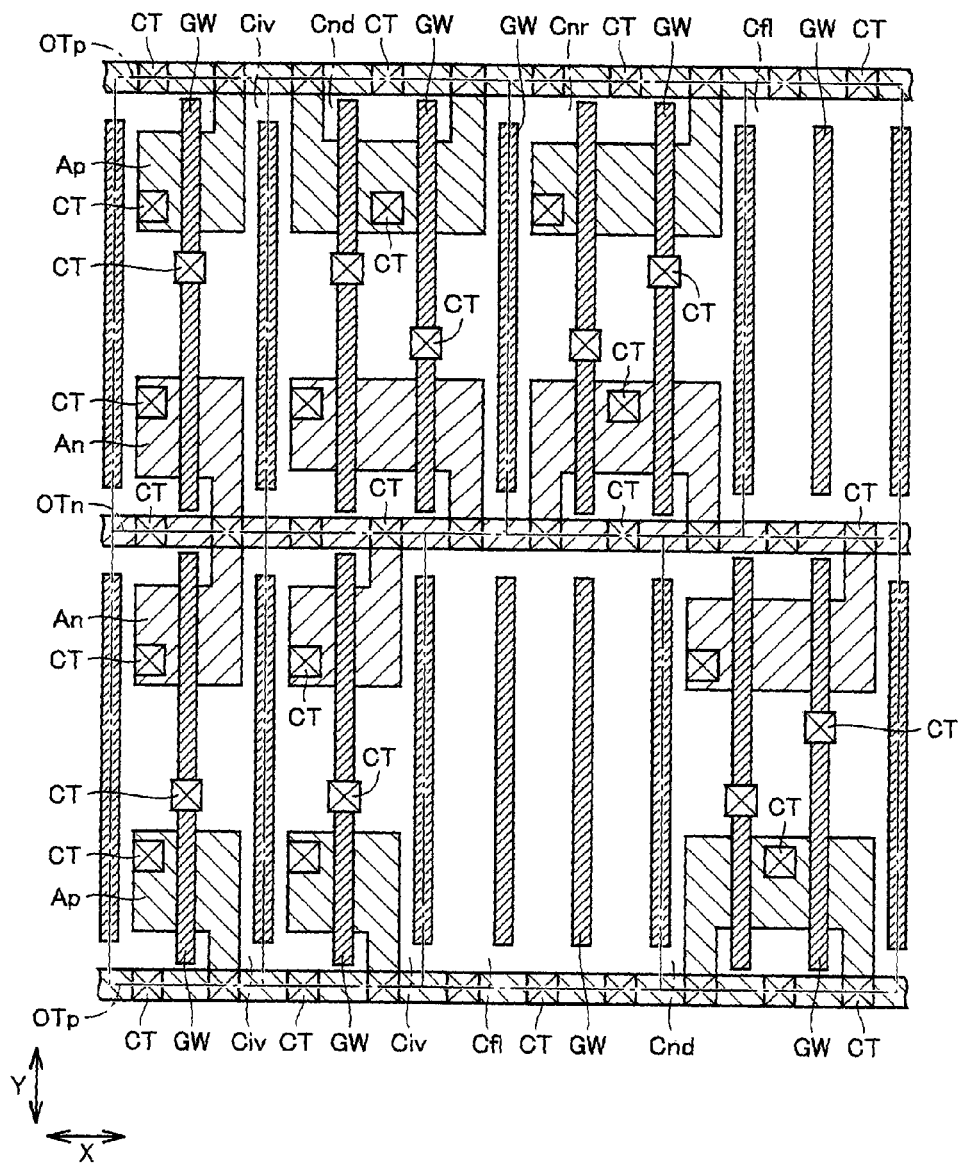
FIG. 13 is a plan view schematically showing a configuration of a first layer and a semiconductor substrate of the standard cell shown in FIG. 11.
Figure 14:
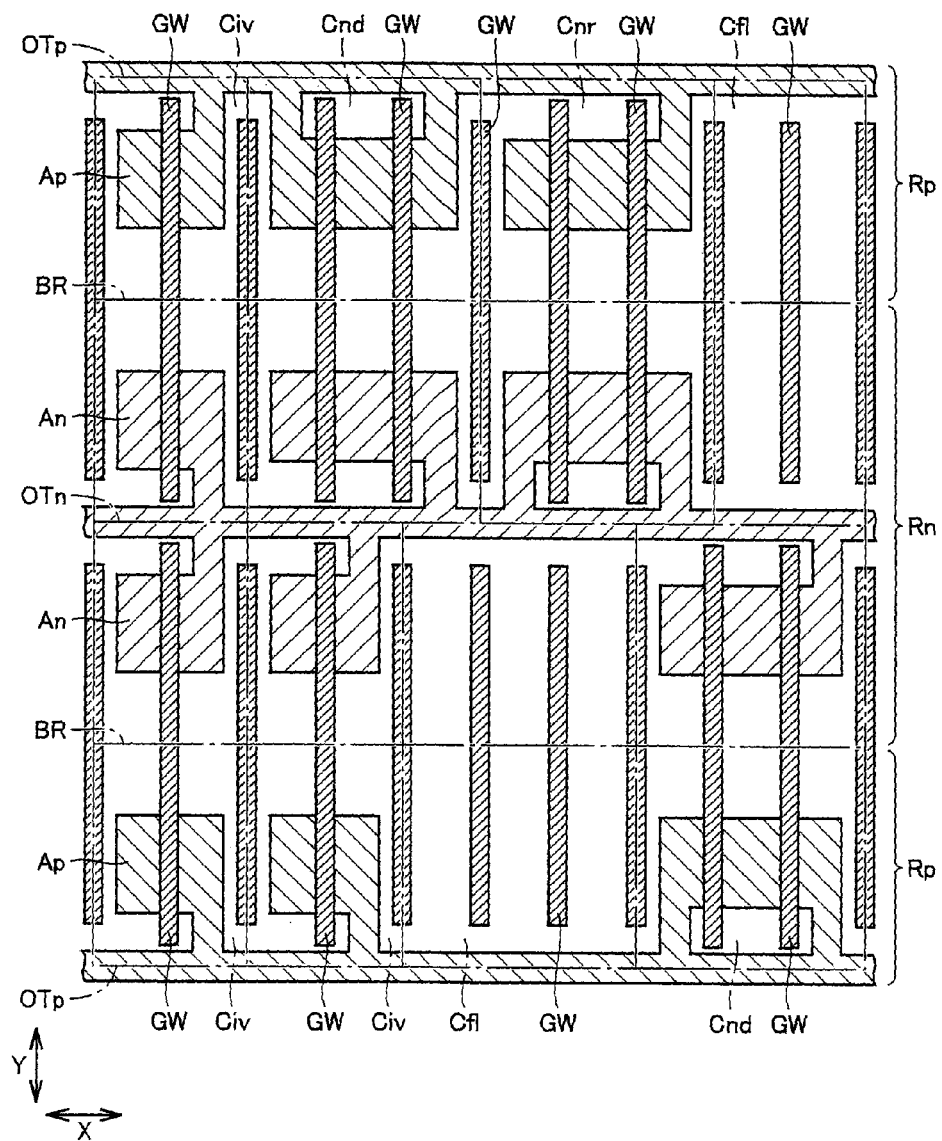
FIG. 14 is a view with a contact hole of FIG. 13 not shown.

With reference to FIGS. 11-14, the present embodiment provides a semiconductor device having standard cells Civ, Cnd, Cnr each similar in configuration to standard cell Cff of the first embodiment. More specifically, the present embodiment provides a semiconductor device having standard cells Civ, Cnd, Cnr each having a semiconductor substrate and first to third layers. The semiconductor substrate has pMIS region Rp and nMIS region Rn (FIG. 14). The first layer has gate wiring GW (FIG. 13). The second layer has either pMIS wiring or nMIS wiring, i.e., a MIS wiring M1 (FIG. 12). The third layer has wiring M2 (FIG. 11).

Figure 15:
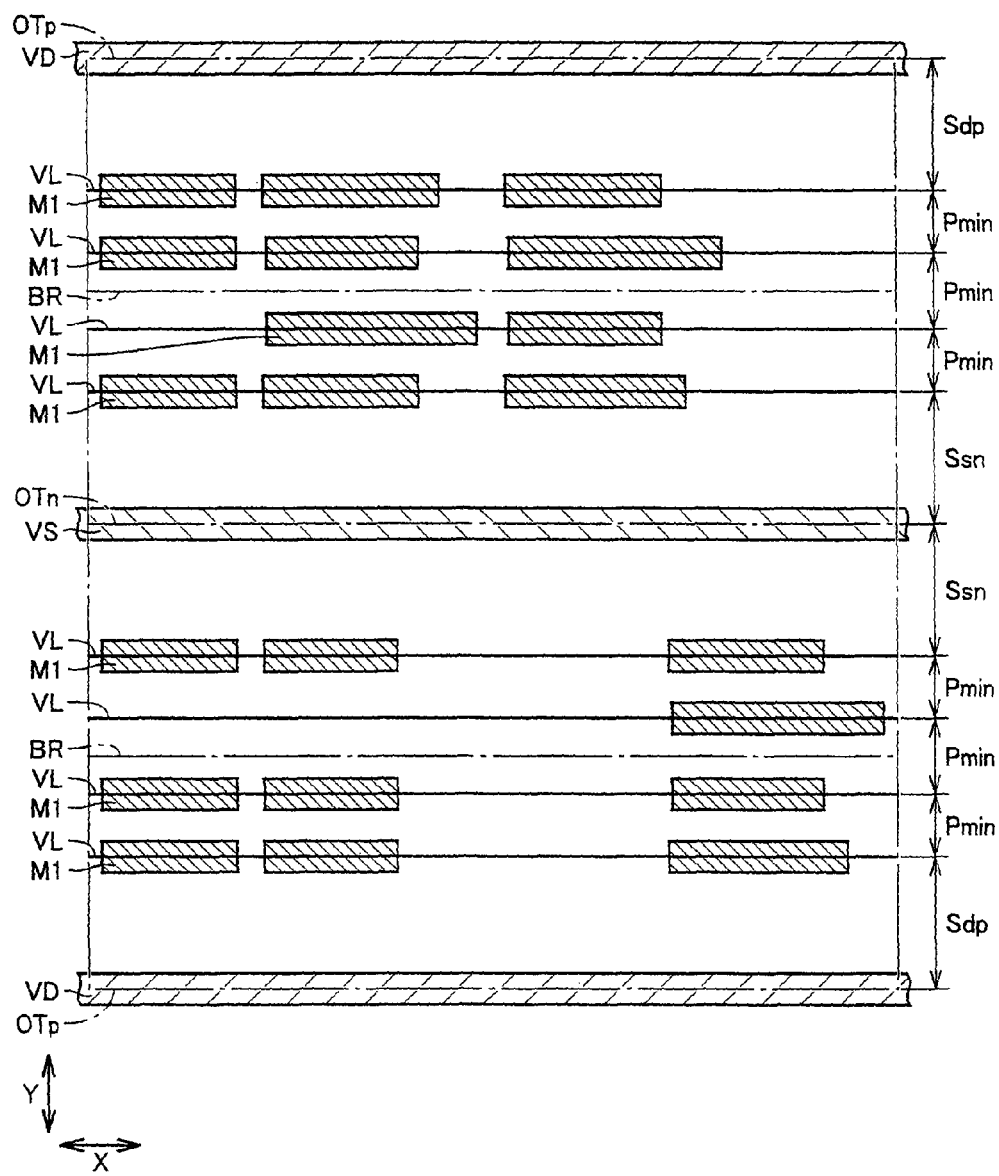
FIG. 15 is a view for illustrating the layout of the plan view of FIG. 12.

Mainly with reference to FIG. 15, a plurality of MIS wirings M1s are arranged between power supply wiring VD and grounding wiring VS on a plurality of virtual lines VLs, respectively, extending in direction X and spaced in direction Y with pitch Pmin. Furthermore, spacing Sdp between a virtual line VL of the plurality of virtual lines VLs that is the closest to first peripheral edge OTp and first peripheral edge OTp and spacing Ssn between a virtual line VL of the plurality of virtual lines VLs that is the closest to second peripheral edge OTn and second peripheral edge OTn are each larger than pitch Pmin.

The remainder in configuration is substantially identical to that described above in the first embodiment. Accordingly, identical or corresponding elements are identically denoted and will not be described repeatedly.

Thus in the present embodiment spacing Sdp and spacing Ssn are each larger than pitch Pmin. Spacing Sdp and spacing Ssn each can thus be sufficiently large, while pitch Pmin, which significantly affects standard cells Civ, Cnd, Cnr, Cfl in size, can be reduced. Thus, standard cells Civ, Cnd, Cnr, and Cfl can be reduced in size and a semiconductor device reduced in size and cost can be fabricated.

Furthermore, spacing Sdp and spacing Ssn that are each sufficiently large can further ensure, as well as in the first embodiment, that the source/drain regions do not mutually short-circuit.

Furthermore, as shown in FIG. 14, a plurality of gate wirings GWs are spaced equally in direction X. This can further facilitate optical proximity correction and patterning.

Note that this plurality of gate wirings GWs are spaced equally in direction X on both a standard cell that is used as a logic circuit (Civ, Cnd, Cnr) and a standard cell that is not used as a logic circuit (Cfl), regardless of what types of cells standard cells Civ, Cnd, Cnr, Cfl are. Furthermore, gate wiring GW is also arranged at a cell boundary between these standard cells. Furthermore, whatever types standard cells Civ, Cnd, Cnr, Cfl may be of, a standard cell that is used as a logic circuit (Civ, Cnd, Cnr) and a standard cell that is not used as a logic circuit (Cfl) both have in direction X a width that is an integral multiple of that of arranging gate wirings GWs. These matters can facilitate optical proximity correction and patterning for the plurality of gate wirings GWs.

Furthermore the plurality of MIS wirings M1s are arranged with pitch Pmin, i.e., a fixed pitch. A pitch thus fixed can facilitate optical proximity correction and patterning.

Furthermore, each gate wiring GW, power supply wiring VD, grounding wiring VS, MIS wiring M1, and wiring M2 are each formed in accordance with a one-dimensional layout that does not have bending. A design that follows the RDR can thus be done.

Note that according to the present embodiment a semiconductor device includes such a region as shown in FIG. 14. This region is functionally defined by standard cells Civ, Cnd, Cnr, Cfl (a plurality of cells) arranged in direction X (a first direction) to fill a region between first and second peripheral edges OTp and OTn (first and second cell boundaries) mutually spaced and extending in direction X. Furthermore, the semiconductor device has semiconductor substrate SB (FIG. 7) and a plurality of gate wirings GWs (gate electrodes). The plurality of gate wirings GWs (FIG. 14) extend on semiconductor substrate SB (FIG. 7) in direction Y (a second direction) orthogonal to direction X and are arranged in each of standard cells Civ, Cnd, Cnr, Cfl to be spaced equally in direction X (with a first pitch). Standard cells Civ, Cnd, Cnr, Cfl each have a width of an integral multiple of the spacing (or the first pitch) in direction X, as shown in FIG. 14.

Furthermore, standard cells Civ, Cnd, Cnr, Cfl (FIG. 14) each include pMIS region Rp (a first region) and nMIS region Rn (a second region). PMIS region Rp is sandwiched between first peripheral edge OTp and nMIS region Rn. The nMIS region is sandwiched between pMIS region and second peripheral edge OTn. Semiconductor substrate SB (FIG. 7) in pMIS region Rp includes n-type well Wn (a first well) of the n-type (a first conduction type) and semiconductor substrate SB (FIG. 7) in nMIS region Rn includes p-type well Wp (a second well) of the p-type (a second conduction type). Furthermore, the semiconductor device has p-type diffusion region Ap (a first diffusion region) deposited on a portion of n-type well Wn and being of the p type, and n-type diffusion region An (a second diffusion region) deposited on a portion of p-type well Wp and being of the n-type.

Fourth Embodiment

Figure 16:
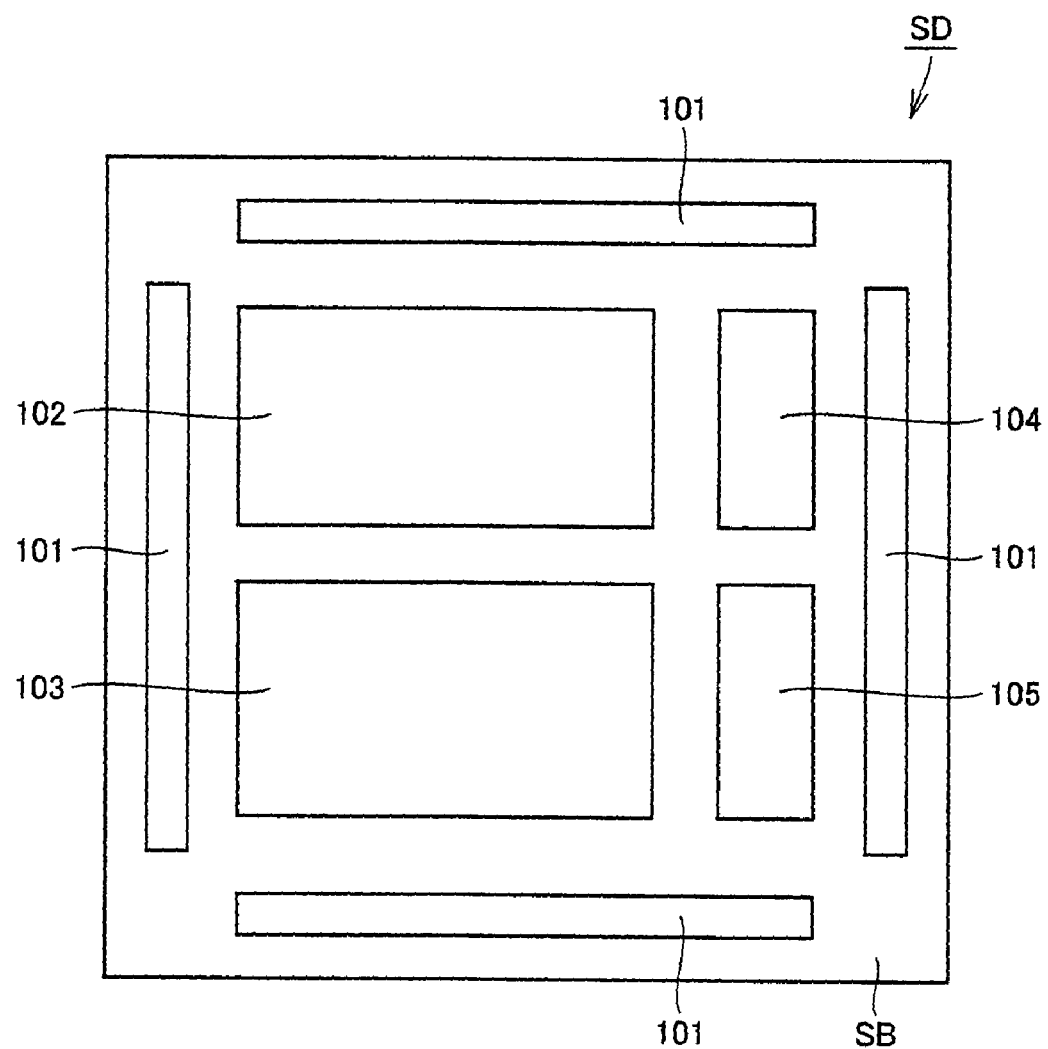
FIG. 16 is a plan view schematically showing a configuration of a semiconductor device in a fourth embodiment of the present invention.

With reference to FIG. 16, the present embodiment provides a semiconductor device SD having semiconductor substrate SB and having thereon an I/O region 101, a CPU logic region 102, a memory region 103, a phase-locked loop (PLL) region 104, and an analog region 105.

Figure 17:
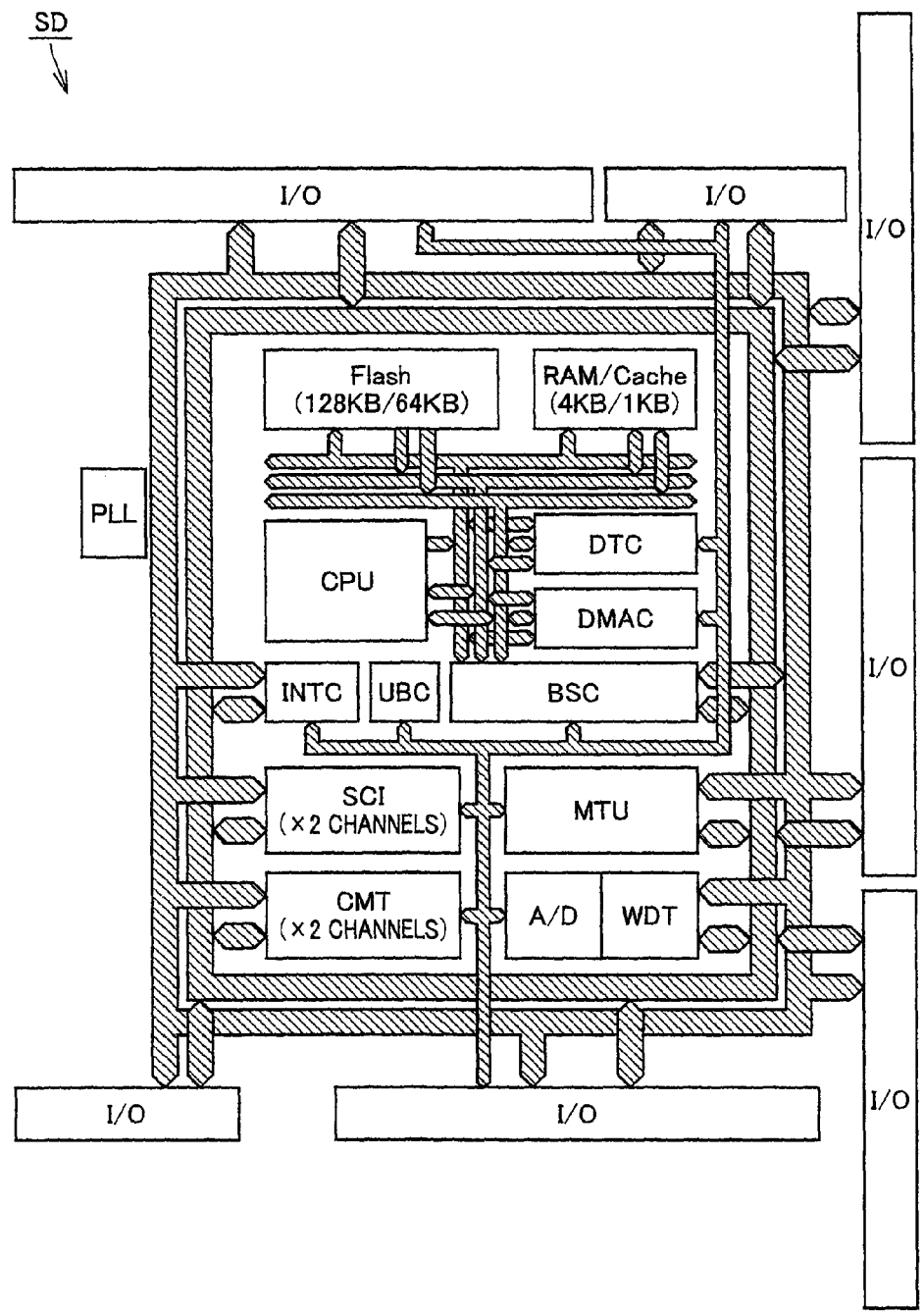
FIG. 17 is a block diagram schematically showing a configuration of the semiconductor device in the fourth embodiment of the present invention.

Mainly with reference to FIG. 17, semiconductor device SD takes a circuit configuration formed with at least a microcomputer and a flash memory and having an overall control/processing function of a semiconductor integrated circuit device and an electrically batch or one-time erasable programmable memory function. Semiconductor device SD comprises a processor CPU, a flash memory Flash, a random access memory/cache memory RAM/Cache, a data transfer controller DTC, a direct memory access controller DMAC, a bus state controller BSC, a user break controller UBC, an interrupt controller INTC, a serial communication interface SCI, a multi-function timer pulse unit MTU, a compare match timer CMT, an A/D converter A/D, a watchdog timer WDT, a phase-locked loop circuit PLL, etc.

Figure 18:
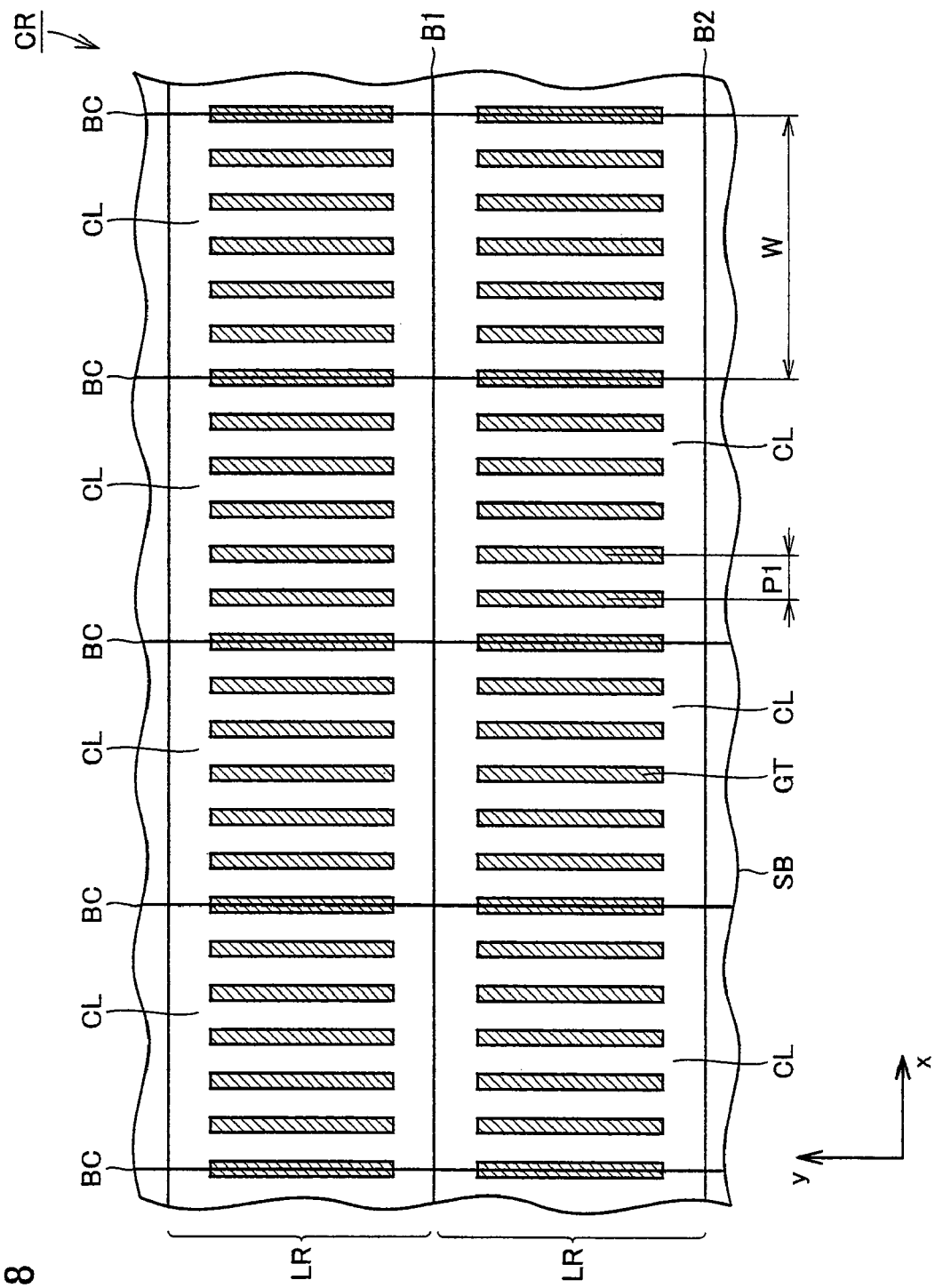
FIG. 18 is a partial plan view schematically showing a region of the semiconductor device in the fourth embodiment of the present invention, that is defined by a cell.
Figure 19:
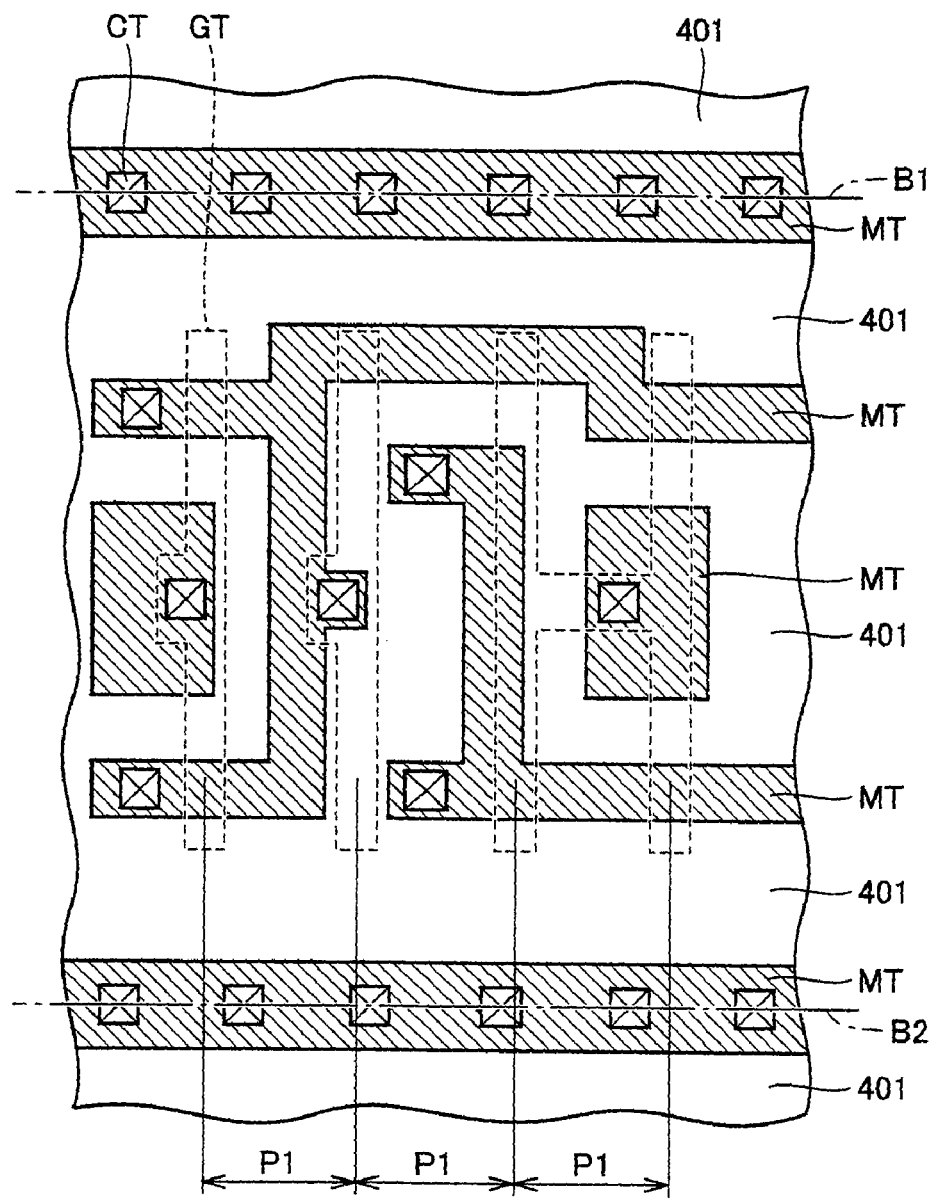
FIG. 19 is a partial plan view schematically showing an arrangement of a wiring of the semiconductor device in the fourth embodiment of the present invention.

Preferably, of the above units, at least one of processor CPU, data transfer controller DTC, direct memory access controller DMAC, bus state controller BSC, user break controller UBC, interrupt controller INTC, serial communication interface SCI, multi-function timer pulse unit MTU, compare match timer CMT, and watchdog timer WDT has its logic portion (a logic circuit portion) formed only of a cell region CR (FIG. 18).

Furthermore, preferably, of the above units, at least one of flash memory Flash and random access memory/cache memory RAM/Cache has its peripheral circuitry of a logic portion (a logic circuit portion) formed only of cell region CR (FIG. 18).

Furthermore, preferably, at least one of A/D converter A/D, watchdog timer WDT, phase-locked loop circuit PLL has its control unit of a logic portion formed only of cell region CR (FIG. 18).

Mainly with reference to FIG. 18, cell region CR has a row region LR filling a region between first and second cell boundaries B1 and B2 mutually spaced and extending in a direction x (a first direction). Row region LR is functionally defined by a plurality of cells CLs arranged in direction x. In other words, cells CLs are each defined, as seen in direction x, by a cell boundary BC extending in a direction y.

Furthermore, cell region CR is provided with a plurality of gate electrodes GTs. The plurality of gate electrodes GTs each have a portion extending on semiconductor substrate SB in direction y (the second direction) orthogonal to direction x. Furthermore, the plurality of gate electrodes GTs are arranged in each cell CL in direction x with a first pitch P1. Each cell CL has in direction x a width W of an integral multiple of first pitch P1.

Note that in FIG. 18, gate electrode GT is shown in a simplified geometry for the sake of simplicity. The geometry of gate electrode GT will more specifically be described later.

Mainly with reference to FIGS. 19-22, semiconductor device SD includes cell region CR (FIG. 18). Furthermore, semiconductor device SD has semiconductor substrate SB (FIG. 21 and FIG. 22), a plurality of gate electrodes GTs, a field oxide film 501, an interlayer insulation film 401, a metal wiring MT, and contact CT.

Each cell CL (FIG. 18) includes pMIS region Rp (the first region) and nMIS region Rn (the second region), and pMIS region Rp is sandwiched between first cell boundary B1 and nMIS region Rn and nMIS region Rn is sandwiched between pMIS region Rp and second cell boundary B2. PMIS region Rp and nMIS region Rn are adjacent with a pn boundary BR interposed.

Semiconductor substrate SB (FIG. 21 and FIG. 22) in pMIS region Rp includes n-type well Wn (a first well) of the n-type (a first conduction type) and semiconductor substrate SB in nMIS region Rn includes p-type well Wp (a second well) of the p-type (a second conduction type).

A p-type diffusion region Dp (a first diffusion region) (FIG. 21 and FIG. 22) is deposited on a portion of n-type well Wn and is of the p type, and an n-type diffusion region Dn (a second diffusion region) (FIG. 21 and FIG. 22) is deposited on a portion of p-type well Wp and is of the n-type.

An n-type conducting region Ln (a first conducting region) straddles first cell boundary B1 and also extends along first cell boundary B1. Furthermore, the n-type conducting region is of the n-type (a first conduction type) and receives a power supply potential Vcc (a first power supply potential). A p-type conducting region Lp (a second conducting region) straddles second cell boundary B2 and also extends along second cell boundary B2. Furthermore, p-type conducting region Lp is of the p-type (a second conduction type) and receives a ground potential Vss (a second power supply potential) different from power supply potential Vcc.

N-type conducting region Ln and p-type diffusion region Dp are electrically connected by contacting each other. Furthermore, p-type conducting region Lp and n-type diffusion region Dn are electrically connected by contacting each other. In other words, semiconductor device SD has a butting diffusion structure for electrical connection. N-type conducting region Ln and p-type diffusion region Dp have a surface provided with silicide SC1, and n-type diffusion region Dn and p-type conducting region Lp have a surface provided with silicide SC2. Silicide SC1 and silicide SC2 that thus exist will allow conduction to be established between regions different in type of conduction, i.e., between n-type conducting region Ln and p-type diffusion region Dp, and between p-type conducting region Lp and n-type diffusion region Dn.

Figure 20:
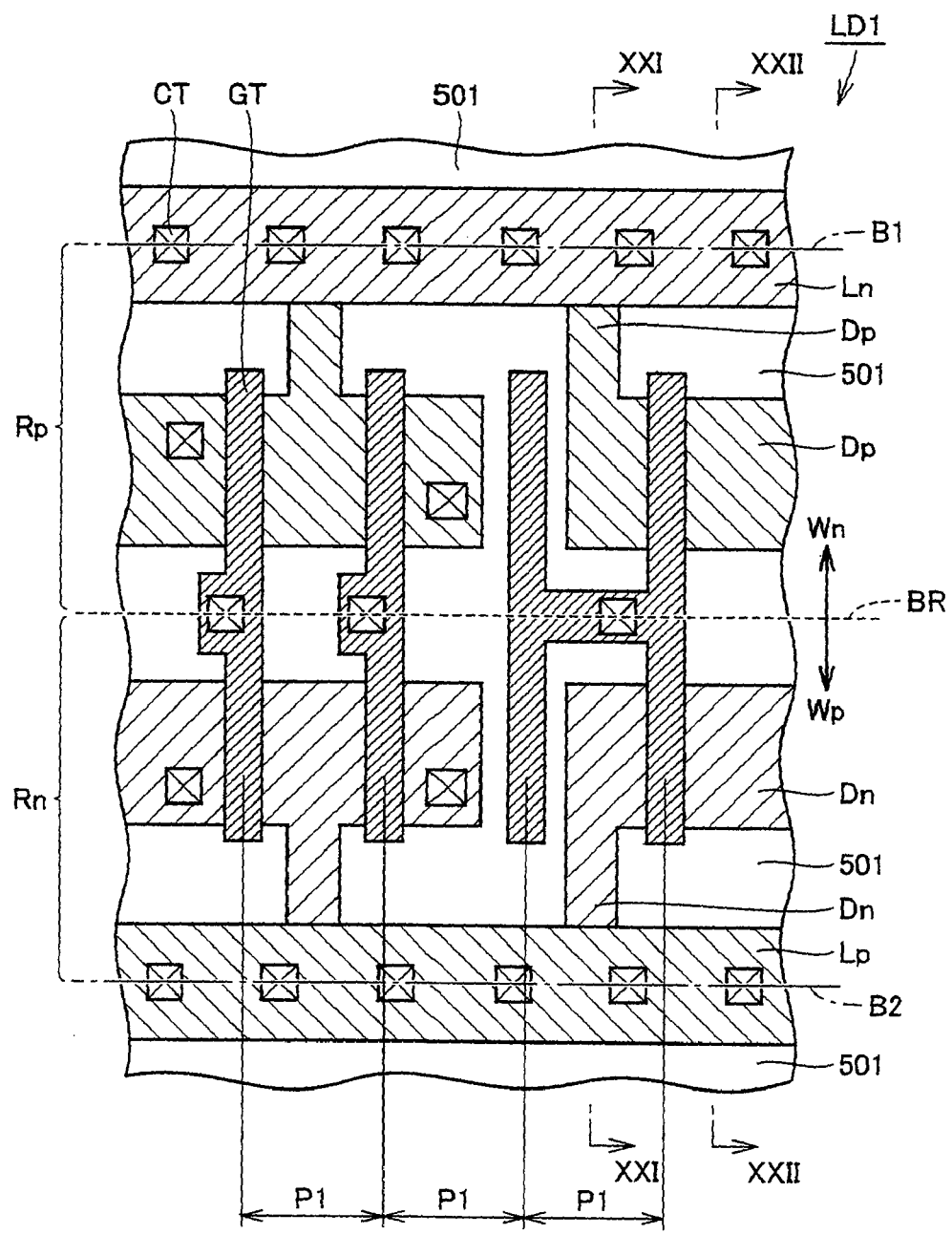
FIG. 20 is a partial plan view schematically showing an arrangement of a gate electrode and a diffusion layer of the semiconductor device in the fourth embodiment of the present invention.
Figure 21:
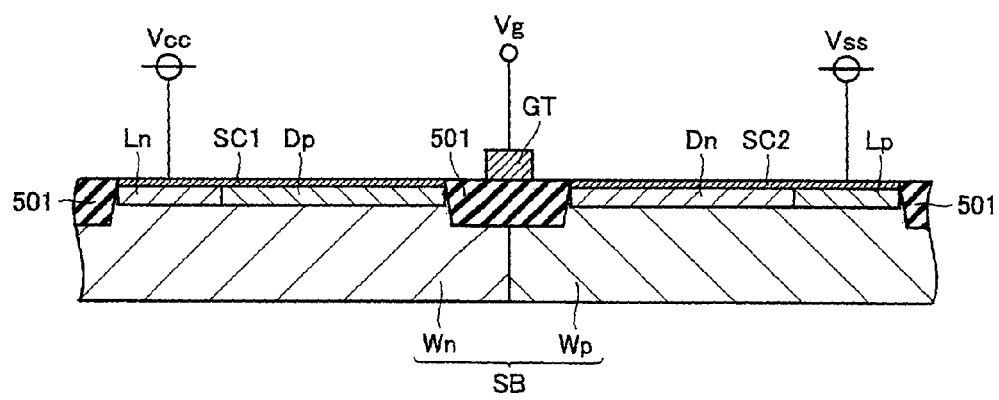
FIG. 21 is a schematic partial cross section taken along a line XXI-XXI of FIG. 20.
Figure 22:
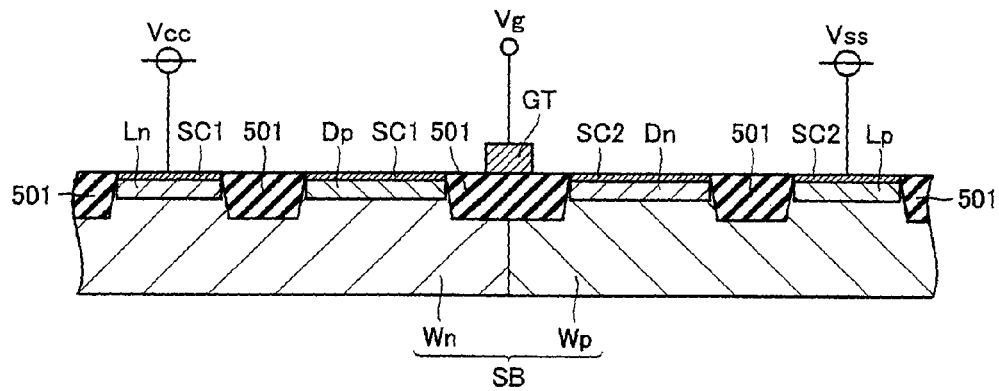
FIG. 22 is a schematic partial cross section taken along a line XXII-XXII of FIG. 20.

Note that although not shown in FIG. 20, n-type conducting region Ln and p-type diffusion region Dp shown in FIG. 20 have a surface provided with silicide SC1 and n-type diffusion region Dn and p-type conducting region Lp shown in FIG. 20 have a surface provided with silicide SC2.

Furthermore, although not shown, the other embodiments following the present embodiment and comparative examples describe a variety of embodiments and comparative examples having the butting diffusion structure, which provide n-type conducting region Ln and p-type diffusion region Dp having a surface provided with silicide SC1, and n-type diffusion region Dn and p-type conducting region Lp having a surface provided with silicide SC2. The above variety of embodiments and comparative examples similarly including silicide SC1 and silicide SC2 will also allow conduction to be established between regions different in type of conduction, i.e., between n-type conducting region Ln and p-type diffusion region Dp, and between p-type conducting region Lp and n-type diffusion region Dn.

Metal wiring MT and contact CT are configured to be capable of applying a gate potential Vg, power supply potential Vcc, and ground potential Vss to gate electrode GT, n-type conducting region Ln, and p-type conducting region Lp, respectively.

Hereinafter, a comparative example will be described.

Figure 23:
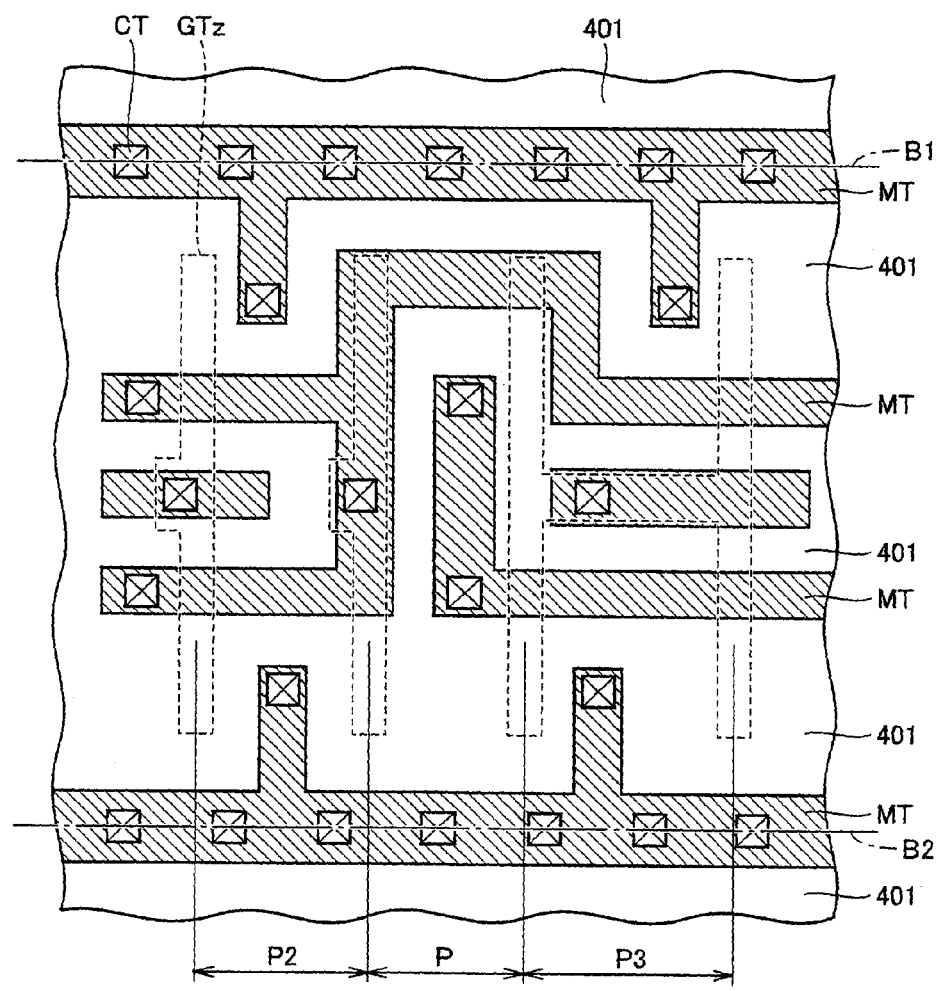
FIG. 23 is a partial plan view showing an arrangement of a wiring of a semiconductor device in a first comparative example.
Figure 24:
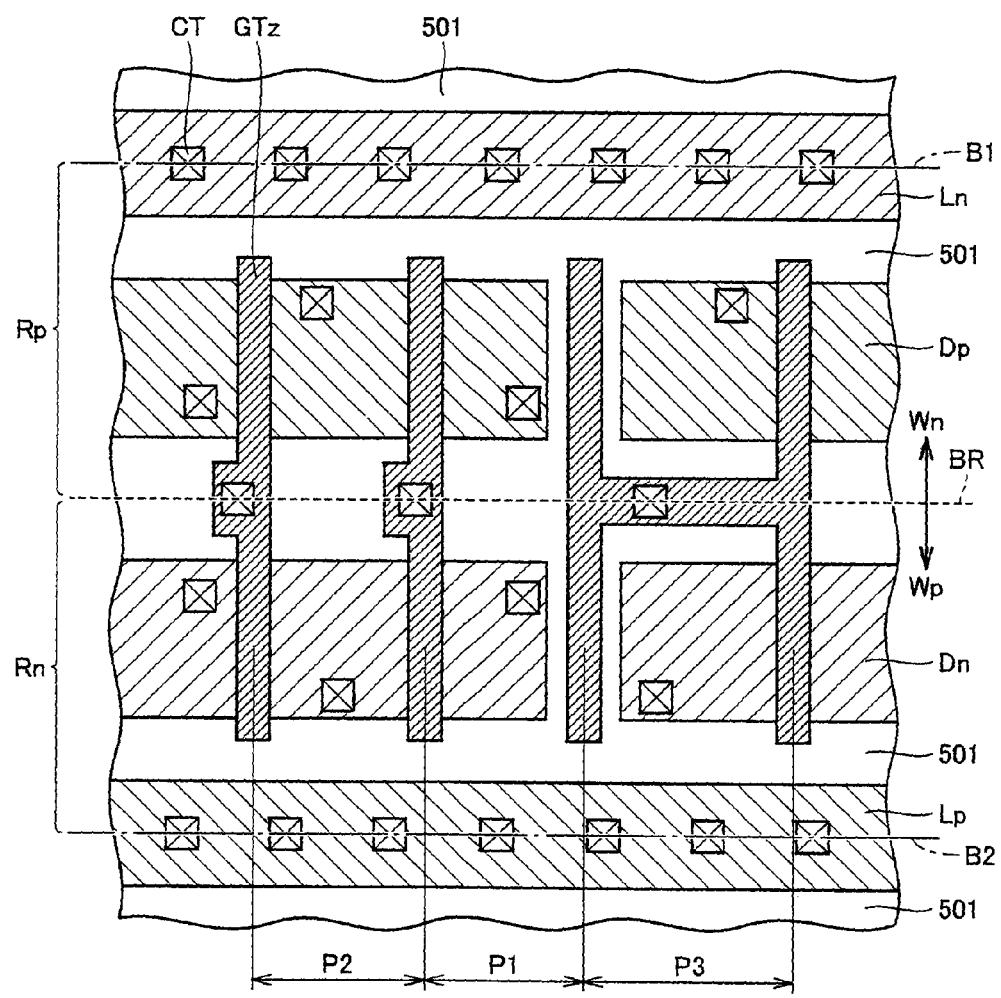
FIG. 24 is a partial plan view showing an arrangement of a gate electrode and a diffusion layer of the semiconductor device in the first comparative example.

With reference to FIGS. 23 and 24, the present comparative example does not have the butting diffusion structure.

Accordingly, n-type conducting region Ln and p-type diffusion region Dp are electrically connected by metal wiring MT and contact CT and so are p-type conducting region Lp and n-type diffusion region Dn. In other words, the comparative example is provided with more contacts CTs than the present embodiment. As a result, a gate electrode GTz is restricted in arrangement, and a plurality of gate electrodes GTzs cannot be arranged with a single, first pitch P1. More specifically, a second pitch P2 larger than first pitch P1 and a third pitch P3 larger than second pitch P2 also exist together with first pitch P1. Thus, in this comparative example, high integration is difficult to achieve.

The present embodiment provides a plurality of cells CLs (FIG. 18) each having width W of an integral multiple of first pitch P1 in direction x. This allows row region LR that is filled with the plurality of cells CLs to have gate electrodes GTs arranged with uniform pitches. This allows a design with cells CLs highly integrated to also ensure resolution and stability in lithography.

Figure 25:
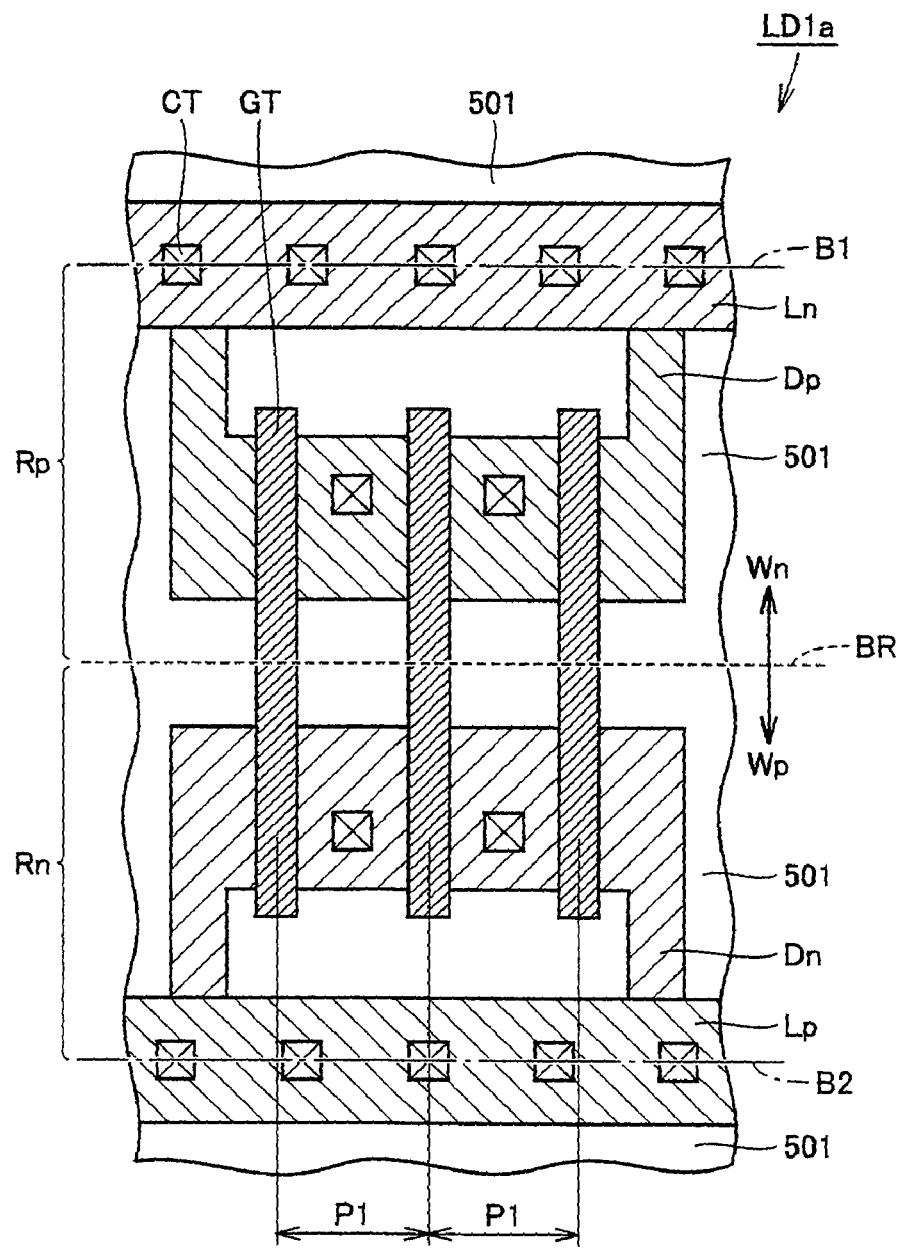
FIGS. 25-29 are partial plan views schematically showing arrangements of a gate electrode and a diffusion layer in first to fifth exemplary variations, respectively, of the semiconductor device in the fourth embodiment of the present invention.

Note that the configuration in the present embodiment of a layer LD1 (FIG. 20) having gate electrode GT may be replaced for example with those of first to fifth exemplary variations described below:

Mainly with reference to FIG. 25, a first exemplary variation provides a layer LD1$a$ with a plurality of gate electrodes GTs separated from each other. Furthermore, each gate electrode GT straddles pMIS region Rp and nMIS region Rn in direction y (in FIG. 25, a longitudinal direction) and has both a function serving as a gate of a pMIS transistor and that serving as a gate of an nMIS transistor.

Figure 26:
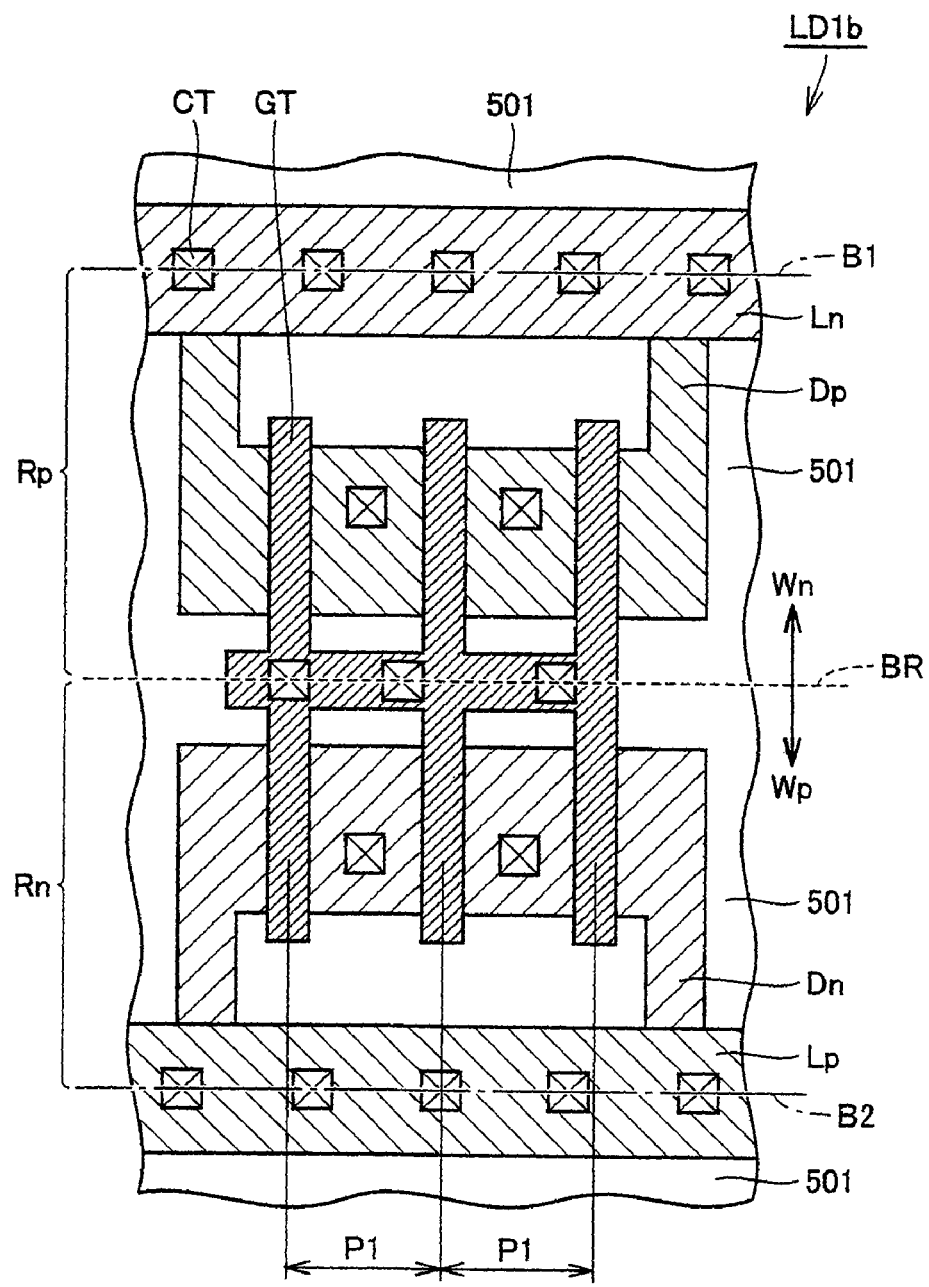

With reference to FIG. 26, a second exemplary variation provides a layer LD1$b$ with a plurality of gate electrodes GTs mutually electrically connected.

Figure 27:
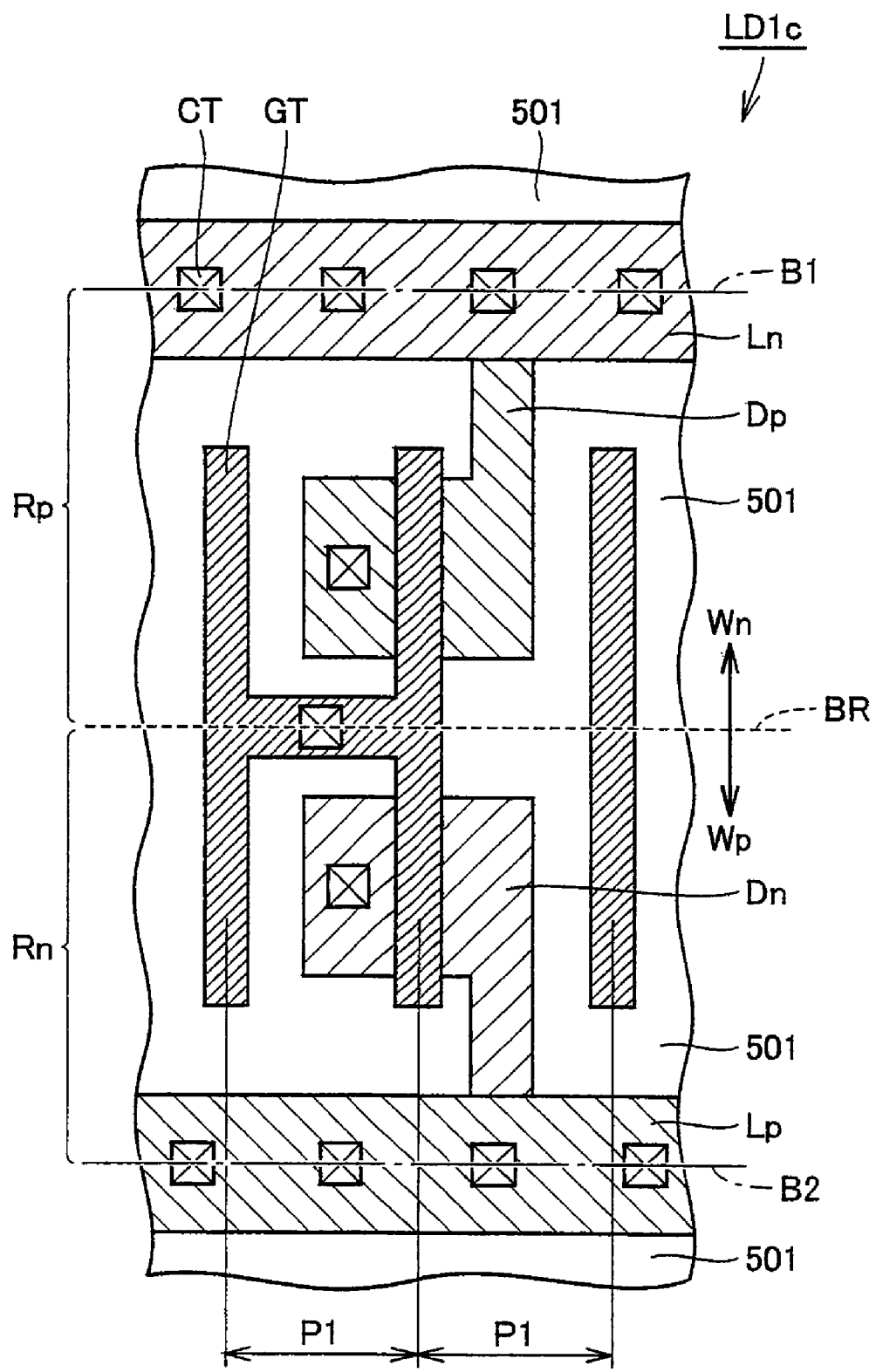

Mainly with reference to FIG. 27, a third exemplary variation provides a layer LD1$c$ with a plurality of gate electrodes GTs including a control electrode externally controlled in potential to control conduction/non conduction between a source and a drain of a transistor (in FIG. 27, gate electrode GT located at a center) and a dummy electrode that is not externally controlled in potential, or is externally controlled in potential and does not control conduction/non conduction between a source and a drain of a transistor (in FIG. 27, gate electrodes GTs located at opposite, right and left ends). The dummy electrode is arranged in one of the plurality of cells CLs (FIG. 18). Furthermore, the control electrode is electrically connected to one dummy electrode.

Figure 28:
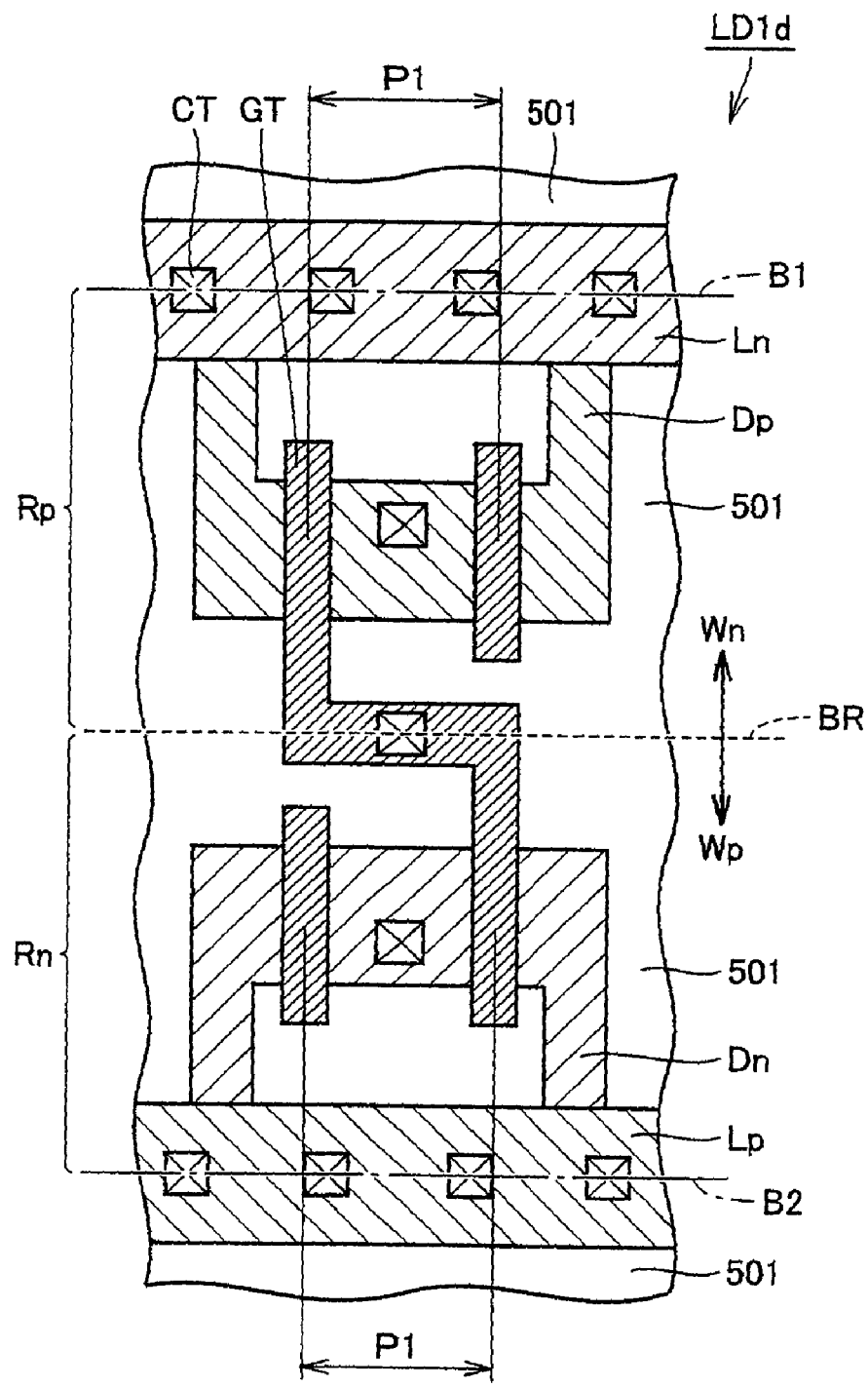

Mainly with reference to FIG. 28, a fourth exemplary variation provides a layer LD1$d$, which in contrast to the first exemplary variation's layer LD1$a$ (FIG. 25) has gate electrode GT extending in direction y (in FIG. 25, a longitudinal direction) that each has a portion that is located on p-type diffusion region Dp and a portion that is located on n-type diffusion region Dn electrically isolated from each other. Furthermore, gate electrodes GTs that are adjacent in direction x (in FIG. 28, a lateral direction) have one gate electrode GT (in FIG. 28, a left gate electrode GT) and the other gate electrode GT (in FIG. 28, a right gate electrode GT) such that their respective portions that are located on p-type diffusion region Dp and n-type diffusion region Dn, respectively, are electrically connected.

Figure 29:
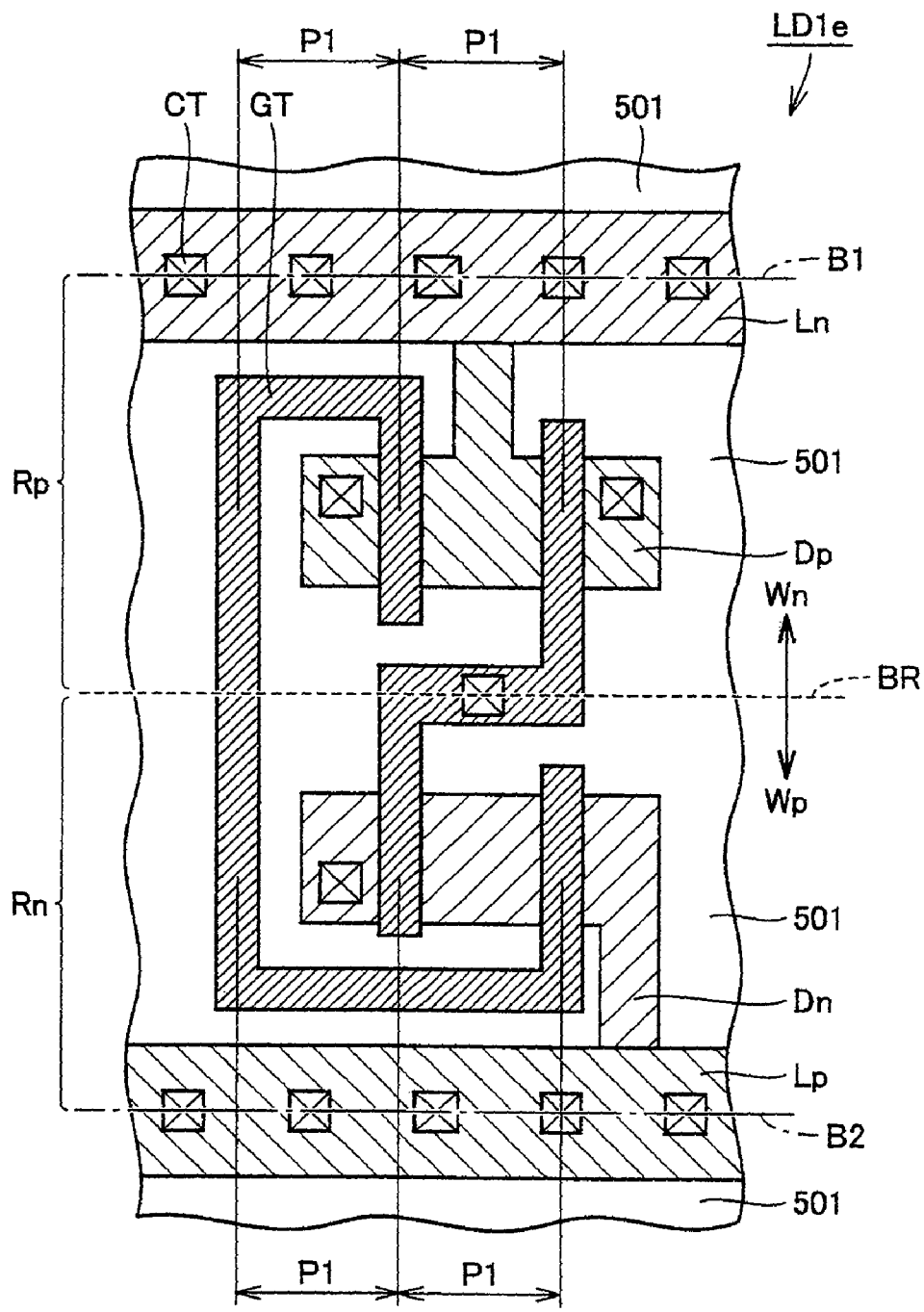

With reference to FIG. 29, a fifth exemplary variation provides a layer LD1$e$ with gate electrodes GTs adjacent in direction x (in FIG. 28, a lateral direction) such that the portions of one gate electrode GT (in FIG. 28, a left gate electrode GT) that are located on p-type diffusion region Dp and n-type diffusion region Dn, respectively, and those of the other gate electrode GT (in FIG. 28, a right gate electrode GT) that are located on n-type diffusion region Dn and p-type diffusion region Dp, respectively, are electrically connected.

Furthermore, as shown in FIG. 17, processor CPU is a central processing unit having a RISC (reduced instruction set computer) type command or instruction set, for example. Since the CPU operates on one-instruction/one-cycle basis, its instruction execution speed is greatly improved. Further, the CPU takes an internal 32-bit configuration and has enhanced data throughput. As the CPU's features, the CPU is provided with various functions such as a general-purpose register machine (general-purpose register: 32 bits×16, control register: 32 bits×3 and system register: 32 bits×4), a RISC corresponding instruction set (improvements in code efficiency based on a 16-bit fixed length defined as an instruction length, load store architecture (basic arithmetic operation being executed between registers), a reduction in disturbance of a pipeline at branch-off due to the adoption of a delay branch instruction, a C language-oriented instruction set, an instruction execution time corresponding to one instruction/one cycle (35 ns/instruction upon 28 MHz-based operation), an address space given as 4 GB on the architecture, an execution of 32×32→64 multiplication in 2 to 4 cycles and an execution of 32×32+64→64 sum-of-product arithmetic operation in 2 to 4 cycles with a built-in multiplier, a 5-stage pipeline system, etc.

Flash memory Flash is a circuit having, for example, a 64 K-byte or 128 K-byte electrically one-time erasable programmable memory incorporated therein. Flash memory Flash is electrically connected to the CPU, DMAC and DTC through a data bus having a 32-bit width, for example. The CPU, DMAC and DTC can access flash memory Flash with 8, 16 or 32-bit width. Data held in flash memory Flash can be accessed in one state at all times.

Random access memory/cache memory RAM/Cache is a memory which comprises, for example, a 4 KB random access memory RAM and a 1 KB cache memory Cache. As features of the present Cache, the Cache is provided with various functions that, for example, an instruction code and a PC relative read/data caching are executed, a line length is 4 bytes (one long word: 2 instruction lengths), cache tags are given as 256 entries, a direct map method, a built-in ROM/RAM and a built-in I/O area are not intended for cache and also used for a built-in RAM, 2 KB of the built-in RAM is used for an address array/data array upon cache enabling.

Data transfer controller DTC is a circuit started up by an interruption or software and capable of performing data transfer. As the DTC's features, the DTC is provided with various functions that, for example, each data transfer independent of the CPU can be performed according to a peripheral I/O interrupt request, transfer modes can be set every interrupt factor (each transfer mode can be set onto the corresponding memory), a plurality of data transfers can be made to one start-up factor, an abundance of transfer modes (normal mode/repeat mode/block transfer mode) can be selected, a transfer unit can be set to byte/word/long word, an interrupt to start up the DTC is required of the CPU (an interrupt to the CPU can be produced after the completion of one data transfer and an interrupt to the CPU can be generated after the completion of all the designated or specified data transfers), and the start-up of each transfer can be performed by software. With respect to an address space, a transfer-source address and a transfer-destination address can be both specified by 32 bits. With respect to each device intended for transfer, data transfers are effected on flash memory Flash serving as a built-in memory, the RAM/Cache, an external memory, built-in peripheral circuits, etc.

Direct memory access controller DMAC is a circuit which comprises 4 channels, for example, and is capable of performing transfers of data between an external device with a DACK (transfer request reception or acknowledge signal), an external memory, a memory-mapped external device and built-in peripheral circuits (except for the DMAC, BSC and UBC) as an alternative to the CPU. The use of the DMAC makes it possible to reduce a load on the CPU and improve the operation efficiency of semiconductor device SD. As features for the DMAC, may be mentioned, the support of a cycle-stealing transfer, the support of a dual address mode transfer and the ability to make switching between direct transfer/indirect transfer modes (channel 3 alone). The direct transfer mode corresponds to the function of transferring data located at the transfer-source address to the transfer-destination address. The indirect transfer mode corresponds to the function of using data placed at the transfer-source address as an address and transferring data at that address to the transfer-destination address. There are also provided a reload function, and transfer request functions based on an external request, a built-in circuit and an auto request in a specific channel. Further, there are provided various functions such as the selection of a bus mode, the setting of priorities according to a priority fixing mode and a round robin mode, an interruption request to the CPU, etc.

Bus state controller BSC is a circuit which performs separation or division of an address space and outputs control signals according to various memories, for example. Thus, DRAM, SRAM, ROM, etc. can be directly connected to semiconductor device SD without an externally provided circuit. Features of the BSC include various functions such as the support of memory access at external expansion (external data bus: 32 bits), the division of the address space into five areas (i.e., SRAM space×4 areas, DRAM space×1 area), the output of bus sizes (8/16/32 bits), the number of wait cycles and chip select signals corresponding to the respective areas to the respective areas, the output of a DRAM bar RAS signal and a bar CAS signal upon DRAM space access, the ability to set characteristics such as an ability to generate a Tp cycle for ensuring a RAS precharge time, a DRAM burst access function (high-speed access mode support of DRAM), a DRAM refresh function (the support of a programmable refresh interval, a bar CAS before bar RAS refresh/self-refresh), the ability to insert a wait cycle based on an external wait signal, the ability to access an address data multiplex I/O device, etc.

User break controller UBC is a circuit for providing the function of facilitating a user's program debug. When a break condition is set to the UBC, a user break interruption takes place according to the contents of a CPC-based bus cycle or DMAC and DTC-based bus cycles. The use of such a function makes it possible to easily create a high-function self monitor debugger. Thus, even if a large-scaled in-circuit emulator is not used, semiconductor device SD itself can debug a program with ease. Features of the UBC are as follows: The CPU or DMAC produces an interrupt when a bus cycle corresponding to a given set condition is produced. It is also easy to construct an on-chip debugger. Further, addresses, a CPU cycle or DMA/DTC cycle, an instruction fetch or data access, reading or writing, and operand sizes (long word, word, byte) can be set as break conditions. With the establishment of the break conditions, a user break interruption takes place, so that a user break interrupt exception routine created by a user can be executed.

Interrupt controller INTC is a circuit for making a decision as to priorities of interrupt factors and controlling each interrupt request to processor CPU. The present INTC has a register for setting the priorities to the respective interrupts. Thus, the interrupt requests can be processed in accordance with the priorities set by a user. Features of the INTC are as follows: The number of external interrupt terminals is 9, the number of internal interrupt factors is 43, and 16-level priorities can be set. Further, the occurrence of a noise canceller function and interrupt indicative of the state of an NMI terminal can be output to the outside. When a bus right is being released, semiconductor device SD notifies the occurrence of a built-in peripheral circuit interrupt to an external bus master, whereby semiconductor device SD is able to request the bus right.

Serial communication interface SCI comprises, for example, two channels independent of each other. The two channels have the same function. The present SCI is a circuit capable of performing serial communications in the form of two systems of an asynchronous communication and a clock synchronous communication. Further, the present SCI is provided with the function of performing serial communications between a plurality of processors (i.e., a multi-processor communication function). Features of the present SCI include various functions such as the ability to select an asynchronous/clock synchronous mode per channel, the ability to perform transmission and reception simultaneously (full duplex), the incorporation of a dedicated baud-rate generator therein, the function of performing communications between multi-processors, etc.

Multi-function timer pulse unit MTU is a circuit made up of a 6-channel 16-bit timer, for example. Features of the present MTU include the following various functions: A process for inputting and outputting sixteen types of waveform outputs or sixteen types of pulses at maximum can be performed with 16-bit timer 5 channels as a base. Sixteen output compare registers and input capture registers, independent comparators corresponding to 16 in total, and eight types of counter input clocks can be selected. Further, there are provided an input capture function, pulse output modes (one shot/toggle/PWM/complementary PWM/reset synchronous PWM), a function for synchronizing a plurality of counters, complementary PWM output modes (the output of a non-overlap waveform for control of a 6-phase inverter, dead time automatic setting, the ability to set PWM duty to an arbitrary one of 0 to 100%, an output OFF function), a reset synchronous PWM mode (the output of positive-phase/anti-phase PWM waveforms of any duty in the form of three phases), a phase count mode (the ability to perform a 2-phase encoder counting process), etc.

Compare match timer CMT comprises two channels, for example, and is made up of a 16-bit free running counter and one compare register or the like. Compare match timer CMT is provided with the function of generating an interrupt request according to a compare match.

A/D converter A/D takes a 10-bit×8 channel configuration and is capable of performing conversion according to an external trigger. Further, A/D converter A/D has sample and hold functions incorporated therein in the form of two units and is capable of simultaneously sampling two channels.

Watch dog timer WDT is a one-channel timer and is a circuit capable of monitoring a system. When the value of a counter is overflown due to a runaway or the like of the system without being properly rewritten by the CPU, watch dog timer WDT outputs an overflow signal to the outside. Simultaneously, watch dog timer WDT can also generate an internal reset signal for semiconductor device SD. When the watch dog timer is not used as the WDT, it can be used also as an interval timer. When the watch dog timer is used as the interval timer, it generates an interval timer interrupt each time the counter is overflown. Further, watch dog timer WDT is used even upon canceling or clearing of a standby mode. Incidentally, the internal reset signal can be generated according to the setting of a register. A power-on reset or manual reset can be selected as the type of reset. As the WDT's features, the WDT is provided with the ability to perform switching between the watch dog timer and the interval timer, the function of generating an internal reset, an external signal or an interruption upon the occurrence of count overflow, etc.

Phase-locked loop circuit PLL is defined as a circuit which incorporates a clock oscillator therein, for example, and serves as a PLL circuit for clock multiplication.

Fifth Embodiment

Figure 30:
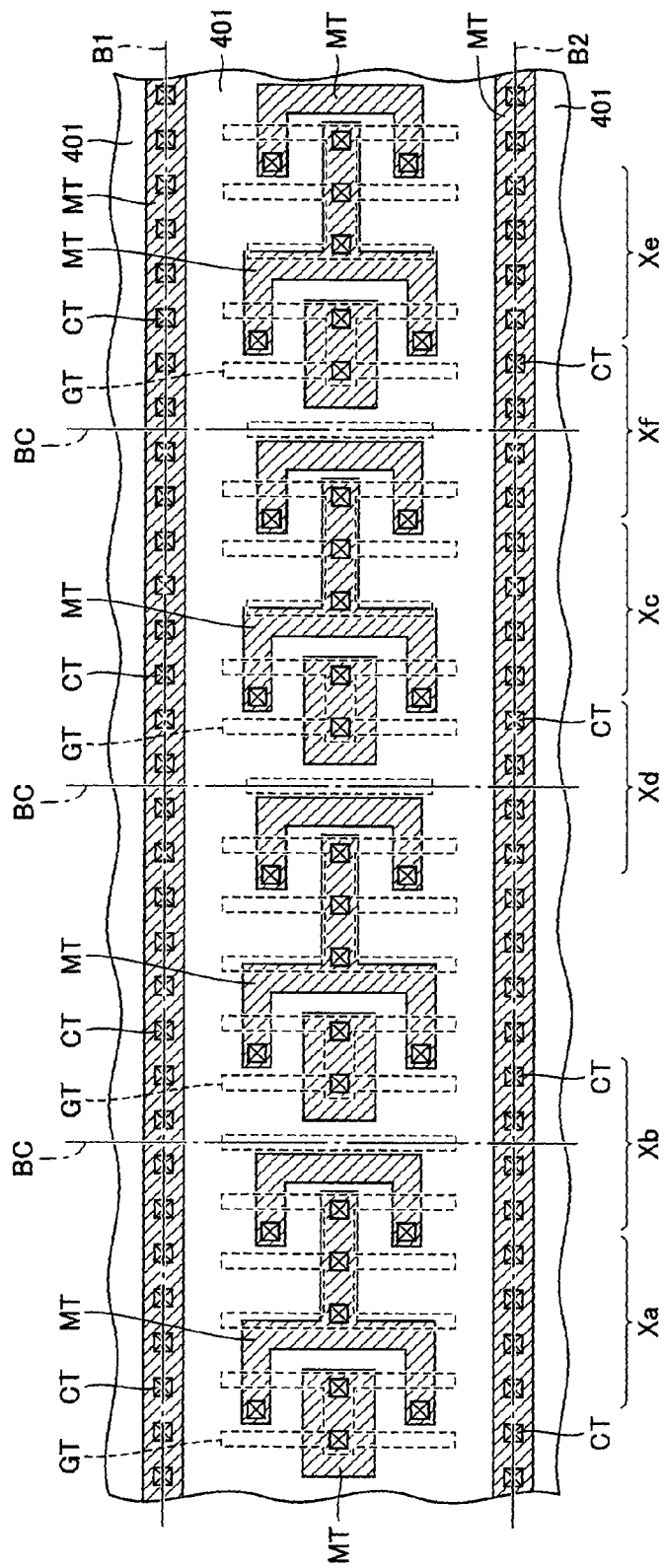
FIG. 30 is a partial plan view schematically showing an arrangement of a wiring of a semiconductor device in a fifth embodiment of the present invention.
Figure 31:
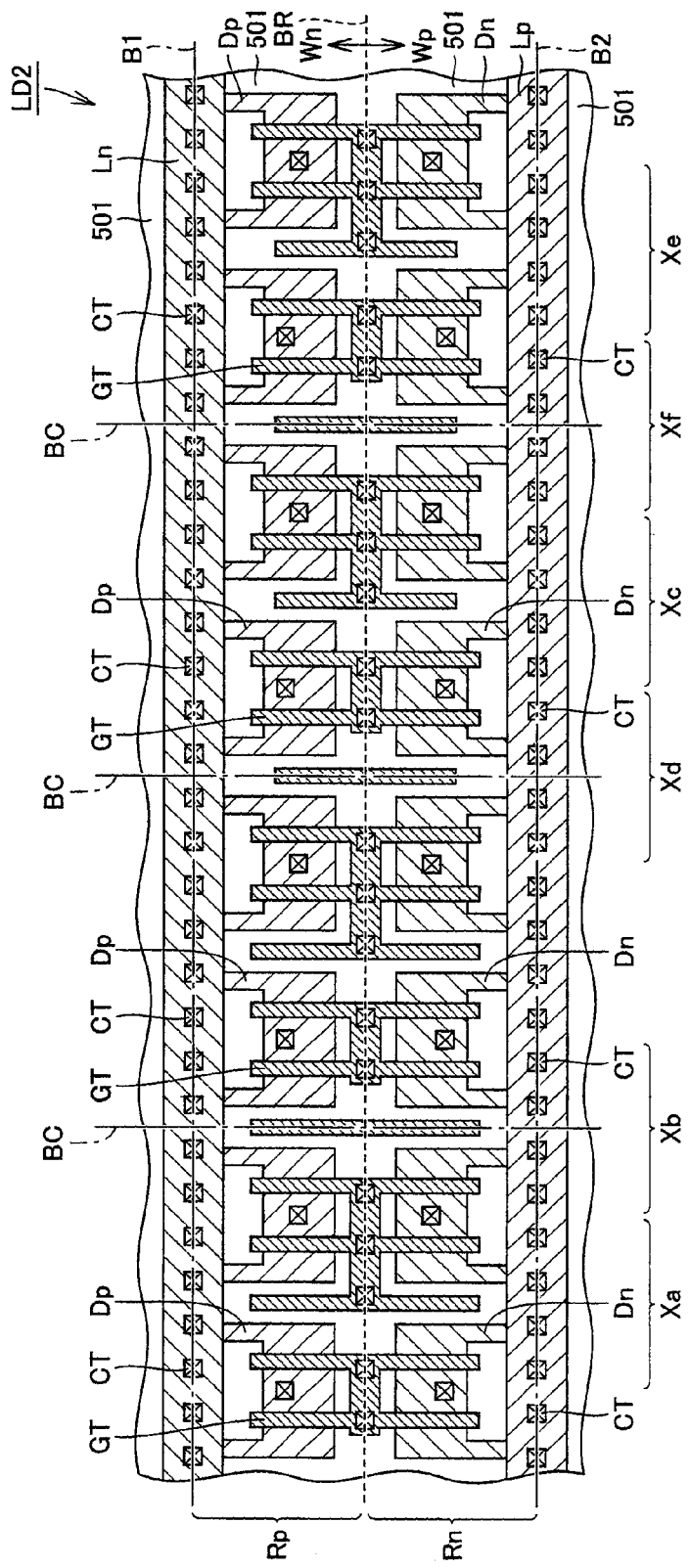
FIG. 31 is a partial plan view schematically showing an arrangement of a gate electrode and a diffusion layer of the semiconductor device in the fifth embodiment of the present invention.

With reference to FIGS. 30 and 31, the present embodiment provides a semiconductor device having gate electrode GT in a layer LD2 (FIG. 30). Layer LD2 has portions Xa-Xf each having gate electrode GT arranged therein, as will be described hereinafter more specifically in comparison with a comparative example.

Figure 32:
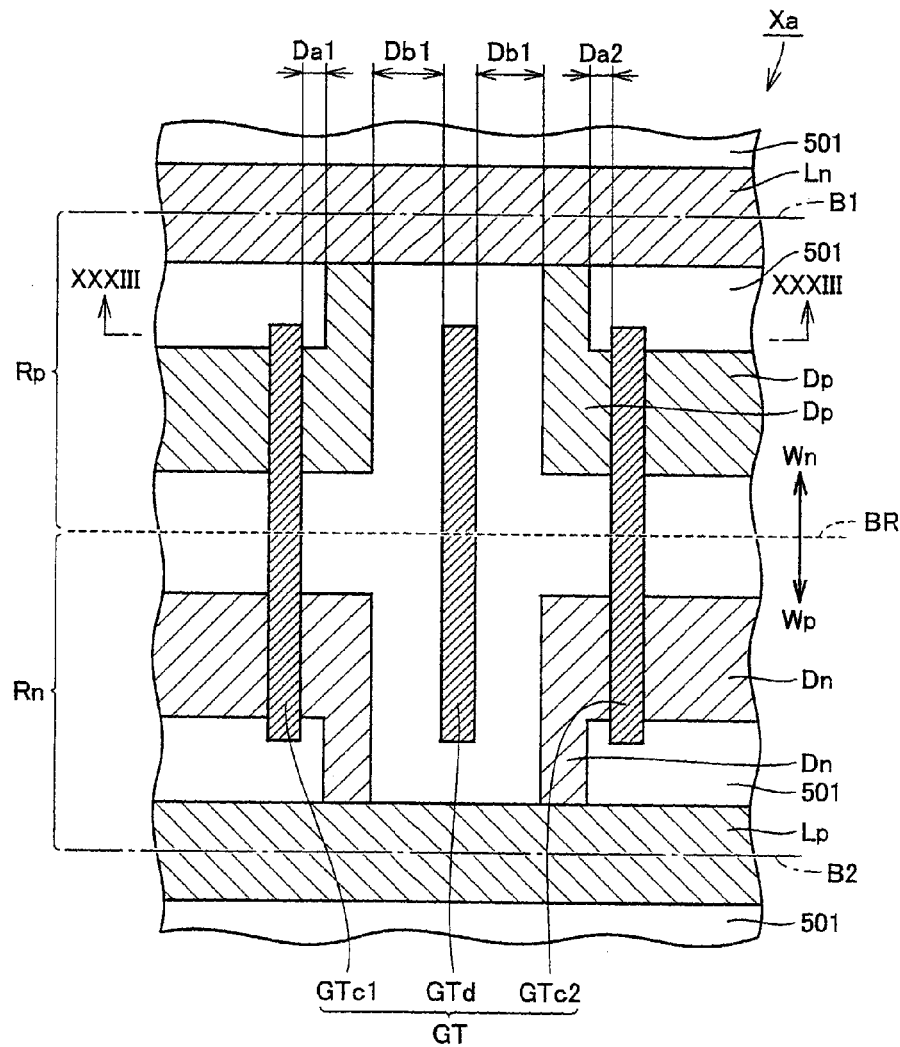
FIG. 32 illustrates how a gate wiring is arranged in a region Xa shown in FIG. 31.
Figure 33:
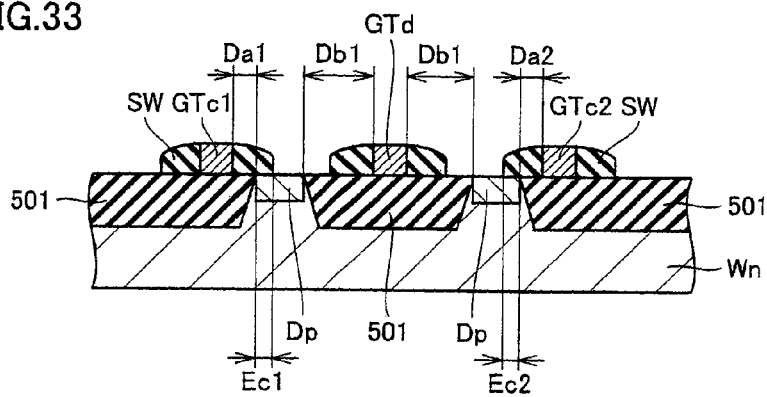
FIG. 33 is a schematic partial cross section taken along a line XXXIII-XXXIII of FIG. 32.

With reference to FIGS. 32 and 33, in portion Xa, gate electrode GT has a control electrode GTc (collectively referring to a control electrode GTc1 and a control electrode GTc2) and a dummy electrode GTd. Control electrode GTc and dummy electrode GTd are mutually adjacent in direction x (in FIG. 31-FIG. 33, a lateral direction). Furthermore, gate electrode GT each has a side surface provided with a sidewall SW formed of insulator.

P-type diffusion region Dp and n-type diffusion region Dn have portions, respectively, extending in direction y (in FIG. 32, a longitudinal direction) to be electrically connected to n-type conducting region Ln and p-type conducting region Lp, respectively. That is, the butting diffusion structure is provided.

In the butting diffusion structure, p-type diffusion region Dp and n-type diffusion region Dn are each separated from control electrode GTc1 in direction x by a distance Da1. Furthermore, p-type diffusion region Dp and n-type diffusion region Dn are each separated from control electrode GTc2 in direction x by a distance Da2. Furthermore, p-type diffusion region Dp and n-type diffusion region Dn are each separated from dummy electrode GTd in direction x by a distance Db1. Distance Db1 is larger than each of distances Da1 and Da2.

Figure 41:
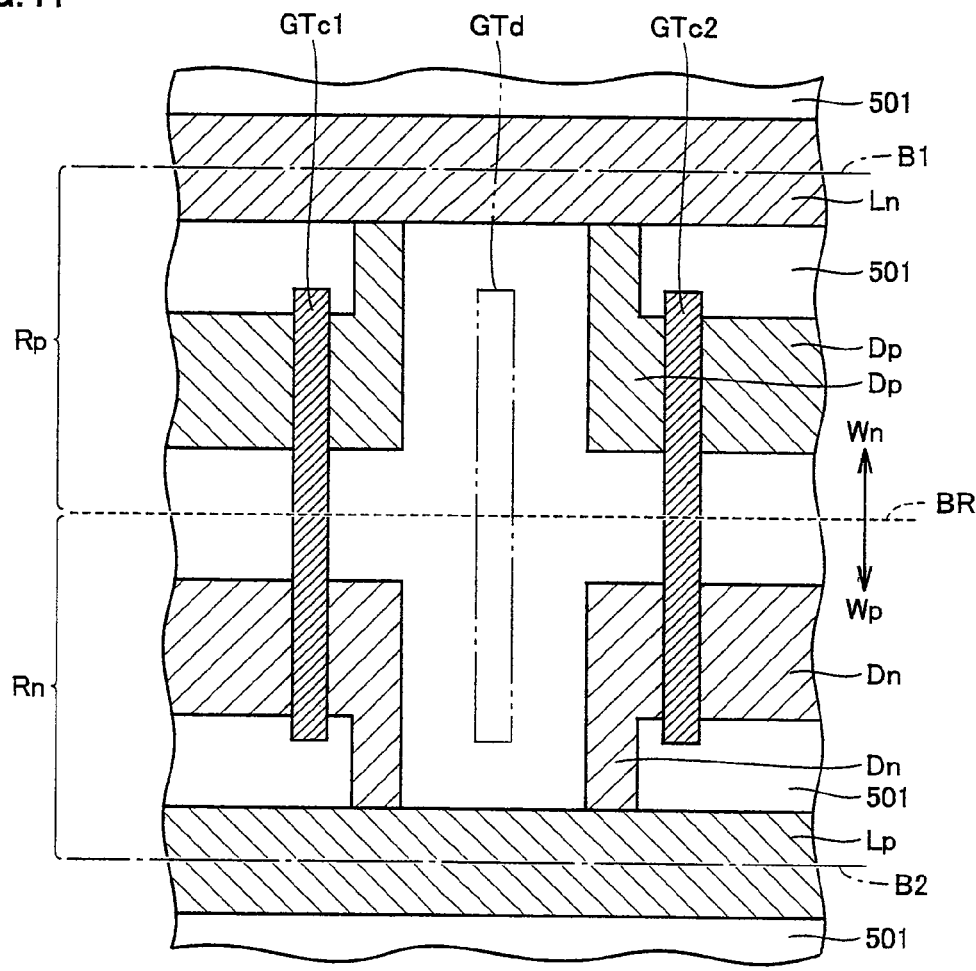
FIGS. 41 and 42 illustrate how a gate wiring is arranged in second and third comparative examples, respectively.

Mainly with reference to FIG. 41, one comparative example does not provide dummy electrode GTd, and accordingly, it is difficult to arrange a plurality of gate electrodes regularly with first pitch P1 (FIG. 18). Consequently, it is difficult to ensure resolution and stability in lithography.

In contrast, portion Xa (FIG. 32) has a configuration employing dummy electrode GTd to adjust a spacing between gate electrodes GTs. This can help to arrange a plurality of gate electrodes GTs with a uniform, first pitch P1. This allows a design with cells CLs highly integrated to also ensure resolution and stability in lithography.

Figure 42:
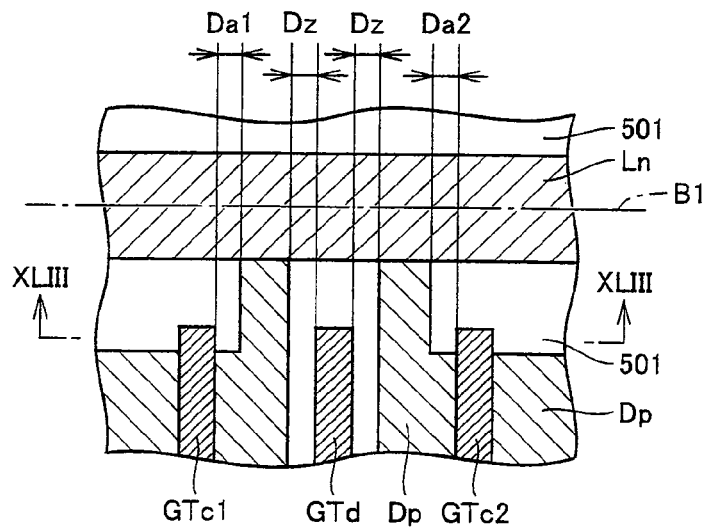
Figure 43:
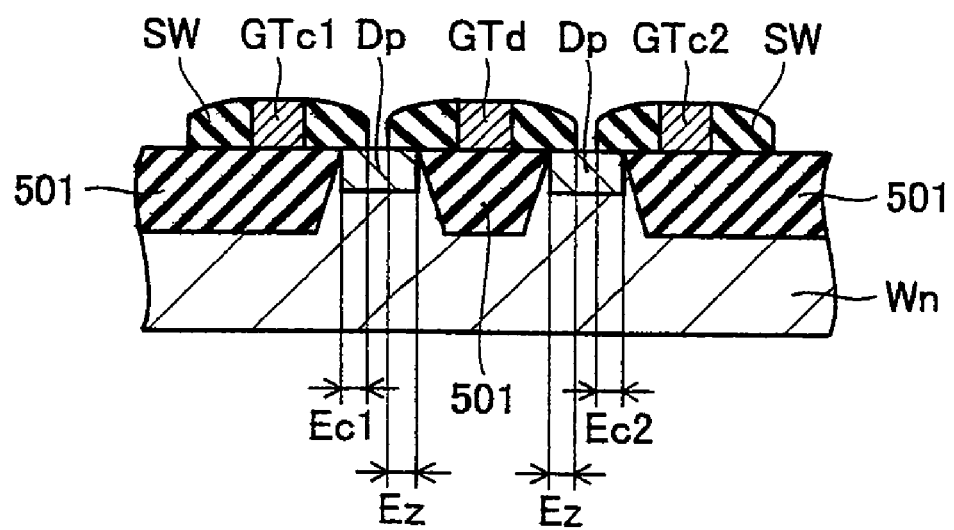
FIG. 43 is a schematic partial cross section taken along a line XLIII-XLIII of FIG. 42.

With reference to FIGS. 42 and 43, in another comparative example, sidewall SW for each of control electrodes GTc1 and GTc2 prevents injection of impurity, and the butting diffusion structure accordingly has p-type diffusion region Dp and n-type diffusion region Dn having a dimension in width (in FIG. 42 and FIG. 43, a lateral dimension) smaller by dimensions Ec1 and Ec2.

When p-type diffusion region Dp and n-type diffusion region Dn are not spaced from dummy electrode GTd by a distance Dz larger than each of distances Da1 and Da2, sidewall SW for dummy electrode GTd prevents injection of impurity, and the butting diffusion structure can have p-type diffusion region Dp and n-type diffusion region Dn having a dimension in width (in FIG. 42 and FIG. 43, a lateral dimension) smaller by a dimension Ez. This disadvantageously increases resistance in electrical connection made by the butting diffusion structure or prevents connection.

In contrast, portion Xa (FIG. 32) is configured to provide distance Db1 larger than distances Da1 and Da2 to reduce/prevent the dummy electrode GTd sidewall SW overlapping each of p-type diffusion region Dp and n-type diffusion region Dn, as seen in a plane. This can prevent dummy electrode GTd from having sidewall SW contributing to a butting diffusion structure with p-type diffusion region Dp and n-type diffusion region Dn having a dimension in width (in FIG. 32 and FIG. 33, a lateral dimension) reduced. A reliable butting diffusion structure can thus be ensured.

Figure 34:
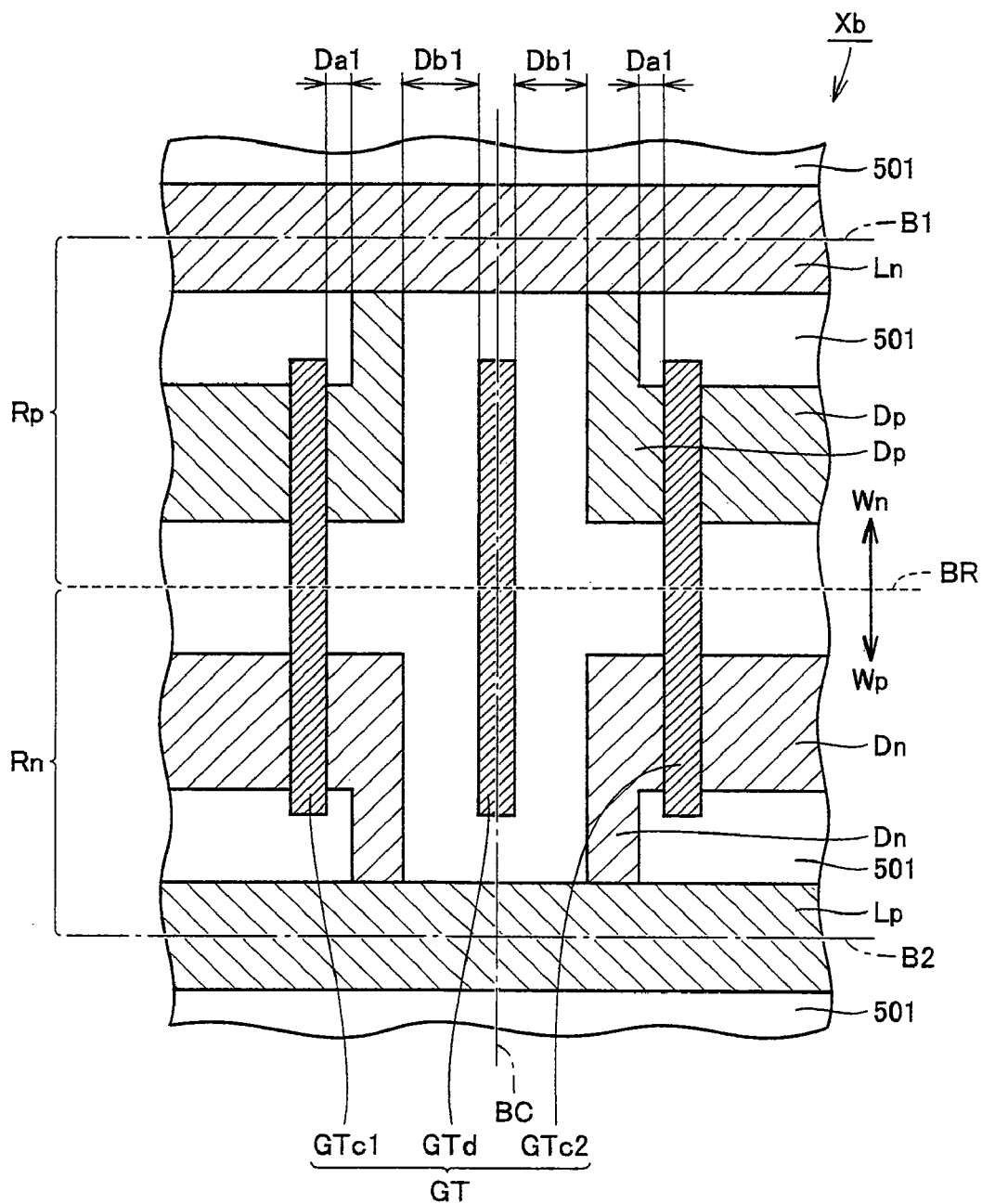
FIGS. 34 and 35 illustrate how a gate wiring is arranged in regions Xb and Xc, respectively, shown in FIG. 31.

With reference to FIG. 34, in portion Xb, dummy electrode GTd is arranged at cell boundary BC. In other words, dummy electrode GTd is arranged at a boundary between a pair of such ones of cells that are adjacent to each other in direction x. The remainder of portion Xb in configuration is similar to portion Xa described above.

Figure 35:
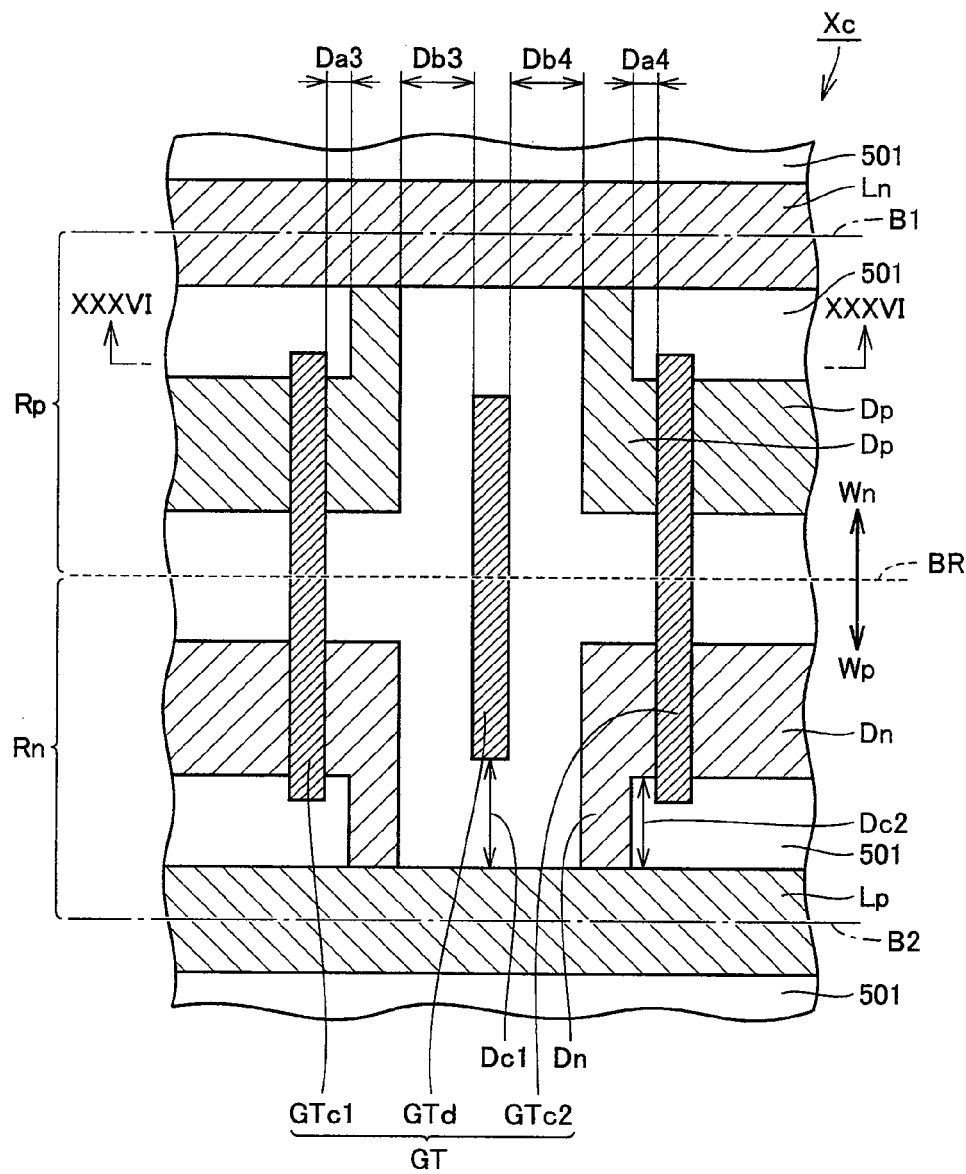
Figure 36:
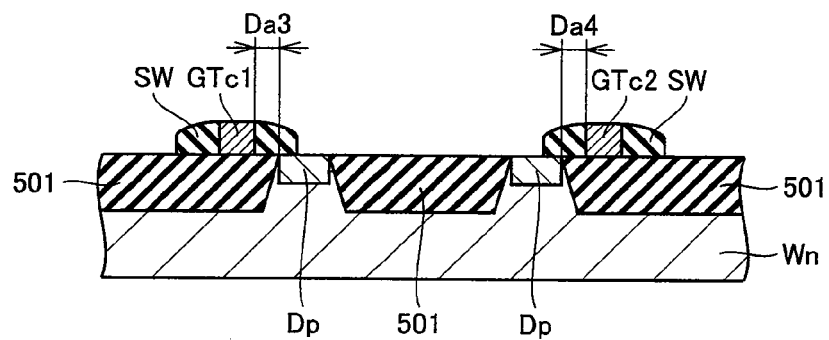
FIG. 36 is a schematic partial cross section taken along a line XXXVI-XXXVI of FIG. 35.

With reference to FIGS. 35 and 36, as seen in direction y (in FIG. 35, a longitudinal direction), n-type conducting region Ln and p-type conducting region Lp are each separated from dummy electrode GTd by a distance Dc1. Furthermore, a portion of n-type diffusion region Dn that extends in a direction traversing control electrode GTc (in FIG. 35, a lateral direction) is separated from p-type conducting region Lp by a distance Dc2. Furthermore, a portion of p-type diffusion region Dp that extends in a direction traversing control electrode GTc is separated from n-type conducting region Ln by distance Dc2.

Portion Xc (FIG. 35) is configured such that in a butting diffusion structure dummy electrode GTd does not have sidewall SW (FIG. 33) arranged as shown in FIG. 36, and can thus reduce/prevent the dummy electrode GTd sidewall SW overlapping each of p-type diffusion region Dp and n-type diffusion region Dn, as seen in a plane. This can prevent dummy electrode GTd from having sidewall SW contributing to a butting diffusion structure with p-type diffusion region Dp and n-type diffusion region Dn having a dimension in width (in FIG. 32 and FIG. 33, a lateral dimension) reduced. A reliable butting diffusion structure can thus be ensured.

Note that p-type diffusion region Dp and n-type diffusion region Dn are each separated from control electrode GTc1 in direction x by a distance Da3. Furthermore, p-type diffusion region Dp and n-type diffusion region Dn are each separated from control electrode GTc2 in direction x by a distance Da4. Furthermore in direction x at one side (in FIG. 35 and FIG. 36, a left-hand side) p-type diffusion region Dp and n-type diffusion region Dn are each separated from dummy electrode GTd in direction x by a distance Db3. Furthermore in direction x at the other side (in FIG. 35 and FIG. 36, a right-hand side) p-type diffusion region Dp and n-type diffusion region Dn are each separated from dummy electrode GTd in direction x by a distance Db4. Distances Da3, Da4, Db3 and Db4 have any relationship in magnitude therebetween.

Figure 37:
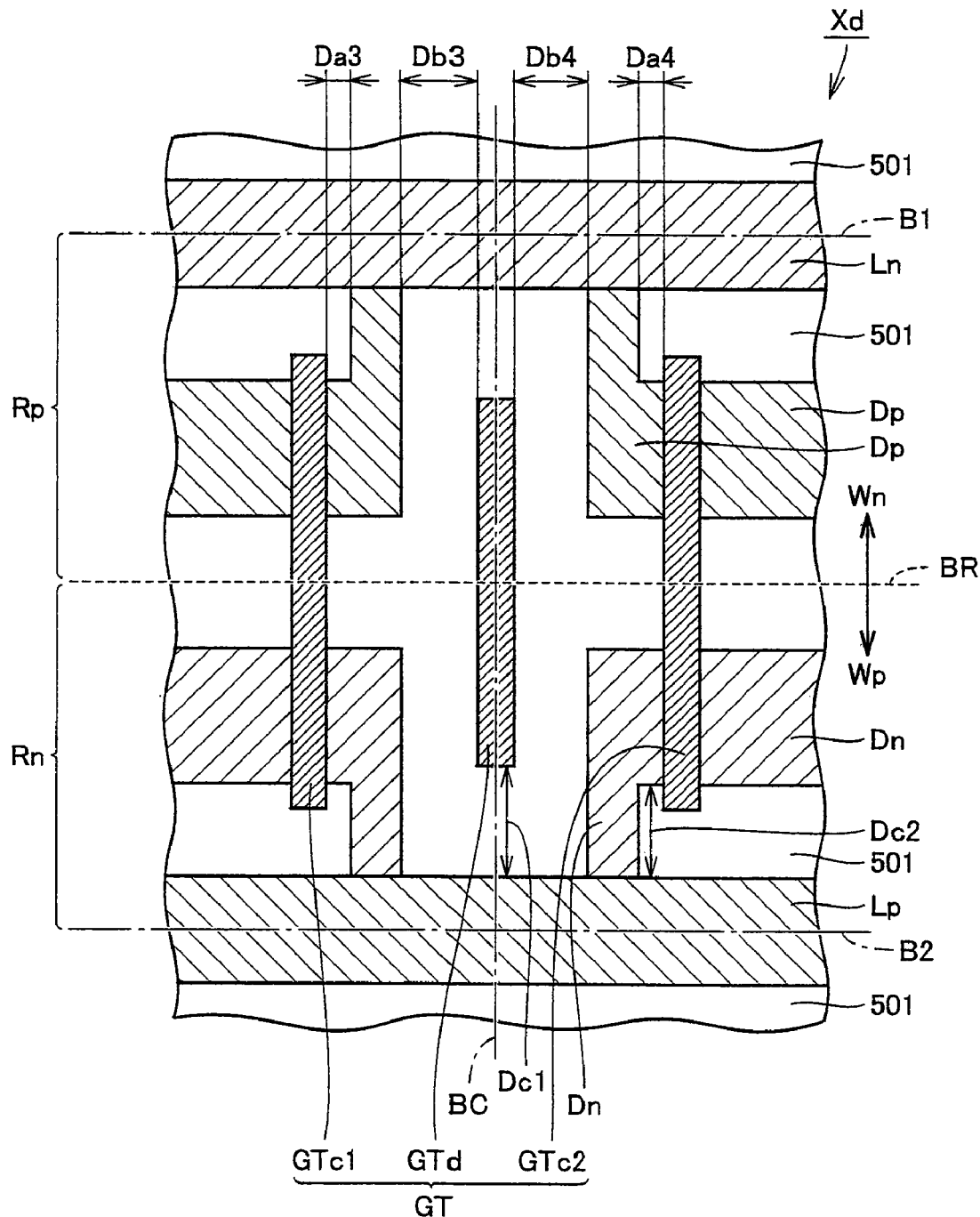
FIGS. 37 and 38 illustrate how a gate wiring is arranged in regions Xd and Xe, respectively, shown in FIG. 31.

With reference to FIG. 37, in portion Xd, dummy electrode GTd is arranged at cell boundary BC. In other words, dummy electrode GTd is arranged at a boundary between a pair of such ones of cells that are adjacent to each other in direction x. The remainder of portion Xd in configuration is similar to portion Xc described above.

Figure 38:
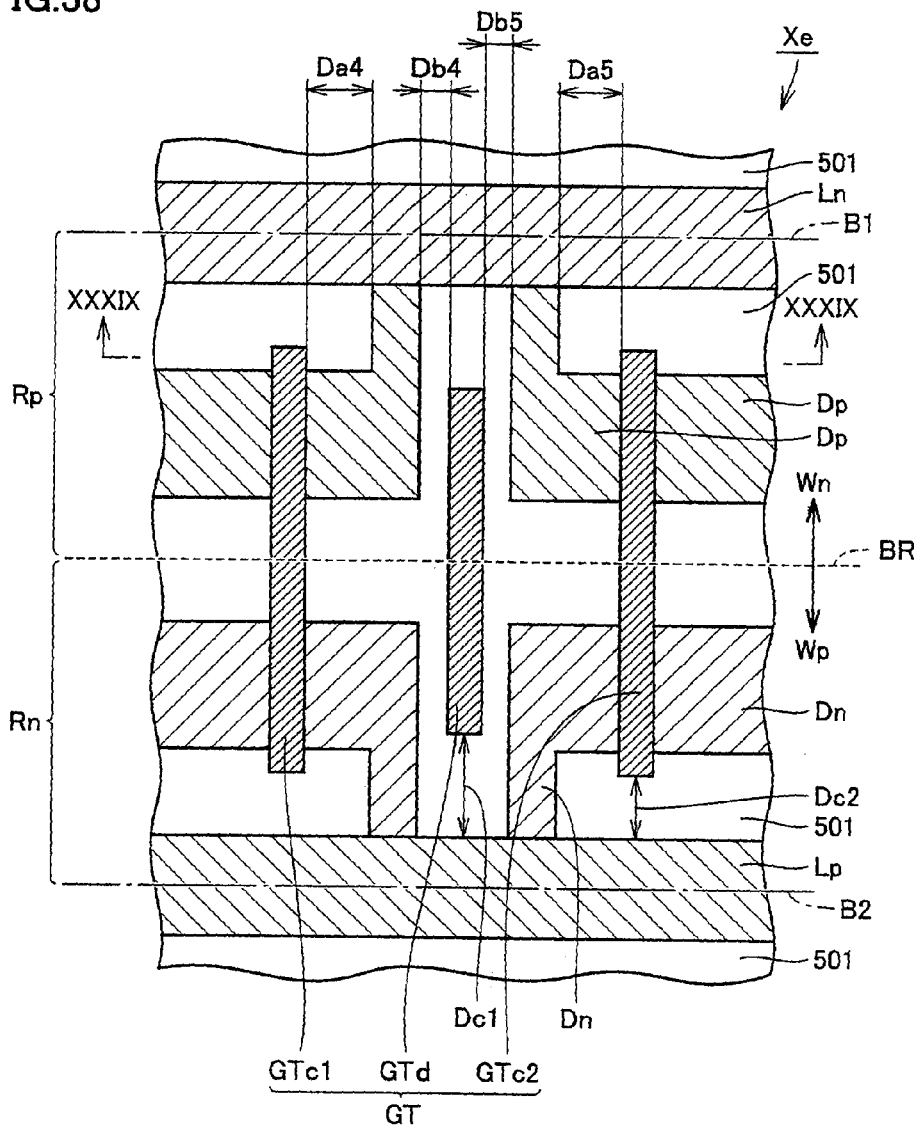
Figure 39:
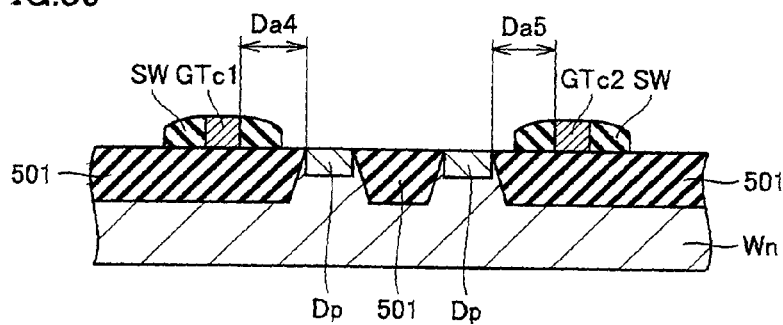
FIG. 39 is a schematic partial cross section taken along a line XXXIX-XXXIX of FIG. 38.

With reference to FIGS. 38 and 39, the butting diffusion structure at portion Xe has p-type diffusion region Dp and n-type diffusion region Dn, each separated from control electrode GTc1 and control electrode GTc2 in direction x by a distance Da4 and a distance Da5, respectively. Furthermore in direction x at one side (in FIG. 38 and FIG. 39, a left hand side) p-type diffusion region Dp and n-type diffusion region Dn are each separated from dummy electrode GTd in direction x by a distance Db4. Furthermore in direction x at the other side (in FIG. 38 and FIG. 39, a right hand side) p-type diffusion region Dp and n-type diffusion region Dn are each separated from dummy electrode GTd in direction x by a distance Db5. Distances Da4 and Da5 are larger than distances Db4 and Db5, respectively.

Portion Xe (FIG. 38) is configured with distance Da4 larger than distance Db4. If a microfabrication process has an overlay error resulting in control electrode GTc1 displaced toward the butting diffusion structure (in FIG. 38 and FIG. 39, rightward), control electrode GTc1 can be prevented from having sidewall SW overlapping each of p-type diffusion region Dp and n-type diffusion region Dn, as seen in a plane. This can prevent control electrode GTc1 from having sidewall SW contributing to a butting diffusion structure with p-type diffusion region Dp and n-type diffusion region Dn having a dimension in width (in FIG. 38 and FIG. 39, a lateral dimension) reduced. A reliable butting diffusion structure can thus be ensured.

Furthermore, distance Da5 is larger than distance Db5. If a microfabrication process has an overlay error resulting in control electrode GTc2 displaced toward the butting diffusion structure (in FIG. 38 and FIG. 39, leftward), control electrode GTc2 can be prevented from having sidewall SW overlapping each of p-type diffusion region Dp and n-type diffusion region Dn, as seen in a plane. This can prevent control electrode GTc2 from having sidewall SW contributing to a butting diffusion structure with p-type diffusion region Dp and n-type diffusion region Dn having a dimension in width (in FIG. 38 and FIG. 39, a lateral dimension) reduced. A reliable butting diffusion structure can thus be ensured.

Figure 40:
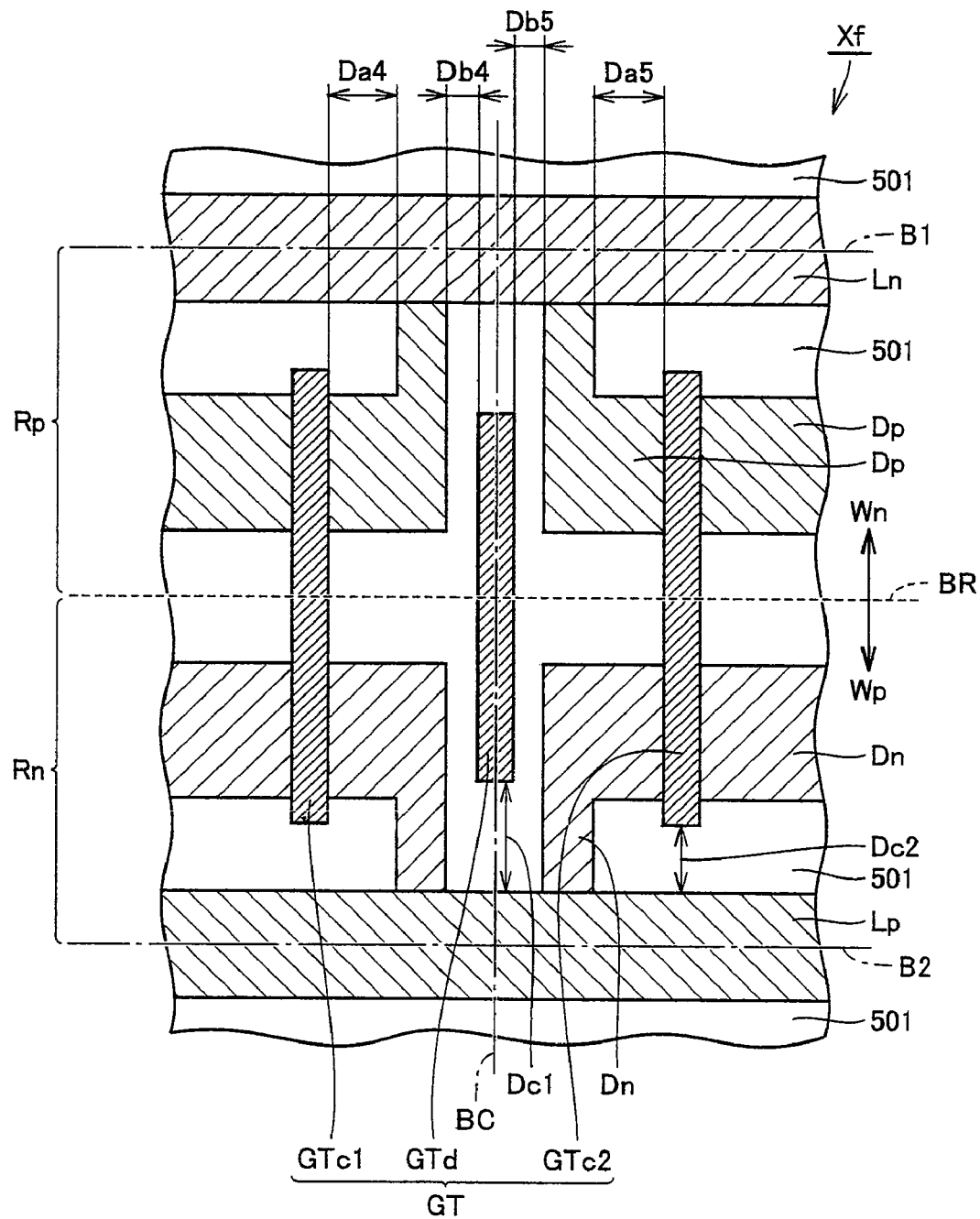
FIG. 40 illustrates how a gate wiring is arranged in a region Xf shown in FIG. 31.

With reference to FIG. 40, in portion Xf, dummy electrode GTd is arranged at cell boundary BC. In other words, dummy electrode GTd is arranged at a boundary between a pair of such ones of cells that are adjacent to each other in direction x. The remainder of portion Xe in configuration is similar to portion Xc described above.

The remainder of the present embodiment in configuration is similar to the fourth embodiment described above. Accordingly, identical or corresponding components are identically denoted and will not be described repeatedly.

Sixth Embodiment

Figure 44:
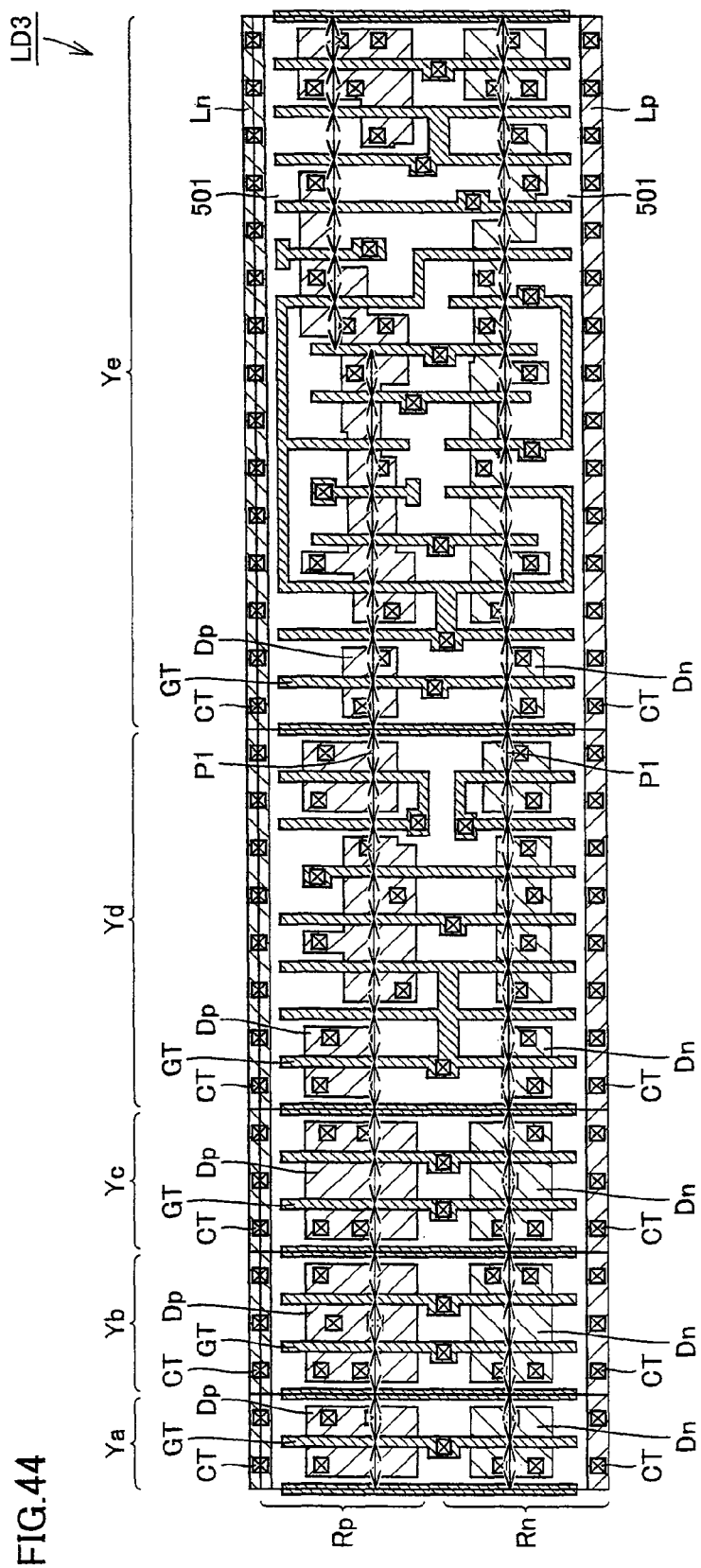
FIG. 44 is a plan view schematically showing an arrangement of a gate electrode and a diffusion layer of a semiconductor device in a sixth embodiment of the present invention.
Figure 45:
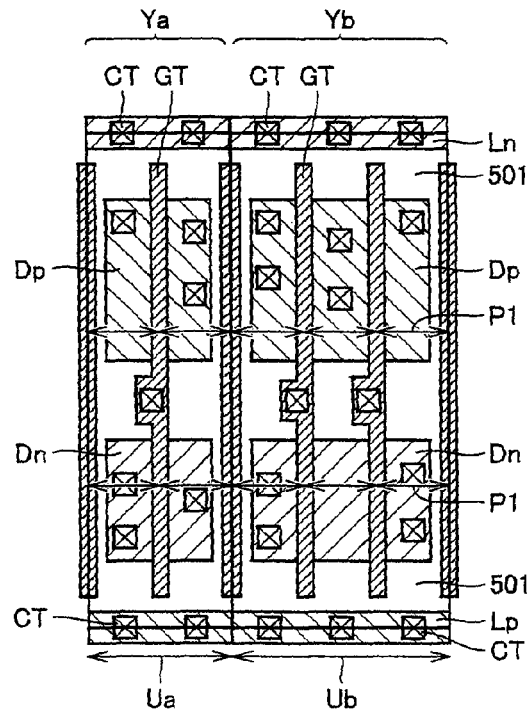
FIG. 45 is a view for illustrating a unit width of a cell in a portion of FIG. 44.

With reference to FIGS. 44 and 45, the present embodiment provides a semiconductor device having gate electrode GT in a layer LD3. Layer LD3 has portions corresponding to cells Ya-Ye. Cells Ya-Ye define the portions of the semiconductor device functioning as an inverter, an NAND, an NOR, a tristate buffer, and a flip flop, respectively. Cells Ya-Ye each have a width of an integral multiple of first pitch P1 in a first direction (in FIG. 44 and FIG. 45, a lateral direction). For example, cells Ya and Yb have widths Ua and Ub of twice and thrice, respectively, of first pitch P1.

The remainder of the present embodiment in configuration is similar to the fourth embodiment described above. Accordingly, identical or corresponding components are identically denoted and will not be described repeatedly.

Figure 46:
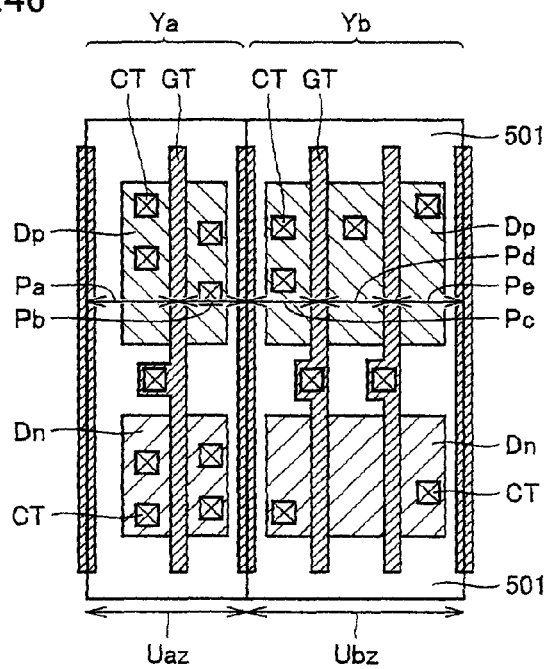
FIG. 46 is a view for illustrating a unit width of a cell in a fourth comparative example.

With reference to FIG. 46, in a comparative example, a plurality of gate electrodes GTs are spaced by dimensions Pa-Pe including mutually unequal dimensions. Cells Ya and Yb have widths Uaz and Ubz, respectively, neither of which has a width of an integral multiple of first pitch P1. In this example, gate electrode GT is not arranged regularly, and if cells are highly integrated, it is difficult to ensure resolution and stability in lithography.

The present embodiment can provide a semiconductor device having at least one of an inverter, an NAND, an NOR, a tristate buffer, and a flip flop, that can achieve an effect similar to that of the fourth embodiment.

Seventh Embodiment

Figure 47:
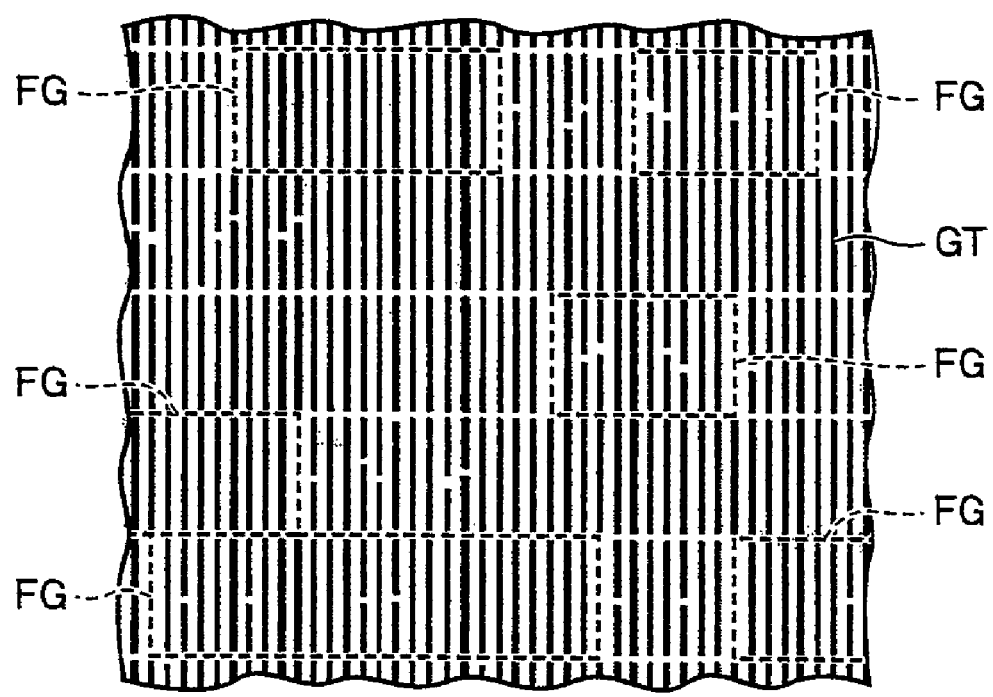
FIG. 47 is a partial plan view schematically showing how a gate electrode is arranged in a semiconductor device in a seventh embodiment of the present invention.
Figure 48:
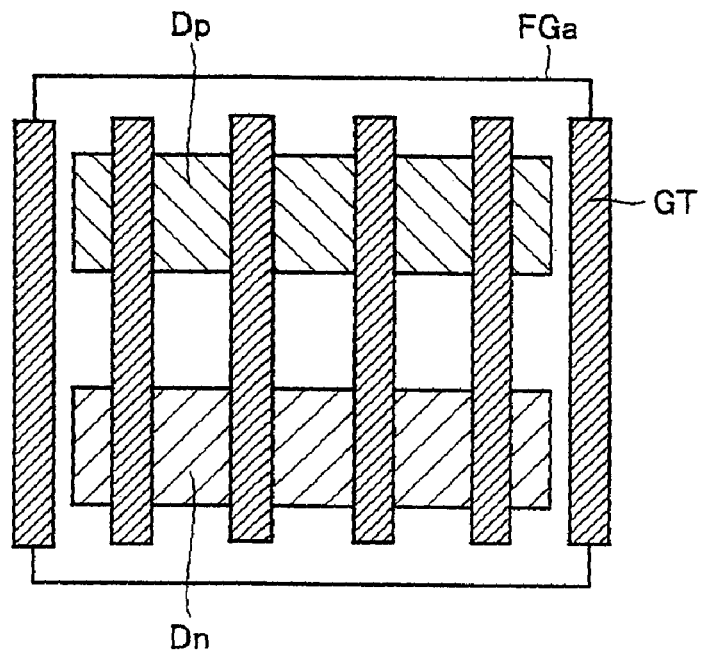
FIG. 48 is a plan view schematically showing an arrangement of a gate electrode and a diffusion layer in a first example of a cell of the semiconductor device in the seventh embodiment of the present invention.
Figure 49:
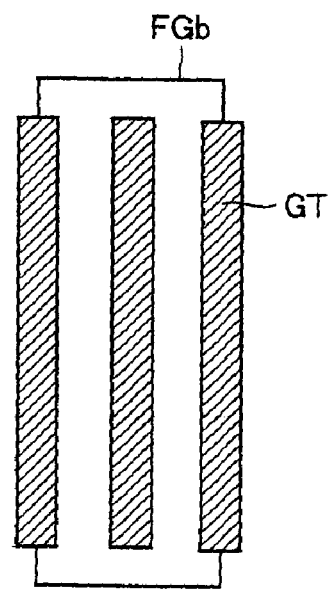
FIG. 49 is a plan view schematically showing an arrangement of a gate electrode in a second example of a cell of the semiconductor device in the seventh embodiment of the present invention.

With reference to FIGS. 47-49, the present embodiment provides a semiconductor device having a cell used as a logic circuit and a dummy cell (or filler cell) FG that is not used as a logic circuit. The cell used as the logic circuit and dummy cell FG that is not used as the logic circuit each have gate electrode GT arranged in a first direction (in FIG. 47-FIG. 49, a lateral direction) with a first pitch.

Dummy cell FG in a first example, or a dummy cell FGa (FIG. 48), has p-type diffusion region Dp and n-type diffusion region Dn. Dummy cell FG in a second example, or a dummy cell FGb (FIG. 49), does not have a diffusion region.

The remainder of the present embodiment in configuration is similar to the fourth embodiment described above. Accordingly, identical or corresponding components are identically denoted and will not be described repeatedly.

Figure 50:
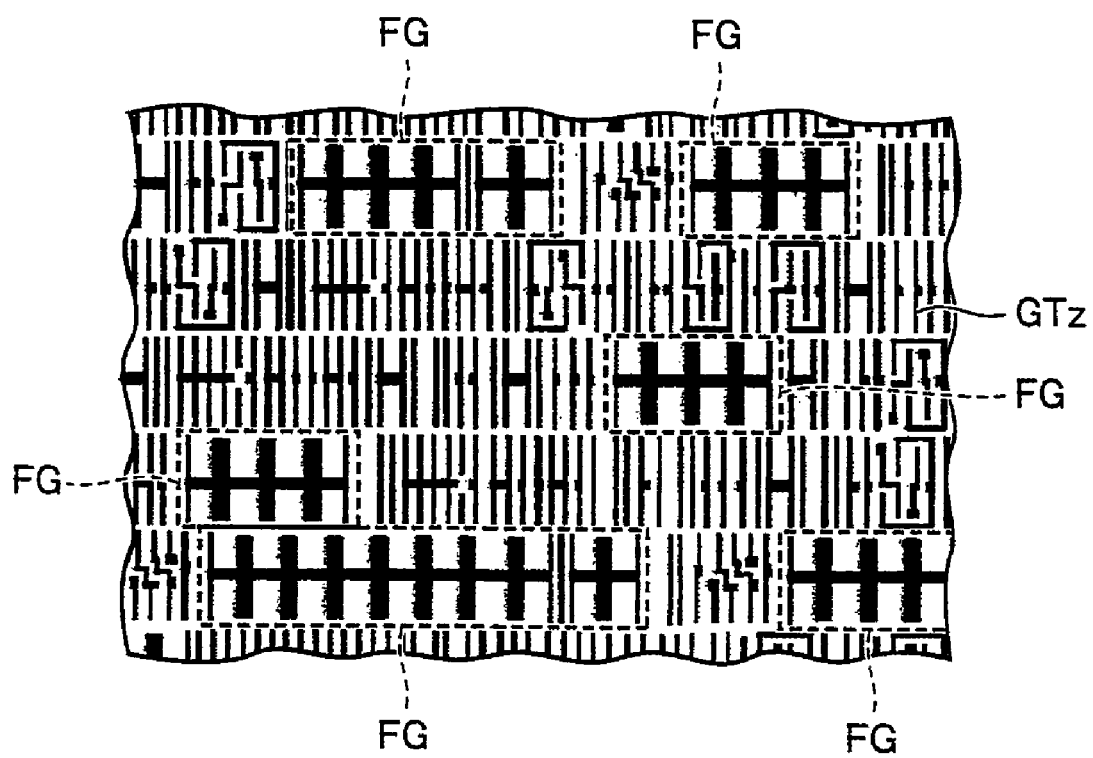
FIG. 50 is a partial plan view showing an arrangement of a gate electrode of a semiconductor device in a fifth comparative example.

With reference to FIG. 50, a comparative example provides a semiconductor device that does not have gate electrode GTz arranged with the first pitch, and if cells are highly integrated, it is difficult to ensure resolution and stability in lithography.

The present embodiment can achieve an effect similar to that of the fourth embodiment in the entirety of a chip of a semiconductor device.

Eighth Embodiment

Figure 51:
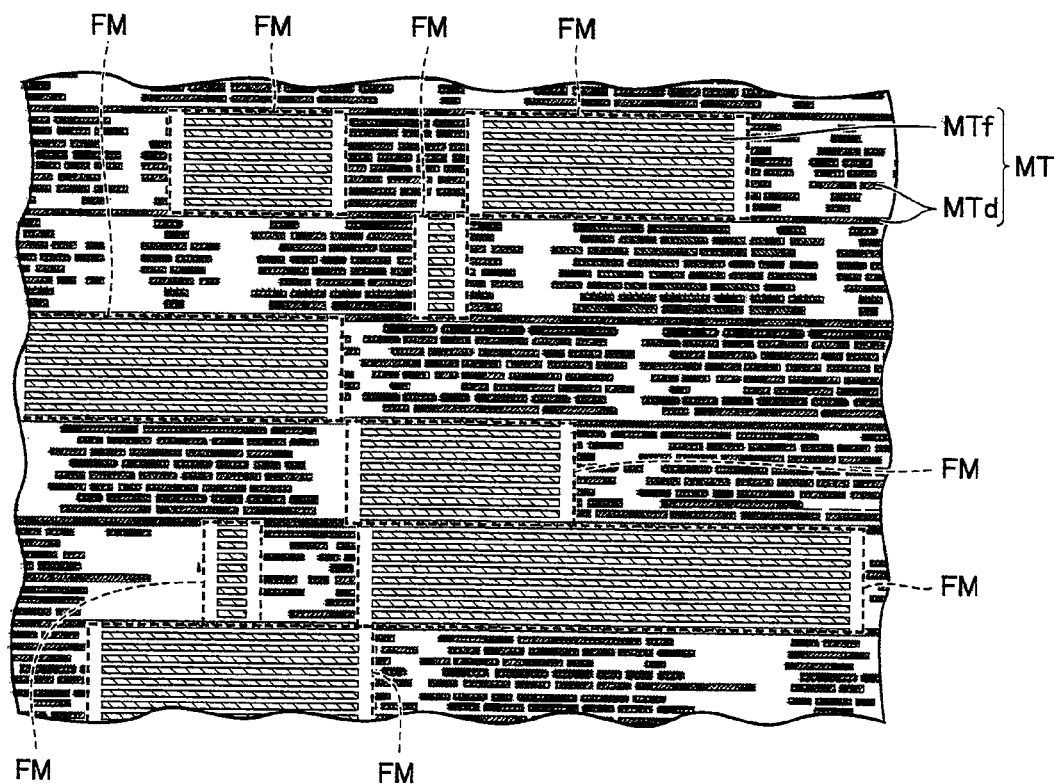
FIG. 51 is a partial plan view schematically showing an arrangement of a wiring of a semiconductor device in an eighth embodiment of the present invention.
Figure 52:
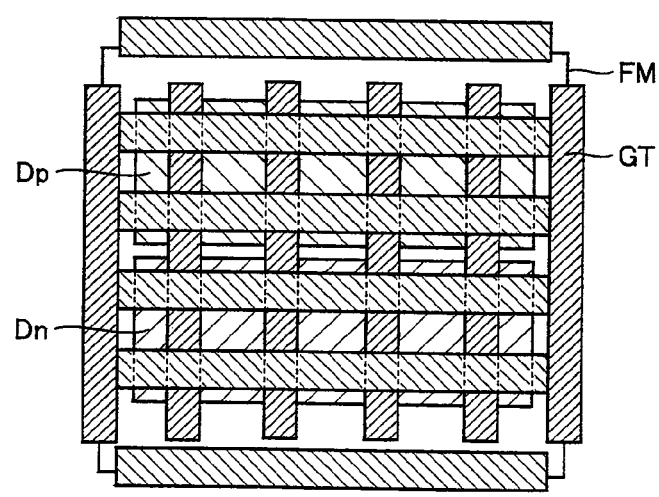
FIG. 52 is a plan view schematically showing an arrangement of a diffusion layer, a gate electrode and a wiring in a dummy cell of the semiconductor device in the eighth embodiment of the present invention.

With reference to FIGS. 51 and 52, the present embodiment provides a semiconductor device having a cell used as a logic circuit and a dummy cell (or filler cell) FM that is not used as a logic circuit. The cell used as the logic circuit and dummy cell FM that is not used as the logic circuit have as a metal wiring MT a metal wiring MTd and a metal wiring MTf, respectively. Metal wiring MT extends in a first direction (in FIG. 51, a lateral direction) and is also arranged in a second direction (in FIG. 51, a longitudinal direction) with a second pitch. Metal wiring MTf thus each extends in the first direction (in FIG. 51, the lateral direction) and is also arranged in dummy cell FM in the second direction with the second pitch.

The remainder of the present embodiment in configuration is similar to the fourth embodiment described above. Accordingly, identical or corresponding components are identically denoted and will not be described repeatedly.

Figure 53:
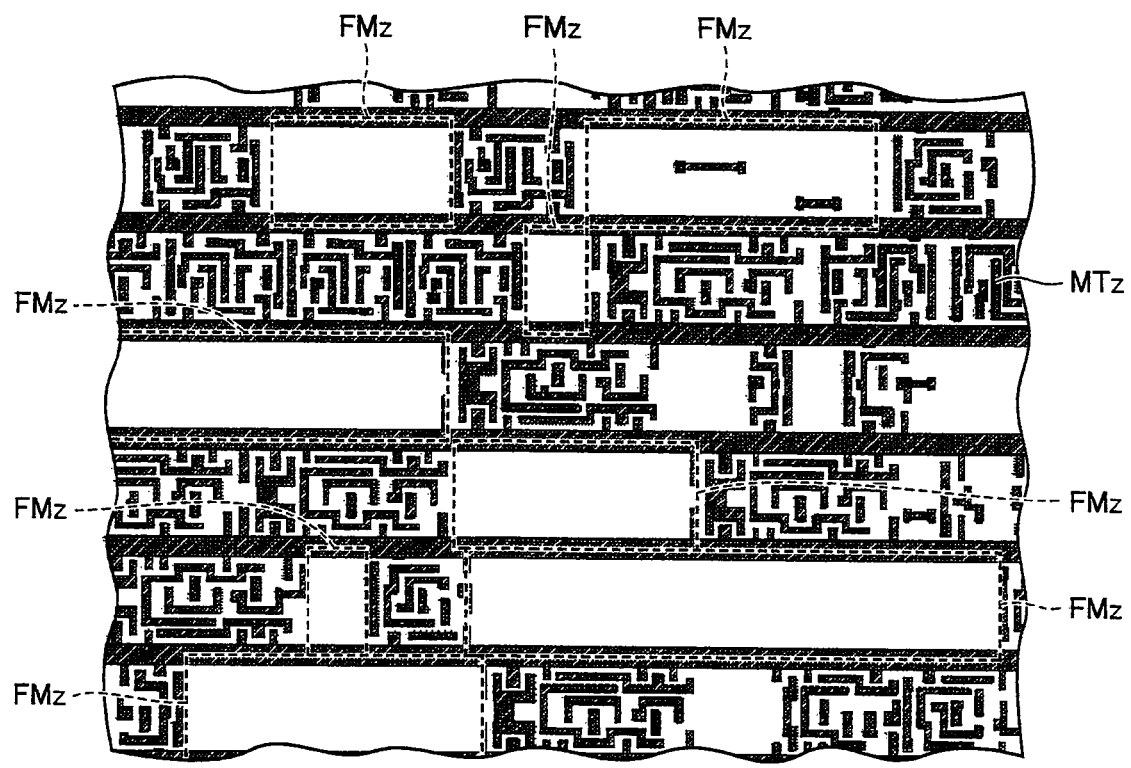
FIG. 53 is a partial plan view showing an arrangement of a wiring of a semiconductor device in a sixth comparative example.

Mainly with reference to FIG. 53, a comparative example provides a semiconductor device having a metal wiring MTz, which is not arranged in a dummy cell FMz with a single pitch as shown for metal wiring MTf (FIG. 51), and if cells are highly integrated, it is difficult to ensure resolution and stability in lithography.

The present embodiment can further ensure resolution and stability in lithography for a metal wiring layer of a semiconductor device.

Ninth Embodiment

Figure 54:
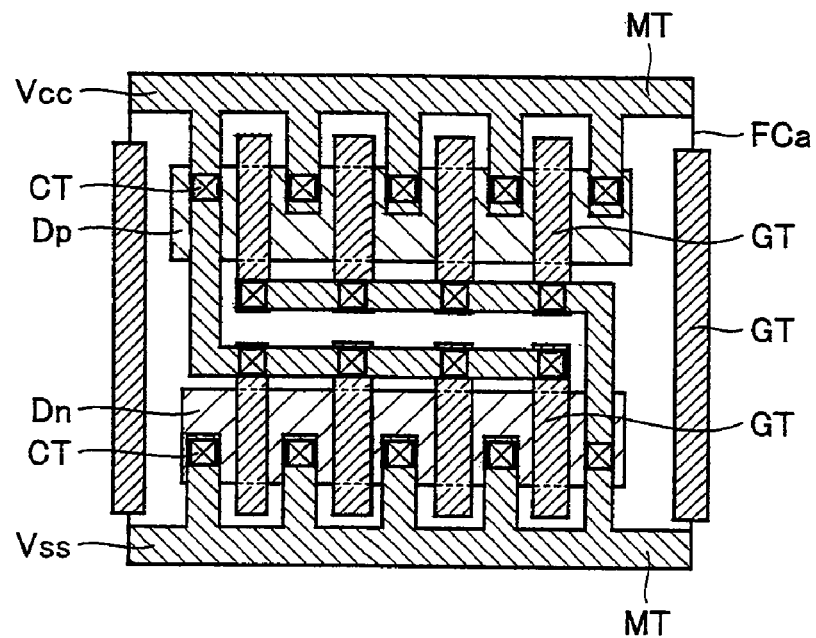
FIGS. 54 and 55 are plan views schematically showing how a diffusion layer, a gate electrode and a wiring are arranged in a capacitance cell of a semiconductor device in a ninth embodiment of the present invention and an exemplary variation thereof, respectively.

With reference to FIG. 54, the present embodiment provides a semiconductor device having a capacitance cell FCa. Capacitance cell FCa defines in the semiconductor device a portion that functions as a decoupling capacitor arranged between power supply potential Vcc and ground potential Vss. Gate electrode GT faces p-type diffusion region Dp and n-type diffusion region Dn to form capacitance. In other words, gate electrode GT forms a portion of an electrode of the decoupling capacitor.

Figure 55:
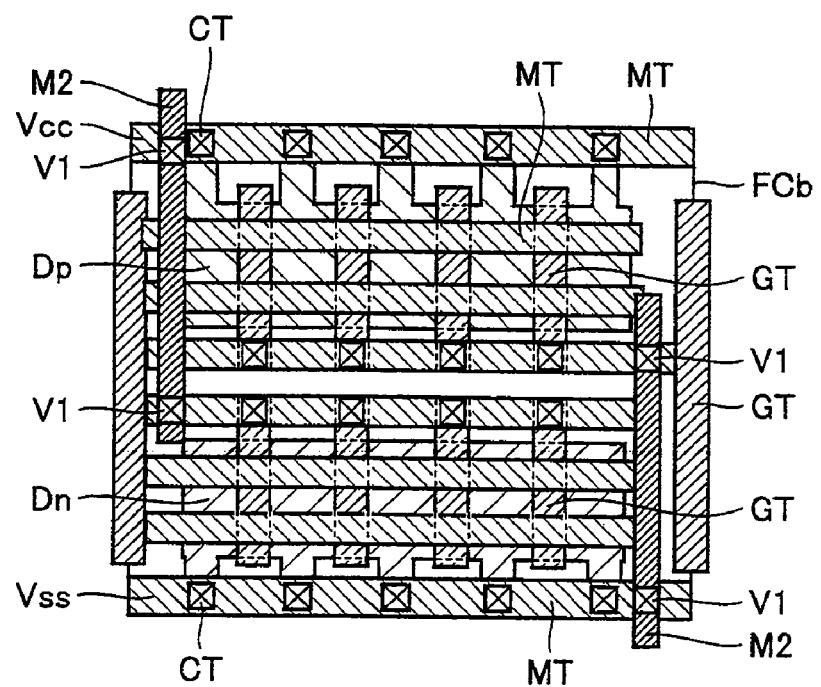

With reference to FIG. 55, the present embodiment in an exemplary variation provides a semiconductor device having a capacitance cell FCb. In capacitance cell FCb metal wiring MT extends in a first direction (in FIG. 55, a lateral direction) and in capacitance cell FCb it is arranged in a second direction (in FIG. 55, a longitudinal direction) with a second pitch. Furthermore, metal wiring M2 is connected via via V1 to metal wiring MT.

The remainder of the present embodiment in configuration is similar to the fourth embodiment described above. Accordingly, identical or corresponding components are identically denoted and will not be described repeatedly.

Figure 56:
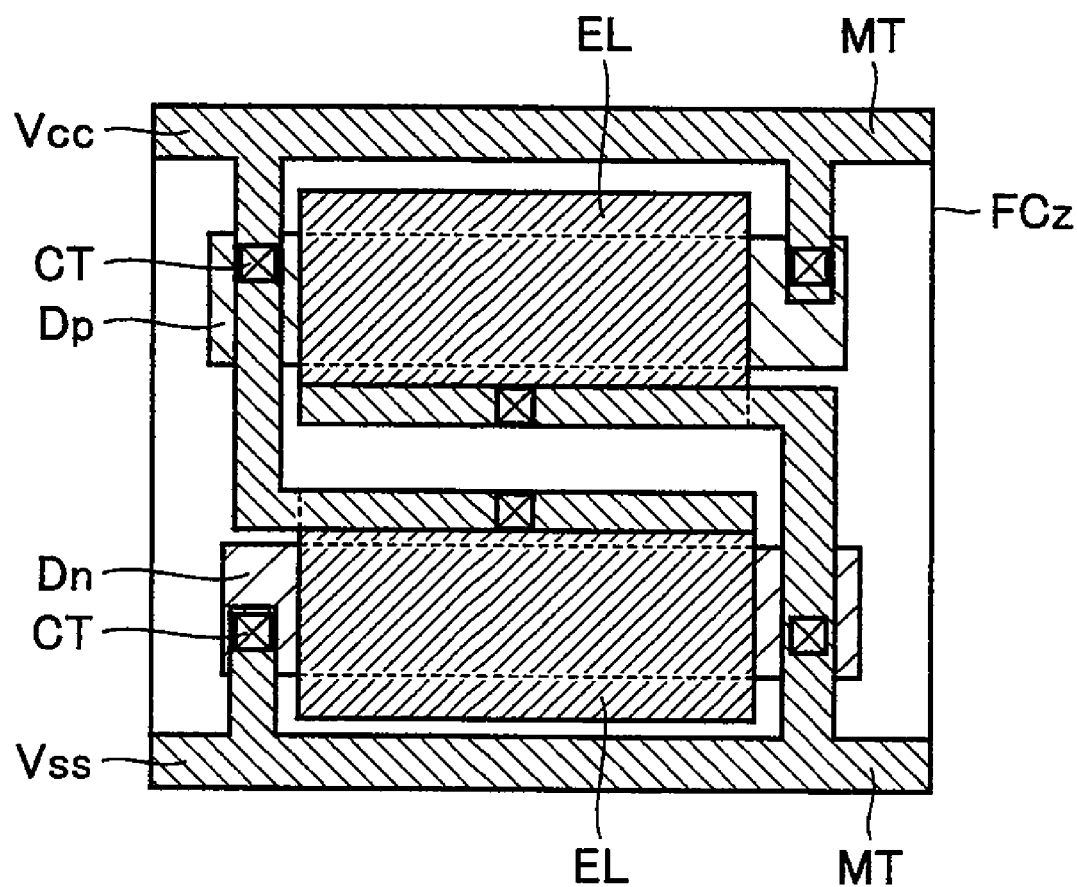
FIG. 56 is a plan view showing how a diffusion layer, a gate electrode and a wiring are arranged in a capacitance cell of a semiconductor device in a seventh comparative example.

Mainly with reference to FIG. 56, a comparative example provides a capacitance cell FCz having an electrode EL, which is not arranged with a single pitch as shown for gate electrode GT (FIG. 54), and if cells are highly integrated, it is difficult to ensure resolution and stability in lithography. Furthermore, electrode EL is not arranged with a single pitch as shown for metal wiring MT (FIG. 55), and if cells are highly integrated, it is difficult to ensure resolution and stability in lithography.

The present embodiment can further ensure resolution and stability in lithography of gate electrode GT in capacitance cell FCa. Furthermore, the present embodiment in the exemplary variation can further ensure resolution and stability in lithography of metal wiring MT in capacitance cell FCb.

It should be understood that the embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

What is claimed is:

1. A semiconductor device having a plurality of standard cells arranged in a first direction and each having first and second peripheral edges extending in said first direction and opposite to each other, the semiconductor device comprising:
a semiconductor substrate having a pMIS region and an nMIS region, said pMIS region being formed between said first peripheral edge and a boundary extending in said first direction through each of said plurality of standard cells and serving as a boundary between an n-type well and a p-type well, said nMIS region being formed between said second peripheral edge and said boundary;
a first layer provided on said semiconductor substrate and having a plurality of gate wirings extending in a second direction orthogonal to said first direction; and
a second layer provided on said first layer, said second layer including:
a first power supply wiring extending along said first peripheral edge and electrically connected to said pMIS region;
a second power supply wiring extending along said second peripheral edge and electrically connected to said nMIS region;
a plurality of pMIS wirings arranged on a plurality of first virtual lines, respectively, extending between said first and second power supply wirings on said pMIS region in said first direction and arranged with a single pitch in said second direction; and
a plurality of nMIS wirings arranged on a plurality of second virtual lines, respectively, extending between said first and second power supply wirings on said nMIS region in said first direction and arranged with said single pitch in said second direction, a first virtual line of said plurality of first virtual lines that is the closest to said boundary and a second virtual line of said plurality of second virtual lines that is the closest to said boundary having therebetween a spacing larger than said single pitch.

2. The semiconductor device according to claim 1, further comprising a third layer provided on said second layer and including a plurality of wirings extending in said second direction.

3. The semiconductor device according to claim 1, wherein at least one of said first and second power supply wirings has a width larger than a width of each of said plurality of pMIS wirings and said plurality of nMIS wirings.

4. The semiconductor device according to claim 1, wherein said plurality of gate wirings are spaced equally in said first direction.

5. The semiconductor device according to claim 1, wherein said plurality of pMIS wirings and said plurality of nMIS wirings have been subjected to optical proximity correction.

6. A semiconductor device having a plurality of standard cells arranged in a first direction and each having first and second peripheral edges extending in said first direction and opposite to each other, the semiconductor device comprising:
a semiconductor substrate having a pMIS region and an nMIS region, said pMIS region being formed between said first peripheral edge and a boundary extending in said first direction through each of said plurality of standard cells and serving as a boundary between an n-type well and a p-type well, said nMIS region being formed between said second peripheral edge and said boundary;
a first layer provided on said semiconductor substrate and having a plurality of gate wirings extending in a second direction orthogonal to said first direction; and
a second layer provided on said first layer, said second layer including:
a first power supply wiring extending along said first peripheral edge and electrically connected to said pMIS region;
a second power supply wiring extending along said second peripheral edge and electrically connected to said nMIS region;
a plurality of pMIS wirings arranged on a plurality of first virtual lines, respectively, extending between said first and second power supply wirings on said pMIS region in said first direction and arranged with a single pitch in said second direction; and
a plurality of nMIS wirings arranged on a plurality of second virtual lines, respectively, extending between said first and second power supply wirings on said nMIS region in said first direction and arranged with said single pitch in said second direction, wherein
a spacing between a first virtual line of said plurality of first virtual lines that is the closest to said first peripheral edge and said first peripheral edge, and a spacing between a second virtual line of said plurality of second virtual lines that is the closest to said second peripheral edge and said second peripheral edge are each larger than said single pitch.

7. The semiconductor device according to claim 6, further comprising a third layer provided on said second layer and including a plurality of wirings extending in said second direction.

8. The semiconductor device according to claim 6, wherein at least one of said first and second power supply wirings has a width larger than a width of each of said plurality of pMIS wirings and said plurality of nMIS wirings.

9. The semiconductor device according to claim 6, wherein said plurality of gate wirings are spaced equally in said first direction.

10. The semiconductor device according to claim 6, wherein said plurality of pMIS wirings and said plurality of nMIS wirings have been subjected to optical proximity correction.

* * * * *